(12) United States Patent
Yamazaki et al.

(10) Patent No.: US 8,334,537 B2
(45) Date of Patent: *Dec. 18, 2012

(54) LIGHT-EMITTING DEVICE

(75) Inventors: Shunpei Yamazaki, Setagaya (JP); Yukie Suzuki, Atsugi (JP); Hideaki Kuwabara, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 543 days.

This patent is subject to a terminal disclaimer.

(21) Appl. No.: 12/213,726

(22) Filed: Jun. 24, 2008

(65) Prior Publication Data

US 2009/0008645 A1    Jan. 8, 2009

(30) Foreign Application Priority Data

Jul. 6, 2007   (JP) .................................. 2007-179091

(51) Int. Cl.
*H01L 29/04* (2006.01)
*H01L 29/10* (2006.01)
*H01L 31/036* (2006.01)

(52) U.S. Cl. .......................... 257/59; 257/617; 257/618
(58) Field of Classification Search .............. 257/49–72, 257/617–628
See application file for complete search history.

(56) References Cited

U.S. PATENT DOCUMENTS

| | | | |
|---|---|---|---|
| 4,409,134 A | 10/1983 | Yamazaki | |
| 5,084,777 A | 1/1992 | Slobodin | |
| 5,453,858 A | 9/1995 | Yamazaki | |
| 5,514,879 A | 5/1996 | Yamazaki | |
| 5,539,219 A * | 7/1996 | den Boer et al. | 257/72 |
| 5,614,732 A | 3/1997 | Yamazaki | |
| 5,648,662 A | 7/1997 | Zhang et al. | |
| 5,701,167 A | 12/1997 | Yamazaki | |
| 5,757,451 A | 5/1998 | Miyazaki et al. | |
| 5,766,989 A | 6/1998 | Maegawa et al. | |
| 5,815,232 A | 9/1998 | Miyazaki et al. | |
| 5,849,601 A | 12/1998 | Yamazaki | |

(Continued)

FOREIGN PATENT DOCUMENTS

CN    1956225    5/2007

(Continued)

OTHER PUBLICATIONS

Chinese Office Action (Application No. 200810137904.3) Dated Mar. 29, 2011.

(Continued)

*Primary Examiner* — Fernando L Toledo
*Assistant Examiner* — Karen Kusumakar
(74) *Attorney, Agent, or Firm* — Eric J. Robinson; Robinson Intellectual Property Law Office, P.C.

(57) ABSTRACT

A method of manufacturing, with high mass productivity, light-emitting devices having highly reliable thin film transistors with excellent electric characteristics is provided. In a light-emitting device having an inverted staggered thin film transistor, the inverted staggered thin film transistor is formed as follows: a gate insulating film is formed over a gate electrode; a microcrystalline semiconductor film which functions as a channel formation region is formed over the gate insulating film; a buffer layer is formed over the microcrystalline semiconductor film; a pair of source and drain regions are formed over the buffer layer; and a pair of source and drain electrodes are formed in contact with the source and drain regions so as to expose a part of the source and drain regions.

31 Claims, 25 Drawing Sheets

U.S. PATENT DOCUMENTS

| | | | |
|---|---|---|---|
| 5,859,445 A | 1/1999 | Yamazaki | |
| 5,917,572 A | 6/1999 | Kurauchi et al. | |
| 5,932,302 A | 8/1999 | Yamazaki et al. | |
| 5,942,767 A * | 8/1999 | Na et al. | 257/59 |
| 5,981,972 A | 11/1999 | Kawai et al. | |
| 6,011,277 A | 1/2000 | Yamazaki | |
| 6,023,075 A | 2/2000 | Yamazaki | |
| 6,104,042 A * | 8/2000 | Sah | 257/59 |
| 6,171,674 B1 | 1/2001 | Yamazaki et al. | |
| 6,183,816 B1 | 2/2001 | Yamazaki et al. | |
| 6,197,625 B1 * | 3/2001 | Choi | 438/158 |
| 6,252,249 B1 | 6/2001 | Yamazaki | |
| 6,281,520 B1 | 8/2001 | Yamazaki | |
| 6,306,213 B1 | 10/2001 | Yamazaki | |
| 6,323,521 B1 * | 11/2001 | Seo | 257/347 |
| 6,377,328 B1 | 4/2002 | Morimoto et al. | |
| 6,468,617 B1 | 10/2002 | Yamazaki et al. | |
| 6,493,050 B1 | 12/2002 | Lien et al. | |
| 6,671,025 B1 | 12/2003 | Ikeda et al. | |
| 6,737,676 B2 | 5/2004 | Yamazaki | |
| 6,756,258 B2 | 6/2004 | Zhang et al. | |
| 6,835,523 B1 | 12/2004 | Yamazaki et al. | |
| 6,836,308 B2 | 12/2004 | Sawasaki et al. | |
| 6,888,608 B2 | 5/2005 | Miyazaki et al. | |
| 7,067,844 B2 | 6/2006 | Yamazaki | |
| 7,098,479 B1 | 8/2006 | Yamazaki | |
| 7,115,902 B1 | 10/2006 | Yamazaki | |
| 7,199,846 B2 | 4/2007 | Lim | |
| 7,417,249 B2 | 8/2008 | Akimoto et al. | |
| 7,433,004 B2 | 10/2008 | Tsubata et al. | |
| 7,576,360 B2 | 8/2009 | Yamazaki | |
| 7,579,220 B2 | 8/2009 | Ohnuma et al. | |
| 7,609,331 B2 | 10/2009 | Lim | |
| 7,615,867 B2 | 11/2009 | Kim et al. | |
| 7,700,164 B2 | 4/2010 | Yamazaki et al. | |
| 8,111,362 B2 | 2/2012 | Yamazaki et al. | |
| 2002/0008819 A1 | 1/2002 | Yoshida | |
| 2003/0143784 A1 * | 7/2003 | Nishitani et al. | 438/149 |
| 2005/0012097 A1 | 1/2005 | Yamazaki | |
| 2005/0022864 A1 | 2/2005 | Fujioka et al. | |
| 2005/0041166 A1 | 2/2005 | Yamazaki et al. | |
| 2005/0089648 A1 | 4/2005 | Yamazaki et al. | |
| 2005/0205870 A1 * | 9/2005 | Yamazaki | 257/72 |
| 2006/0024866 A1 | 2/2006 | Gan et al. | |
| 2006/0186413 A1 | 8/2006 | Sakakura et al. | |
| 2006/0261336 A1 | 11/2006 | Ohnuma et al. | |
| 2006/0263952 A1 | 11/2006 | Hiroki et al. | |
| 2006/0287461 A1 | 12/2006 | Henze et al. | |
| 2007/0018165 A1 | 1/2007 | Yamazaki | |
| 2007/0132903 A1 | 6/2007 | Lim | |
| 2008/0099826 A1 | 5/2008 | Lai et al. | |
| 2008/0308807 A1 | 12/2008 | Yamazaki et al. | |
| 2009/0001375 A1 | 1/2009 | Yamazaki et al. | |
| 2009/0002590 A1 | 1/2009 | Kimura | |
| 2009/0002591 A1 | 1/2009 | Yamazaki et al. | |
| 2009/0009677 A1 | 1/2009 | Yamazaki et al. | |
| 2009/0039351 A1 | 2/2009 | Kobayashi et al. | |
| 2010/0062574 A1 | 3/2010 | Kim et al. | |
| 2010/0238391 A1 | 9/2010 | Yamazaki et al. | |
| 2010/0309416 A1 | 12/2010 | Gotoh | |
| 2012/0086012 A1 | 4/2012 | Yamazaki et al. | |

FOREIGN PATENT DOCUMENTS

| | | |
|---|---|---|
| EP | 1 505 174 | 2/2005 |
| JP | 62-062073 | 12/1987 |
| JP | 02-053941 | 11/1990 |
| JP | 04-242724 | 8/1992 |
| JP | 11-017188 | 1/1999 |
| JP | 11-154752 | 6/1999 |
| JP | 2000-277439 | 10/2000 |
| JP | 2001-007024 | 1/2001 |
| JP | 2004-014958 | 1/2004 |
| JP | 2005-049832 | 2/2005 |
| JP | 2005-050905 | 2/2005 |
| JP | 2005-167051 | 6/2005 |
| JP | 2005-322845 | 11/2005 |

OTHER PUBLICATIONS

Arai et al., "41.2: Micro Silicon Technology for Active Matrix OLED Display," SID Digest 07: SID International Symposium Digest of Technical Papers, pp. 1370-1373, May 2007.

Kim et al., "42.1: A Novel Four-Mask-Count Process Architecture for TFT-LCDs," SID Digest 00: SID International Symposium Digest of Technical Papers, pp. 1006-1009, May 2000.

Song et al. "34.1: Advanced Four-Mask Process Architecture for the a-Si TFT Array Manufacturing Method," SID Digest 02: SID International Symposium Digest of Technical Papers, pp. 1038-1041, May 2002.

Choi et al., "P-16: Novel Four-Mask Process in the FFS TFT-LCD with Optimum Multiple-Slit Design Applied by the use of a Gray-Tone Mask," SID Digest 05: SID International Symposium Digest of Technical Papers, pp. 284-287, May 2005.

* cited by examiner

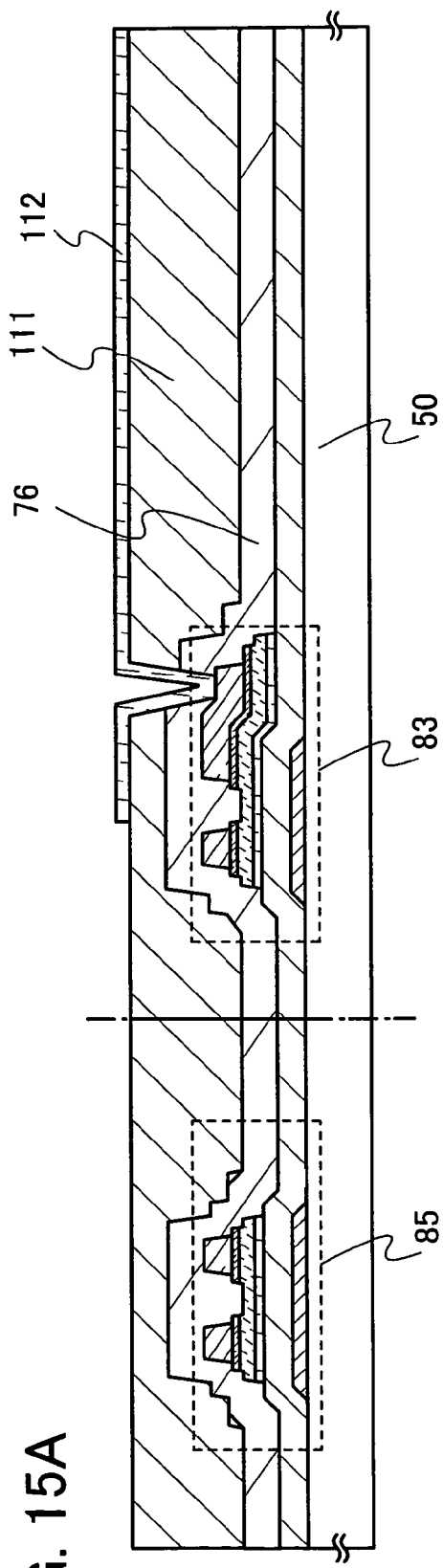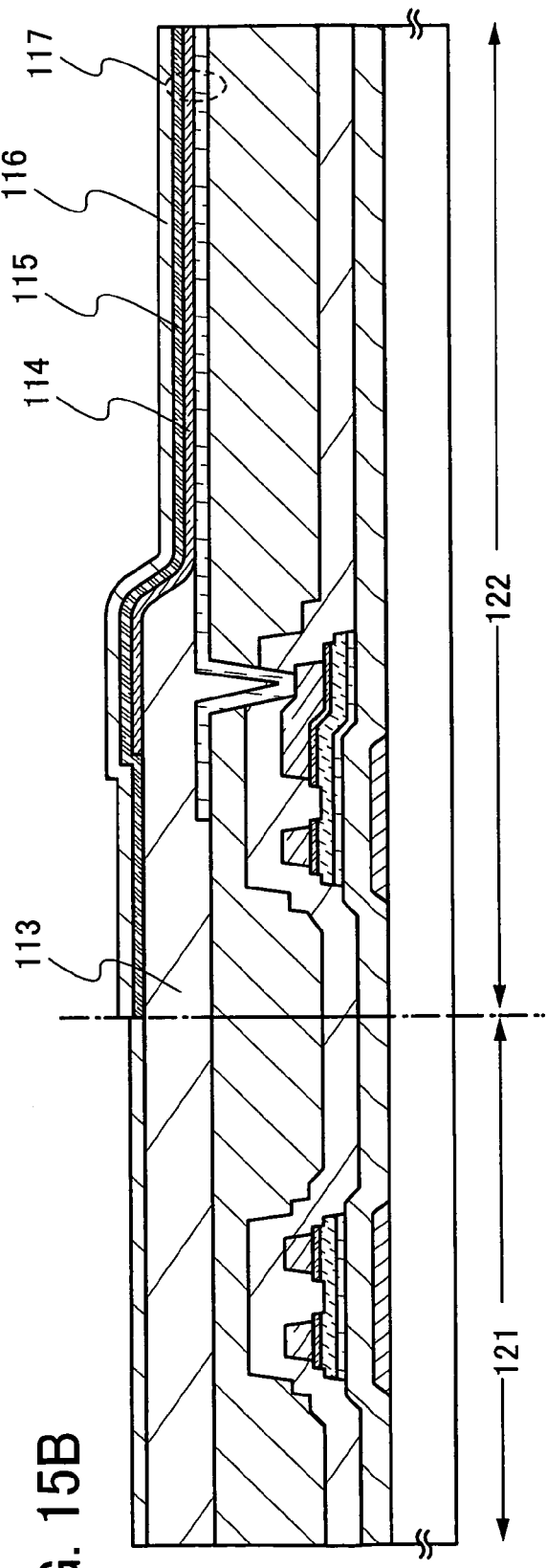

LIGHT-EMITTING DEVICE

BACKGROUND OF THE INVENTION

1. Field of the Invention

The present invention relates to a light-emitting device using a thin film transistor at least in a pixel portion.

2. Description of the Related Art

In recent years, techniques to form thin film transistors using, for a channel formation region, a semiconductor thin film (with a thickness of approximately several tens to several hundreds of nanometers) which is formed over a substrate having an insulating surface have attracted attention. Thin film transistors are widely used in electronic devices such as ICs and electro-optical devices, and their development especially as switching elements for image display devices has been accelerated.

As a switching element of an image display device, a thin film transistor using an amorphous semiconductor film for a channel formation region, a thin film transistor using a polycrystalline semiconductor film for a channel formation region, and the like are known. As a method of forming a polycrystalline semiconductor film, there is known a technique in which a pulsed excimer laser beam is shaped into a linear laser beam by an optical system and an amorphous silicon film is crystallized by being irradiated while being scanned with the linear laser beam.

As a switching element of an image display device, a thin film transistor using a microcrystalline semiconductor film for a channel formation region is also used (see References 1 and 2).

[Reference 1] Japanese Published Patent Application No. H4-242724

[Reference 2] Japanese Published Patent Application No. 2005-49832

SUMMARY OF THE INVENTION

A thin film transistor using a polycrystalline semiconductor film for a channel formation region has advantages in that its field-effect mobility is two or more orders of magnitude greater than that of a thin film transistor using an amorphous semiconductor film for a channel formation region and a pixel portion of a semiconductor display device and peripheral driver circuits thereof can be formed over the same substrate. However, the process of the thin film transistor using a polycrystalline semiconductor film for a channel formation region is more complex than a thin film transistor using an amorphous semiconductor film for a channel formation region, because crystallization of a semiconductor film provided over a glass substrate is added; accordingly, there are problems in that yield is decreased and cost is increased.

There is also a problem in that surfaces of crystal grains of a microcrystalline semiconductor film are easily oxidized. Therefore, when crystal grains in a channel formation region are oxidized, oxide films are formed on the surfaces of the crystal grains and the oxide films become obstacles to carrier transfer, which causes a problem in that electric characteristics of a thin film transistor are impaired.

In view of the above-mentioned problems, it is an object of the present invention to provide light-emitting devices and a method for manufacturing, with high mass productivity, light-emitting devices having highly reliable thin film transistors with good electric characteristics.

In a light-emitting device having an inverted staggered thin film transistor, the inverted staggered thin film transistor is formed as follows: a gate insulating film is formed over a gate electrode; a microcrystalline semiconductor film (also referred to as a semi-amorphous semiconductor film) which functions as a channel formation region is formed over the gate insulating film; a buffer layer is formed over the microcrystalline semiconductor film; a pair of source and drain regions are formed over the buffer layer; and a pair of source and drain electrodes are formed in contact with the source and drain regions so as to expose parts of the source and drain regions. Thus, the source and drain regions include regions that are in contact with the source and drain electrodes and regions that are not in contact with the source and drain electrodes. Outside the source and drain electrodes, parts of the source and drain regions and a part of the buffer layer are exposed. Outside end portions of the source and drain electrodes, end portions of the source and drain regions and the buffer layer are formed.

Due to misalignment of the end portions of the source and drain electrodes with the end portions of the source and drain regions, and due to formation of the end portions of the source and drain regions outside the end portions of the source and drain electrodes, the end portions of the source and drain electrodes are apart from each other; accordingly, leakage current and short circuit between the source and drain electrodes can be prevented.

The buffer layer has a concave portion in its part, and the side of the concave portion is aligned with the end portions of the source and drain regions. Because the buffer layer has a concave in its part, and the length of a path of carriers transfer is long, leakage current between the source and drain regions can be reduced.

Between the microcrystalline semiconductor film and the source and drain regions, the buffer layer is formed. The microcrystalline semiconductor film functions as a channel formation region. The buffer layer functions as a high-resistance region as well as preventing the microcrystalline semiconductor film from being oxidized. Because the buffer layer is formed using an amorphous semiconductor film having high resistance between the microcrystalline semiconductor film and the source and drain regions, field-effect mobility of a thin film transistor of the present invention is high, leakage current is low, and drain withstand voltage is high in the case of an off state (when a negative voltage is applied to a gate electrode).

As the buffer layer, an amorphous semiconductor film can be used, and moreover, it is preferable that the buffer layer be an amorphous semiconductor film containing at least any one of nitrogen, hydrogen, and halogen. When an amorphous semiconductor film is made to contain any one of nitrogen, hydrogen, and halogen, crystal grains contained in the microcrystalline semiconductor film can be further prevented from being oxidized.

The buffer layer can be formed by a plasma CVD method, a sputtering method, or the like. In addition, after an amorphous semiconductor film is formed, the amorphous semiconductor film was subjected to nitrogen plasma, hydrogen plasma, or halogen plasma so that the amorphous semiconductor film can be nitrided, hydrogenated or halogenated.

By provision of the buffer layer over the surface of the microcrystalline semiconductor film, oxidation of crystal grains contained in the microcrystalline semiconductor film can be reduced. Accordingly, the degree of degradation of electric characteristics of a thin film transistor can be lowered.

Unlike a polycrystalline semiconductor film, a microcrystalline semiconductor film can be directly formed over a substrate as a microcrystalline semiconductor film. Specifically, a microcrystalline semiconductor film can be formed using silicon hydride as a source gas and using a plasma CVD apparatus. The microcrystalline semiconductor film manufactured by the above method includes a microcrystalline semiconductor film which contains crystal grains of 0.5 nm to 20 nm in an amorphous semiconductor. Thus, unlike in the case of using a polycrystalline semiconductor film, there is no need to conduct a crystallization process after formation of a semiconductor film. The number of steps in manufacture of a thin film transistor can be reduced; yield of a light-emitting device can be increased; and cost can be lowered. Plasma using a microwave with a frequency of 1 GHz or more has high electron density, which facilitates dissociation of silicon hydride that is a source gas. Therefore, compared to a microwave plasma CVD method with a frequency of several tens to several hundreds of megahertz, the microcrystalline semiconductor film can be formed more easily and deposition rate can be increased, by a plasma CVD method using a microwave with a frequency of 1 GHz or higher. Thus, the mass productivity of light-emitting devices can be increased.

In addition, thin film transistors (TFTs) each using a microcrystalline semiconductor film for its channel formation region are formed, and a light-emitting device is manufactured using the thin film transistors in a pixel portion and also in driver circuits. Because thin film transistors using a microcrystalline semiconductor film for its channel formation region each have a field-effect mobility of 1 $cm^2/V \cdot sec$ to 20 $cm^2/V \cdot sec$, which is 2 to 20 times greater than that of a thin film transistor using an amorphous semiconductor film for its channel forming region, some of or all of the driver circuits can be formed over the same substrate as the pixel portion to form a system-on-panel display.

A light-emitting device includes a light-emitting element. A light-emitting element includes, in its scope, an element whose luminance is controlled by a current or a voltage, and specifically includes an inorganic electroluminescent (EL) element, an organic EL element, and the like.

Further, a light-emitting device includes a panel in which a light-emitting element is sealed, and a module in which an IC or the like including a controller is mounted to the panel. Moreover, the present invention relates to an element substrate which is a mode before completion of a light-emitting element in a manufacturing process of the light-emitting device, and the element substrate includes a means for supplying current to a light-emitting element in each of plural pixels. The element substrate may be specifically in a state where only a pixel electrode of a light-emitting element is formed or in a state after a conductive film to be a pixel electrode is formed and before the conductive film is etched into a pixel electrode, and any mode is possible.

Note that the term "light-emitting device" in this specification refer to image display devices, the light-emitting devices and light sources (including lighting devices). In addition, light-emitting devices include all of the following modules: modules provided with a connector, for example, a flexible printed circuit (FPC), a tape automated bonding (TAB) tape, or a tape carrier package (TCP); modules provided with a printed wiring board at the end of a TAB tape or a TCP; and modules where an integrated circuit (IC) is directly mounted on a light-emitting element by a chip-on-glass (COG) method.

According to the present invention, it is possible to manufacture, with high mass productivity, light-emitting devices having highly reliable thin film transistors with good electric characteristics.

BRIEF DESCRIPTION OF THE DRAWINGS

FIGS. 15A and 15B are cross-sectional views showing a manufacturing method of a light-emitting device according to an aspect of the present invention;

DETAILED DESCRIPTION OF THE INVENTION

Embodiment modes of the present invention will be hereinafter described with reference to the drawings. However, the present invention can be carried out in many different modes, and it is easily understood by those skilled in the art that the mode and detail of the present invention can be modified in various ways without departing from the spirit and scope thereof. Therefore, the present invention should not be interpreted as being limited to the description in the following embodiment modes.

Embodiment Mode 1

In this embodiment mode, manufacturing processes of thin film transistors used for a light-emitting device are described with reference to FIGS. 1A, 1B, FIGS. 2A to 2C, FIGS. 3A, 3B, FIGS. 4A, 4B, FIGS. 5A to 5C, FIGS. 6A to 6C, FIGS. 7A to 7C, FIGS. 8A, 8B, FIGS. 9A to 9D, FIG. 10, FIGS. 11A to 11D, and FIGS. 12A to 12C. FIGS. 1A, 1B, FIGS. 2A to 2C, FIGS. 3A, 3B, and FIGS. 4A, 4B and FIGS. 6A to 6C, FIGS. 8A, 8B are cross-sectional views showing manufacturing processes of thin film transistors, and FIGS. 5A to 5C and FIGS. 9A to 9D are top views each showing a connection region of a thin film transistor and a pixel electrode in a single pixel.

An n-channel thin film transistor having a microcrystalline semiconductor film is more suitable for use in a driver circuit than that of a p-channel thin film transistor having a microcrystalline semiconductor film, because the n-channel one has a higher field-effect mobility. It is desired that all thin film transistors formed over the same substrate have the same polarity, in order to reduce the number of steps. Here, description is made using an n-channel thin film transistor.

Figure 1A:
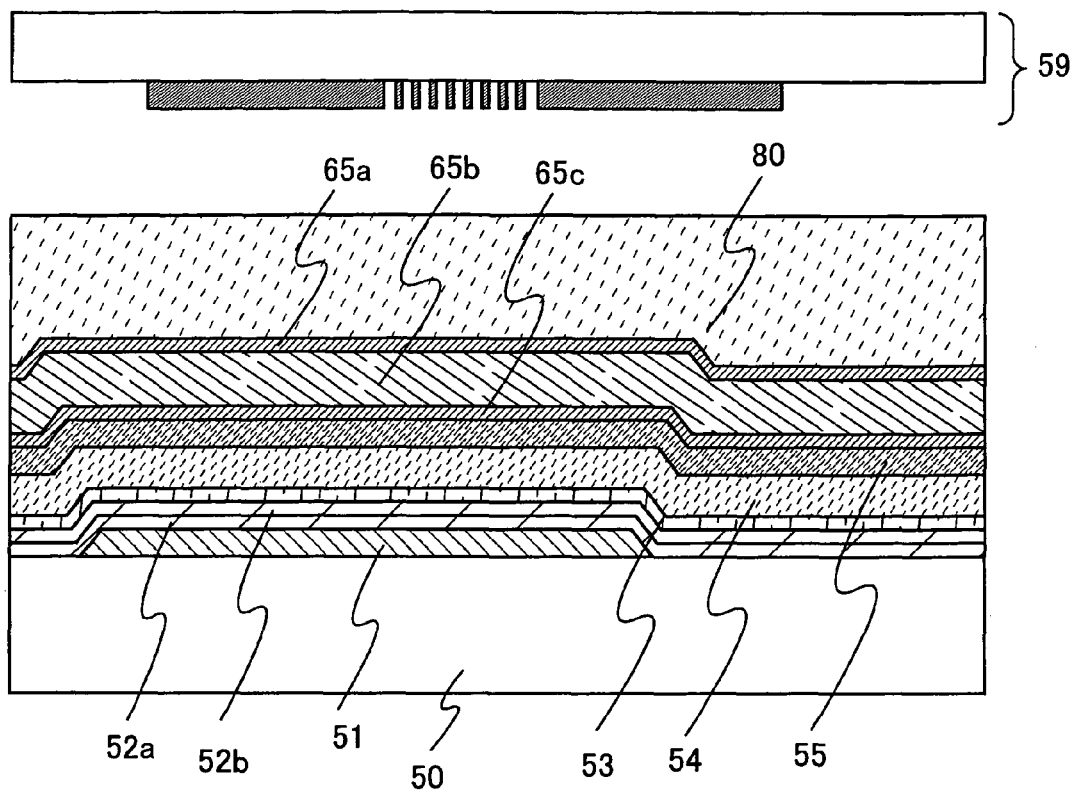
FIGS. 1A and 1B are cross-sectional views showing a method for manufacturing a light-emitting device according to an aspect of the present invention.

As illustrated in FIG. 1A, a gate electrode 51 is formed over a substrate 50. As the substrate 50, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, metal substrates of a stainless alloy and the like with the surface provided with an insulating film may be employed. When the substrate 50 is mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

The gate electrode 51 is formed using a metal material such as titanium, molybdenum, chromium, tantalum, tungsten, or aluminum or an alloy material thereof. The gate electrode 51 can be formed in such a manner that a conductive film is formed over the substrate 50 by a sputtering method or a vacuum evaporation method; a mask is formed over the conductive film by a photolithography technique or an inkjet method; and the conductive film is etched using the mask. Note that, as barrier metal which increases adhesion of the gate electrode 51 and prevents diffusion to a base, a nitride film of the above-mentioned metal material may be provided between the substrate 50 and the gate electrode 51. Here, the gate electrode 51 is formed by etching of the conductive film formed over the substrate 50 with use of a resist mask formed using a first photomask.

Note that, because an insulating film, a semiconductor film, a wiring and the like are to be formed over the gate electrode 51, it is desired that the gate electrode 51 be processed so as to have tapered end portions in order to prevent disconnection. In addition, although not shown, in this step, a wiring connected to the gate electrode can also be formed at the same time.

Next, over the gate electrode 51, gate insulating films 52a and 52b, a microcrystalline semiconductor film 53, a buffer layer 54, a semiconductor film 55 to which an impurity element imparting one conductivity type is added, and conductive films 65a to 65c are formed in this order. Then, a resist 80 is applied over the conductive film 65c. Note that it is preferable that at least the gate insulating films 52a and 52b, the microcrystalline semiconductor film 53, and the buffer layer 54 be formed successively. It is further preferable that the gate insulating films 52a and 52b, the microcrystalline semiconductor film 53, the buffer layer 54, and the semiconductor film 55 to which an impurity element imparting one conductivity type is added be formed successively. By successive formation of at least the gate insulating films 52a and 52b, the microcrystalline semiconductor film 53, and the buffer layer 54 without any exposure to the atmosphere, each interface between stacked layers can be formed without being contaminated by an atmospheric constituent or a contaminant impurity element floating in the atmosphere. Thus, variations in characteristics of thin film transistors can be reduced.

The gate insulating films 52a and 52b can each be formed by a CVD method, a sputtering method, or the like using a silicon oxide film, a silicon nitride film, a silicon oxynitride film, or a silicon nitride oxide film. Here, a mode is described in which a silicon oxide film or a silicon oxynitride film, and a silicon nitride film or a silicon nitride oxide film are stacked in this order as the gate insulating films 52a and 52b. Note that the gate insulating film can be formed by stacking not two layers but three layers of a silicon nitride film or a silicon nitride oxide film, a silicon oxide film or a silicon oxynitride film, and a silicon nitride film or a silicon nitride oxide film in this order from the substrate side. Alternatively, the gate insulating film can be formed of a single layer of a silicon oxide film, a silicon nitride film, a silicon oxynitride film, or a silicon nitride oxide film.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The microcrystalline semiconductor film 53 is a film which contains a semiconductor having an intermediate structure between amorphous and crystalline structures (including a single crystal and a polycrystal). This semiconductor is a semiconductor which has a third state that is stable in terms of free energy, and is a crystalline semiconductor which has short-range order and lattice distortion, and column-like or needle-like crystals with its grains with a size of 0.5 nm to 20 nm grown in the direction of a normal line with respect to the surface of the substrate. In addition, a microcrystalline semiconductor and an amorphous semiconductor are mixed. Microcrystalline silicon, which is a typical example of a microcrystalline semiconductor, has a Raman spectrum which is shifted to a lower wave number side than 521 cm$^{-1}$ that is a feature of single crystalline silicon. That is, the peak of a Raman spectrum of microcrystalline silicon is within the range from 481 cm$^{-1}$ to 521 cm$^{-1}$, which features of amorphous silicon and single crystalline silicon respectively. In addition, microcrystalline silicon is made to contain hydrogen or halogen of at least 1 at. % or more for termination of dangling bonds. Moreover, microcrystalline silicon is made to contain a rare gas element such as helium, argon, krypton, or neon to further enhance its lattice distortion, whereby stability is increased and a favorable microcrystalline semiconductor film can be obtained. Such a microcrystalline semiconductor film is disclosed in, for example, U.S. Pat. No. 4,409,134.

The microcrystalline semiconductor film can be formed by a high-frequency plasma CVD method with a frequency of several tens to several hundreds of megahertz or a microwave plasma CVD apparatus with a frequency of 1 GHz or more. The microcrystalline semiconductor film can be typically formed using silicon hydride, such as $SiH_4$ or $Si_2H_6$, which is dilluted with hydrogen. With a dilution with one or plural kinds of rare gas elements of helium, argon, krypton, and neon in addition to silicon hydride and hydrogen, the microcrystalline semiconductor film can be formed. In that case, the flow rate ratio of hydrogen to silicon hydride is set to be 50:1 to 1000:1, preferably, 50:1 to 200:1, more preferably, 100:1. Note that, in place of silicon hydride, $SiH_2Cl_2$, $SiHCl_3$, $SiCl_4$, $SiF_4$, or the like can be used.

A microcrystalline semiconductor film exhibits weak n-type conductivity when an impurity element for valence control is not intentionally added. Thus, threshold control of a microcrystalline semiconductor film which functions as a channel formation region of a thin film transistor can be done by addition of an impurity element which imparts p-type conductivity at the same time as or after the film formation. A typical example of an impurity element which imparts p-type conductivity is boron, and an impurity gas such as $B_2H_6$ or $BF_3$ may be mixed into silicon hydride at a proportion of 1 ppm to 1000 ppm, preferably, 1 ppm to 100 ppm. The concentration of boron may be set to be, for example, $1\times10^{14}$ atoms/cm$^3$ to $6\times10^{16}$ atoms/cm$^3$.

In addition, the oxygen concentration of the microcrystalline semiconductor film is preferably $5\times10^{19}$ cm$^{-3}$ or less, more preferably, $1\times10^{19}$ cm$^{-3}$ or less and each of the nitrogen concentration and the carbon concentration is preferably $3\times10^{18}$ cm$^{-3}$ or less. By decreases in concentrations of oxygen, nitrogen, and carbon mixed into the microcrystalline semiconductor film, the microcrystalline semiconductor film can be prevented from being changed into an n type.

The microcrystalline semiconductor film 53 is formed to a thickness of greater than 0 nm and less than or equal to 200 nm, preferably, from 1 nm to 100 nm, more preferably, from 5 nm to 50 nm. The microcrystalline semiconductor film 53 functions as a channel formation region of a thin film transistor to be formed later. When the thickness of the microcrystalline semiconductor film 53 is within the range from 5 nm to 50 nm, inclusive, the thin film transistor to be formed later is to be a fully depleted type. In addition, because the deposition rate of the microcrystalline semiconductor film 53 is low, i.e., a tenth to a thousandth of the deposition rate of an amorphous semiconductor film, a decrease of thickness leads to an increase of throughput. Furthermore, because the microcrystalline semiconductor film contains microcrystals, it has a lower resistance than an amorphous semiconductor film. Therefore, a thin film transistor using the microcrystalline semiconductor film for its channel formation region has current-voltage characteristics represented by a curve with a steep slope in a rising portion, has an excellent response as a switching element, and can be operated at high speed. With the use of the microcrystalline semiconductor film in a channel formation region of a thin film transistor, fluctuation of a threshold voltage of a thin film transistor can be suppressed. Therefore, a light-emitting device with less variation of electrical characteristics can be manufactured.

The microcrystalline semiconductor film has a higher mobility than an amorphous semiconductor film. Thus, with use of a thin film transistor, a channel formation region of which is formed of the microcrystalline semiconductor film, for switching of a light-emitting element, the area of the channel formation region, that is, the area of the thin film transistor can be decreased. Accordingly, the area occupied by the thin film transistor in a single pixel is decreased, and an aperture ratio of the pixel can be increased. As a result of this, a light-emitting device with high resolution can be manufactured.

The buffer layer 54 can be formed by a plasma CVD method using silicon hydride such as $SiH_4$ or $Si_2H_6$. Alternatively, with a dilution of silicon hydride mentioned above with one or plural kinds of rare gas elements selected from helium, argon, krypton, and neon, an amorphous semiconductor film can be formed. With use of hydrogen at a flow rate which is 1 to 20 times, preferably, 1 to 10 times, more preferably, 1 to 5 times higher than that of silicon hydride, a hydrogen-containing amorphous semiconductor film can be formed. With the use of silicon hydride mentioned above and nitrogen or ammonia, a nitrogen-containing amorphous semiconductor film can be formed. With use of silicon hydride mentioned above and a gas containing fluorine, chlorine, bromine, or iodine ($F_2$, $Cl_2$, $Br_2$, $I_2$, HF, HCl, HBr, HI, or the like), an amorphous semiconductor film containing fluorine, chlorine, bromine, or iodine can be formed. Note that, in place of silicon hydride, $SiH_2Cl_2$, $SiHCl_3$, $SiCl_4$, $SiF_4$, or the like can be used.

Alternatively, as the buffer layer 54, an amorphous semiconductor film can be formed by sputtering with hydrogen or a rare gas using an amorphous semiconductor as a target. In this case, by inclusion of ammonia, nitrogen, or $N_2O$ in an atmosphere, a nitrogen-containing amorphous semiconductor film can be formed. Alternatively, by inclusion of a gas including fluorine, chlorine, bromine, or iodine ($F_2$, $Cl_2$, $Br_2$, $I_2$, HF, HCl, HBr, HI, or the like) in an atmosphere, an amorphous semiconductor film containing fluorine, chlorine, bromine, or iodine can be formed.

Still alternatively, the buffer layer 54 may be formed by formation of an amorphous semiconductor film on the surface of the microcrystalline semiconductor film 53 by a plasma CVD method or a sputtering method and then by hydrogenation, nitridation, or halogenation of the surface of the amorphous semiconductor film through processing of the surface of the amorphous semiconductor film with hydrogen plasma, nitrogen plasma, or halogen plasma. Yet alternatively, the surface of the amorphous semiconductor film may be processed with helium plasma, neon plasma, argon plasma, krypton plasma, or the like.

The buffer layer 54 is preferably formed using an amorphous semiconductor film which does not contain crystal grains. Therefore, when the buffer layer 54 is formed by a high-frequency plasma CVD method or a microwave plasma CVD method with a frequency of several tens to several hundreds of megahertz, formation conditions are preferably controlled such that an amorphous semiconductor film does not contain crystal grains.

The buffer layer 54 is partly etched in a later formation process of a source region and a drain region in some cases, and in that case, the buffer layer 54 is preferably formed at such a thickness that a part of the buffer layer 54 is left after the etching. Typically, the thickness of the buffer layer is preferably from 150 nm to 200 nm, inclusive.

Note that it is preferable that an impurity element imparting one conductivity type such as phosphorus or boron be not added to the buffer layer 54. In particular, it is preferable that boron contained in the microcrystalline semiconductor film for threshold control or phosphorus contained in the semiconductor film to which an impurity element imparting one conductivity type is added be not mixed into the buffer layer 54. As a result of this, by elimination of a region where leakage current is generated due to a PN junction, leakage current can be decreased. By formation of an amorphous semiconductor film, to which an impurity element imparting one conductivity type such as phosphorus or boron is not added, between the semiconductor film to which an impurity element imparting one conductivity type is added and the microcrystalline semiconductor film, the diffusion of the impurity contained in each of the microcrystalline semiconductor film and source and drain regions can be prevented.

By formation of an amorphous semiconductor film, moreover, an amorphous semiconductor film containing hydrogen, nitrogen, or halogen on the surface of the microcrystalline semiconductor film 53, surfaces of crystal grains contained in the microcrystalline semiconductor film 53 can be prevented from being oxidized naturally. In particular, in a region where an amorphous semiconductor is in contact with microcrystal grains, a crack is likely to be caused due to distortion of crystal lattice. When this crack is exposed to oxygen, the crystal grains are oxidized, whereby silicon oxide is formed. However, by formation of the buffer layer on the surface of the microcrystalline semiconductor film 53, the microcrystal grains can be prevented from being oxidized. Furthermore, by formation of the buffer layer, the microcrystalline semiconductor film can be prevented from being mixed with an etching residue which is generated in forming source and drain regions later.

The buffer layer 54 is formed using an amorphous semiconductor film or an amorphous semiconductor film containing hydrogen, nitrogen, or halogen. An amorphous semiconductor film has a larger energy gap than the microcrystalline semiconductor film (the energy gap of the amorphous semiconductor film is 1.1 eV to 1.5 eV and the energy gap of the microcrystalline semiconductor film is 1.6 eV to 1.8 eV) and has a higher resistance, and has a lower mobility, i.e., a fifth to a tenth of that of the microcrystalline semiconductor film. Therefore, in a thin film transistor to be formed later, the buffer layer formed between source and drain regions and the microcrystalline semiconductor film functions as a high-resistant region and the microcrystalline semiconductor film functions as a channel formation region. Accordingly, the off current of the thin film transistor can be reduced. When the thin film transistor is used as a switching element of a light-emitting device, the contrast of the light-emitting device can be improved.

As for the semiconductor film 55 to which an impurity element imparting one conductivity type is added, in the case where an n-channel thin film transistor is to be formed, phosphorus may be added as a typical impurity element, and an impurity gas such as $PH_3$ may be added to silicon hydride. In the case where a p-channel thin film transistor is to be formed, boron may be added as a typical impurity element, and an impurity gas such as $B_2H_6$ may be added to silicon hydride. The semiconductor film 55 to which an impurity element imparting one conductivity type is added can be formed of a microcrystalline semiconductor or an amorphous semiconductor. Further, the semiconductor film 55 to which an impurity element imparting one conductivity type is added may be a multilayer in which an amorphous semiconductor film to which an impurity element imparting one conductivity type is added and a microcrystalline semiconductor film to which an impurity element imparting one conductivity type is added are stacked. An amorphous semiconductor film to which an impurity element imparting one conductivity type is added is formed on the buffer layer 54 side and a microcrystalline semiconductor film to which an impurity element imparting one conductivity type is added are stacked thereover, so that resistance varies gradually, and thus carriers easily move and the mobility can be enhanced. The semiconductor film 55 to which an impurity element imparting one conductivity type is added is formed to a thickness of from 2 nm to 50 nm, inclusive. By formation of the semiconductor film to which an impurity element imparting one conductivity type is added to a small thickness, throughput can be improved.

Figure 10:
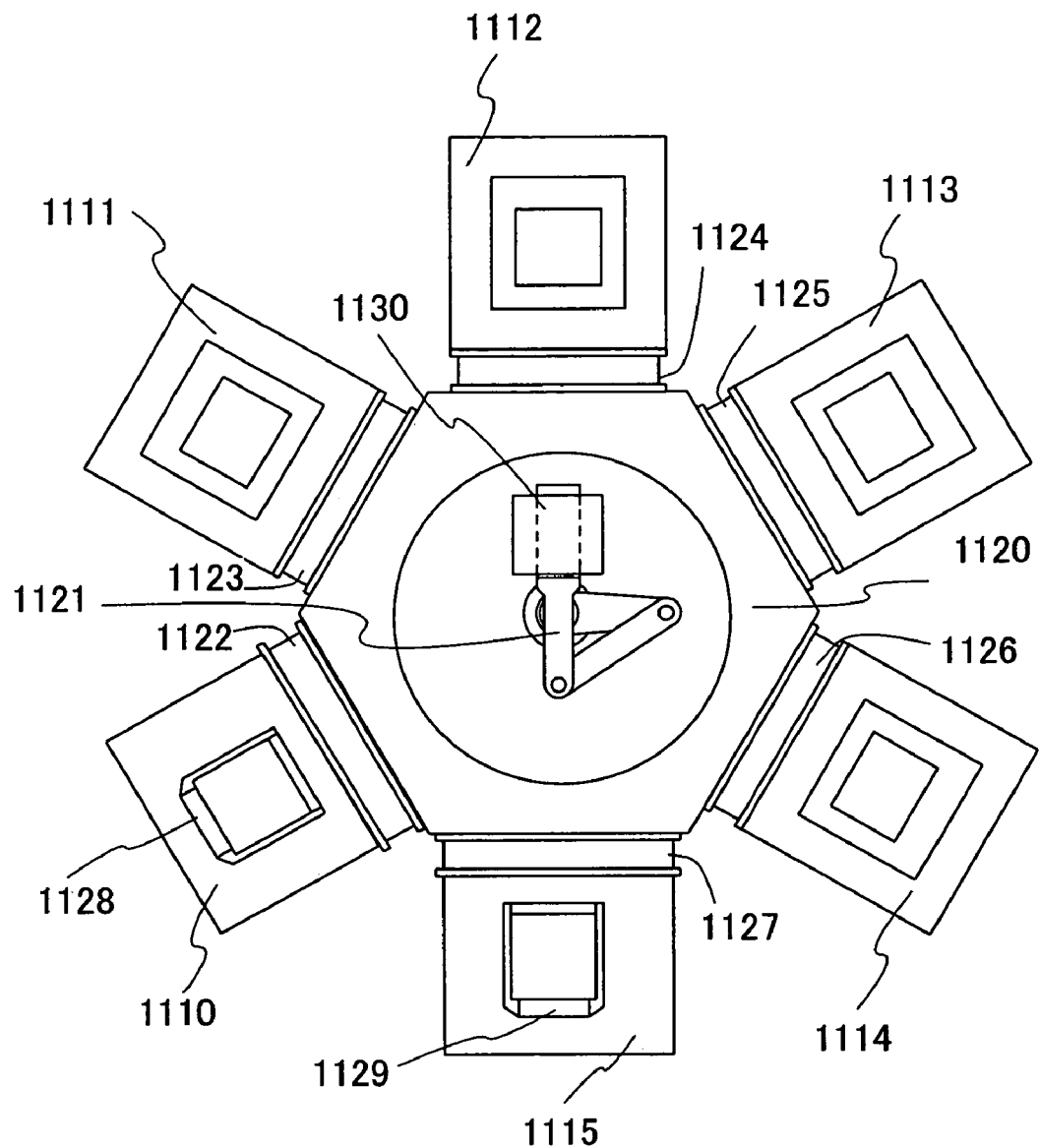
FIG. 10 is a top view showing a microwave plasma CVD apparatus according to an aspect of the present invention.

Here, a plasma CVD apparatus, with which from the gate insulating films 52a and 52b to the semiconductor film 55 to which an impurity element imparting one conductivity type is added can be formed successively, is described with reference to FIG. 10. FIG. 10 is a schematic diagram showing an upper cross-sectional view of a plasma CVD apparatus, which has a structure where a loading chamber 1110, an unloading chamber 1115, and reaction chambers (1) 1111 to (4) 1114 are provided around a common chamber 1120. Between the common chamber 1120 and the other chambers, gate valves 1122 to 1127 are provided so that processes performed in the chambers do not interface with each other. Substrates are loaded into a cassette 1128 in the loading chamber 1110 and a cassette 1129 in the unloading chamber 1115 and carried to the reaction chambers (1) 1111 to (4) 1114 with a transport means 1121 of the common chamber 1120. In this apparatus, a reaction chamber can be allocated for each of different kinds of deposition films, and a plurality of different films can be formed successively without any exposure to the atmosphere.

In each of the reaction chambers (1) to (4), the gate insulating films 52a and 52b, the microcrystalline semiconductor film 53, the buffer layer 54, and the semiconductor film 55 to which an impurity element imparting one conductivity type is added are stacked. In this case, a plurality of films of different kinds can be stacked successively by change of source gases. In this case, after the gate insulating films are formed, silicon hydride such as silane is introduced into the reaction chamber, residual oxygen and silicon hydride are reacted with each other, and the reactant is exhausted from the reaction chamber, whereby the concentration of residual oxygen in the reaction chamber can be decreased. Accordingly, the concentration of oxygen to be contained in the microcrystalline semiconductor film can be decreased. In addition, crystal grains contained in the microcrystalline semiconductor film can be prevented from being oxidized.

Alternatively, the gate insulating films 52a and 52b, the microcrystalline semiconductor film 53, and the buffer layer 54 are formed in each of the reaction chambers (1) and (3), and the semiconductor film 55 to which an impurity element imparting one conductivity type is added is formed in each of the reaction chambers (2) and (4). By formation of a film with an impurity element imparting one conductivity type alone, the impurity imparting one conductivity type which remains in the chamber can be prevented from being mixed into another film.

In this manner, with a microwave plasma CVD apparatus where a plurality of chambers is connected, the gate insulating films 52a and 52b, the microcrystalline semiconductor film 53, the buffer layer 54, and the semiconductor film 55 to which an impurity element imparting one conductivity type is added can be formed at the same time. Thus, mass productivity can be improved. In addition, even when maintenance or cleaning is performed in one of reaction chambers, film formation processes can be performed in the other reaction chambers, whereby cycle time for film formation can be shortened. Furthermore, each interface between stacked layers can be formed without being contaminated by an atmospheric constituent or a contaminant impurity element floating in the atmosphere. Thus, variations in characteristics of thin film transistors can be reduced.

Alternatively, it is possible that the gate insulating films 52a and 52b are formed in the reaction chamber (1), the microcrystalline semiconductor film 53 and the buffer layer 54 are formed in the reaction chamber (2), and the semiconductor film 55 to which an impurity element imparting one conductivity type is added is formed in the reaction chamber (3). Still alternatively, in the case where the gate insulating film 52a is to be formed of a silicon oxide film or a silicon oxynitride film and the gate insulating film 52b is to be formed of a silicon nitride film or a silicon nitride oxide film, five reaction chambers may be provided. A silicon oxide film or a silicon oxynitride film may be formed as the gate insulating film 52a in a reaction chamber (1); a silicon nitride film or a silicon nitride oxide film may be formed as the gate insulating film 52b in a reaction chamber (2); a microcrystalline semiconductor film may be formed in a reaction chamber (3); a buffer layer may be formed in a reaction chamber (4); and a semiconductor film to which an impurity element imparting one conductivity type is added may be formed in a reaction chamber (5). The deposition rate of a microcrystalline semiconductor film is low; thus, microcrystalline semiconductor films may be formed in a plurality of reaction chambers. For example, the gate insulating films 52a and 52b may be formed in a reaction chamber (1); the microcrystalline semiconductor films 53 may be formed in reaction chambers (2) and (3); the buffer layer 54 may be formed in a reaction chamber (4); and the semiconductor film 55 to which an impurity element imparting one conductivity type is added may be formed in a reaction chamber (5). In this manner, by formation of the microcrystalline semiconductor films 53 in a plurality of reaction chambers at the same time, throughput can be improved. In this case, it is preferable that the inner wall of each reaction chamber be coated with a film of the same kind as a film to be formed therein.

With use of a microwave plasma CVD apparatus having such a structure as described above, films of similar kinds or a film of one kind can be formed in each reaction chamber and can be formed successively without any exposure to the atmosphere. Therefore, each interface between stacked layers can be formed without being contaminated by a residue of the previously formed film or an impurity element floating in the atmosphere.

Note that the microwave plasma CVD apparatus shown in FIG. 10 is provided with the loading chamber and the unloading chamber separately, which may be a single loading/unloading chamber. In addition, the plasma CVD apparatus may be provided with a spare chamber. By preheating of a substrate in the spare chamber, heating time needed before film formation in each reaction chamber can be shortened; thus, throughput can be improved.

Film formation processes are described below. In each film formation process, a gas to be supplied from a gas supply portion may be selected depending on the purpose.

Here, a method is given as an example, in which a silicon oxynitride film is formed as the gate insulating film 52a and a silicon nitride oxide film is formed as the gate insulating film 52b.

First, inside of a processing container in a reaction chamber of the microwave plasma CVD apparatus is cleaned with fluorine radicals. Note that the inside of the reaction chamber can be cleaned by introduction of fluorine radicals into the reaction chamber, which are generated by introduction of carbon fluoride, nitrogen fluoride, or fluorine into a plasma generator provided outside of the reaction chamber and by dissociation thereof.

After cleaning with fluorine radicals, a large amount of hydrogen is introduced into the reaction chamber, whereby residual fluorine inside the reaction chamber can be reacted with hydrogen, so that the concentration of residual fluorine can be decreased. Accordingly, the amount of fluorine to be mixed into a protective film that is to be deposited later on the inner wall of the reaction chamber can be decreased, and the thickness of the protective film can be decreased.

Next, on the surface of the inner wall of the processing container in the reaction chamber, or the like, an oxynitride film is deposited as the protection film. Here, the pressure in the processing container is set to be 1 Pa to 200 Pa, preferably, 1 Pa to 100 Pa, and one or more kinds of rare gases such as helium, argon, xenon, and krypton is introduced as a plasma ignition gas. Furthermore, hydrogen and any one kind of rare gases are introduced. In particular, it is preferable that helium, moreover, helium and hydrogen be used as a plasma ignition gas.

Although helium has a high ionization energy of 24.5 eV, it has a metastable state at about 20 eV. Therefore, helium can be ionized at about 4 eV during discharge. Thus, discharge starting voltage is low and discharge can be maintained easily. Accordingly, uniform plasma can be maintained, and power saving can be achieved.

Alternatively, as the plasma ignition gas, an oxygen gas and one or more kinds of rare gases such as helium, argon, xenon, and krypton may be introduced. By introduction of an oxygen gas together with a rare gas into the processing container, plasma ignition can be facilitated.

Next, a power supply apparatus is turned on and the output of the power supply apparatus is set to be 500 W to 6000 W, preferably, 4000 W to 6000 W to generate plasma. Then, a source gas is introduced into the processing container through a gas pipe. Specifically, by introduction of dinitrogen monoxide, a rare gas, and silane as a source gas, a silicon oxynitride film is formed as the protective film on the inner wall of the processing container. The flow rate of silicon hydride at this time is set to be 50 sccm to 300 sccm and that of dinitrogen monoxide is set to be 500 sccm to 6000 sccm, and the thickness of the protective film is set to be 500 nm to 2000 nm.

Then, the supply of the source gas is stopped, the pressure in the processing container is decreased, and the power supply apparatus is turned off. After that, a substrate is introduced onto the supporting base in the processing container.

Next, through a similar process to that of the protective film, a silicon oxynitride film is deposited over the substrate as the gate insulating film 52a.

After the silicon oxynitride film is deposited to a predetermined thickness, the supply of the source gas is stopped, the pressure in the processing container is decreased, and the power supply apparatus is turned off.

Next, the pressure in the processing container is set to be 1 Pa to 200 Pa, preferably, 1 Pa to 100 Pa, and one or more kinds of rare gases such as helium, argon, xenon, and krypton which is a plasma ignition gas and silane, dinitrogen monoxide, and ammonia which are a source gas are introduced. Note that, as the source gas, nitrogen may be introduced instead of ammonia. Then, the power supply apparatus is turned on, and the output of the power supply apparatus is set to be 500 W to 6000 W, preferably, 4000 W to 6000 W to generate plasma. Next, the source gas is introduced into the processing container through the gas pipe, and a silicon nitride oxide film is formed as the gate insulating film over the silicon oxynitride film over the substrate 1130. Then, the supply of the source gas is stopped, the pressure in the processing container is decreased, the power supply apparatus is turned off, and the film formation process is completed.

Through the above-described process, the silicon oxynitride film is formed as the protective film on the inner wall of the reaction chamber, and the silicon oxynitride film and the silicon nitride oxide film are successively formed over the substrate, whereby mixture of an impurity such as silicon oxide into the silicon nitride oxide film on the upper layer side can be suppressed. By formation of the above-mentioned films by a microwave plasma CVD method using a power supply apparatus which can generate a microwave as a power supply apparatus, plasma density can be made to be high and the films can be formed to have high withstand voltage. With use of the films as a gate insulating film, variations in threshold voltages of transistors can be suppressed. In addition, BT characteristics can be improved. Moreover, resistance to static electricity is increased, and a transistor which is not easily destroyed even when high voltage is applied can be manufactured. Furthermore, a transistor which is less destroyed over time can be manufactured. In addition, a transistor with less hot carrier damage can be manufactured.

In the case where a gate insulating film is a single layer of a silicon oxynitride film which is formed using the microwave plasma CVD apparatus, the above-described formation method of the protective film and the formation method of the silicon oxynitride film are used. In particular, when the flow rate ratio of dinitrogen monoxide to silane is set to be 50:1 to 300:1, preferably, 50:1 to 250:1, the silicon oxynitride film can be formed to have high withstand voltage.

Next, a film formation process is described, in which a microcrystalline semiconductor film and an amorphous semiconductor film as a buffer layer are successively formed by a plasma CVD method. First, in a similar manner to the gate insulating films, the inside of the reaction chamber is cleaned. Next, a silicon film is deposited as a protective film inside the processing container. Here, the pressure in the processing container is set to be 1 Pa to 200 Pa, preferably, 1 Pa to 100 Pa, and one or more kinds of rare gases such as helium, argon, xenon, and krypton is introduced as a plasma ignition gas. Note that hydrogen may be introduced together with the rare gas.

Then, the power supply apparatus is turned on, and the output of the power supply apparatus is set to be 500 W to 6000 W, preferably, 4000 W to 6000 W to generate plasma. Next, a source gas is introduced into the processing container through the gas pipe. Specifically, by introduction of a silicon hydride gas and a hydrogen gas as a source gas, a microcrystalline silicon film is formed as a protective film on the inner wall of the processing container. Alternatively, a microcrystalline semiconductor film can be formed from a dilution of a silicon hydride gas and a hydrogen gas with one or more kinds of rare gas elements selected from helium, argon, krypton, and neon. The flow rate ratio of hydrogen to silicon hydride at this time is set to be 5:1 to 1000:1, preferably, 50:1 to 200:1, more preferably, 100:1 to 150:1. In addition, the thickness of the protective film at this time is set to be 500 nm to 2000 nm. Note that, before the power supply apparatus is turned on, a silicon hydride gas and a hydrogen gas in addition to the above-mentioned rare gas may be introduced into the processing container.

Alternatively, an amorphous semiconductor film can be formed as the protective film from a dilution of a silicon hydride gas and a hydrogen gas with one or more kinds of rare gas elements selected from helium, argon, krypton, and neon.

Then, the supply of the source gas is stopped, the pressure in the processing container is decreased, and the power supply apparatus is turned off. After that, the substrate is introduced onto the support base in the processing container.

Next, the surface of the gate insulating film 52b formed over the substrate may be processed with hydrogen plasma. By processing with hydrogen plasma before the microcrystalline semiconductor film is formed, lattice distortion at the interface between the gate insulating film and the microcrystalline semiconductor film can be decreased, and interface characteristics of the gate insulating film and the microcrystalline semiconductor film can be improved. Accordingly, electric characteristics of a thin film transistor to be formed later can be improved.

In the hydrogen plasma processing, the amorphous semiconductor film or the microcrystalline semiconductor film which is formed as the protective film inside the processing container is also processed with hydrogen plasma, whereby the protective film is etched and a slight amount of semiconductor is deposited on the surface of the gate insulating film 52b. The semiconductor serves as a nucleus of crystal growth, and with the nucleus, a microcrystalline semiconductor film is deposited. As a result, lattice distortion at the interface between the gate insulating film and the microcrystalline semiconductor film can be decreased, and interface characteristics of the gate insulating film and the microcrystalline semiconductor film can be improved. Accordingly, electric characteristics of a thin film transistor to be formed later can be improved.

Next, in a similar process to the protective film, a microcrystalline silicon film is deposited over the substrate. The thickness of the microcrystalline silicon film is set to be greater than 0 nm and less than or equal to 50 nm, preferably, greater than 0 nm and less than or equal to 20 nm.

After the microcrystalline silicon film is deposited to a predetermined thickness, the supply of the source gas is stopped, the pressure in the processing container is decreased, the power supply apparatus is turned off, and the film formation process for the microcrystalline semiconductor film is completed.

Next, the pressure in the processing container is decreased, and the flow rate of the source gas is adjusted. Specifically, the flow rate of a hydrogen gas is significantly decreased compared to that under film formation conditions for the microcrystalline semiconductor film. Typically, a hydrogen gas is introduced at a flow rate which is 1 to 20 times, preferably, 1 to 10 times, more preferably, 1 to 5 times higher than the flow rate of silicon hydride. Alternatively, a silicon hydride gas is introduced without any hydrogen gas being introduced into the processing container. By such a decrease in flow rate of hydrogen to silicon hydride, the deposition rate of an amorphous semiconductor film as the buffer layer can be increased. Alternatively, a silicon hydride gas is diluted with one or more kinds of rare gas elements selected from helium, argon, krypton, and neon. Next, the power supply apparatus is turned on and the output of the power supply apparatus is set to be 500 W to 6000 W, preferably, 4000 W to 6000 W to generate plasma 200, whereby an amorphous semiconductor film can be formed. Because the deposition rate of an amorphous semiconductor film is higher than that of a microcrystalline semiconductor film, the pressure in the processing container can be set to be low. The thickness of the amorphous semiconductor film at this time is set to be 200 nm to 400 nm.

After the amorphous semiconductor film is deposited to a predetermined thickness, the supply of the source gas is stopped, the pressure in the processing container is decreased, the power supply apparatus is turned off, and the film formation process for the amorphous semiconductor film is completed.

Note that the microcrystalline semiconductor film 53 and the amorphous semiconductor film which is the buffer layer 54 may be formed while plasma is ignited. Specifically, while the flow rate ratio of hydrogen to silicon hydride which are the source gas used to form the microcrystalline semiconductor film 53 is gradually decreased, the microcrystalline semiconductor film 53 and the amorphous semiconductor film which is the buffer layer 54 are stacked. By such a method, an impurity is not deposited at the interface between the microcrystalline semiconductor film 53 and the buffer layer 54; interface with less distortion can be formed; and electric characteristics of a thin film transistor to be formed later can be improved.

In the case where the microcrystalline semiconductor film 53 is formed, a microwave plasma CVD apparatus with a frequency of 1 GHz or more is preferably used. Microwave plasma has high electron density, and a large number of radicals are formed from a source gas and supplied to the substrate 1130. Thus, reaction of radicals at the surface of the substrate is promoted, and the deposition rate of microcrystalline silicon can be increased. By a plasma CVD method with a high frequency of 1 MHz to 20 MHz, typically 13.56 MHz, or a high frequency in VHF band, from 20 MHz to about 120 MHz, typically, 27.12 MHz or 60 MHz, the microcrystalline semiconductor film can be formed.

Note that, in each of the manufacturing processes of the gate insulating film and the semiconductor film, in the case where a protective film of 500 nm to 2000 nm is formed on the inner wall of the reaction chamber, the cleaning process and the formation process of the protective film can be omitted.

The conductive films 65a to 65c are formed over the semiconductor film 55 to which an impurity element imparting one conductivity type is added, using a single layer or a stacked layer of aluminum, copper or an aluminum alloy to which an element to improve heat resistance or an element to prevent a hillock, e.g., such as silicon, titanium, neodymium, scandium, or molybdenum, is added. Alternatively, the conductive film may have a stacked-layer structure where a film on the side in contact with the semiconductor film to which an impurity element imparting one conductivity type is added is formed of titanium, tantalum, molybdenum, tungsten, or nitride of any of these elements and an aluminum film or an aluminum alloy film is formed thereover. Still alternatively, the conductive film may have a stacked-layer structure where an aluminum film or an aluminum alloy film is sandwiched between upper and lower films of titanium, tantalum, molybdenum, tungsten, or nitride of any of these elements. Here, as the conductive film, a conductive film with a three-layer structure where conductive films 65a to 65c are stacked is described. A stacked-layer conductive film where molybdenum films are used as the conductive films 65a and 65c and an aluminum film is used as the conductive film 65b or a stacked-layer conductive film where titanium films are used as the conductive films 65a and 65c and an aluminum film is used as the conductive film 65b can be given. The conductive films 65a to 65c are formed by a sputtering method or a vacuum evaporation method.

A resist 80 can be a positive type resist or a negative type resist. In this case, a positive type resist is used.

Next, the resist 80 is irradiated with light using a multi-tone photomask 59 as a second photomask to expose the resist 80 to light.

Now light exposure using the multi-tone photomask 59 is described with reference to FIGS. 11A to 11D.

A multi-tone photomask can achieve three levels of light exposure, an exposed portion, a half-exposed portion, and an unexposed portion; one-time exposure and development process allows a resist mask with regions of plural thicknesses (typically, two kinds of thicknesses) to be formed. The use of a multi-tone photomask allows the number of photomasks to be reduced.

Figure 11A:
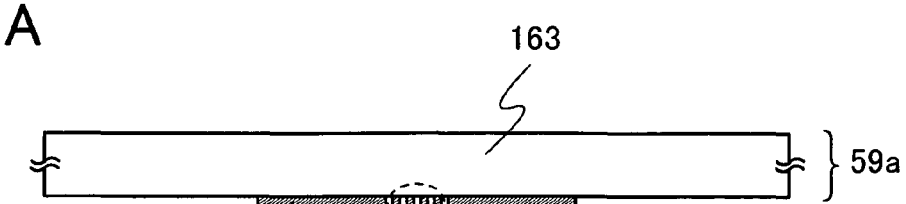
FIGS. 11A to 11D are views showing multi-tone masks which can be applied to the present invention.
Figure 11B:
Figure 11C:
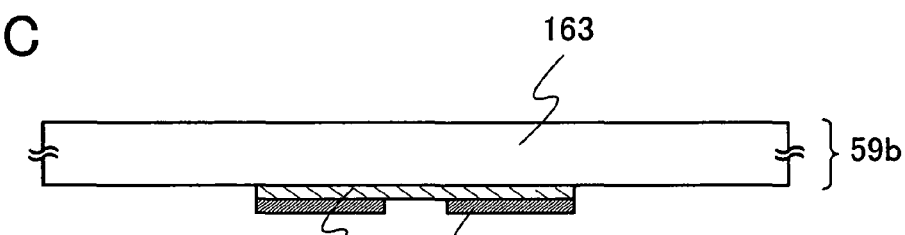

Typical examples of a multi-tone photomask include a gray-tone mask 59a as illustrated in FIG. 11A, and a half-tone mask 59b as illustrated in FIG. 11C.

As illustrated in FIG. 11A, the gray-tone mask 59a includes a substrate 163 having a light-transmitting property, and a light-blocking portion 164 and a diffraction grating 165 that are formed thereon. The light transmittance of the light-blocking portion 164 is 0%. The diffraction grating 165 has a light-transmitting portion in a slit form, a dot form, a mesh form, or the like with intervals which are less than or equal to the resolution limit for light used for the exposure; thus, the light transmittance can be controlled. The diffraction grating 165 can have regularly-arranged slits, dots, or meshes form, or irregularly-arranged slits, dots, or meshes.

For the substrate 163 having a light-transmitting property, a substrate having a light-transmitting property, such as a quartz substrate, can be used. The light-blocking portion 164 and the diffraction grating 165 can be formed using a light-blocking material such as chromium or chromium oxide, which absorbs light.

When the gray-tone mask 59a is irradiated with light for exposure, the light transmittance 166 of the light-blocking portion 164 is 0% and that of a region where neither the light-blocking portion 164 nor the diffraction grating 165 are provided is 100%, as illustrated in FIG. 11B. The light transmittance of the diffraction grating 165 can be controlled in a range of 10% to 70%. The light transmittance of the diffraction grating 165 can be controlled by adjusting an interval or a pitch between slits, dots, or meshes of the diffraction grating 165.

As illustrated in FIG. 11C, the half-tone mask 59b includes the substrate 163 having a light-transmitting property, and a semi-transmissive portion 167 and a light-blocking portion 168 that are formed thereon. The semi-transmissive portion 167 can be formed using MoSiN, MoSi, MoSiO, MoSiON, CrSi, or the like. The light-blocking portion 168 can be formed using a light-blocking material such as chromium or chromium oxide, which absorbs light.

Figure 11D:
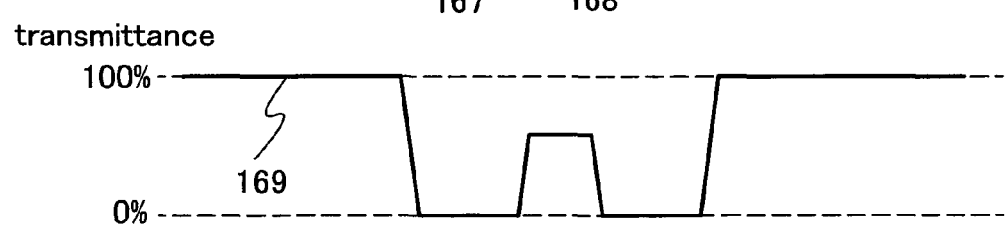

When the half-tone mask 59b is irradiated with light for exposure, the light transmittance 169 of the light-blocking portion 168 is 0% and that of a region where neither the light-blocking portion 168 nor the semi-transmissive portion 167 is provided is 100%, as illustrated in FIG. 11D. The light transmittance of the semi-transmissive portion 167 can be controlled in a range of 10% to 70%. The light transmittance of the semi-transmissive portion 167 can be controlled depending on a material of the semi-transmissive portion 167.

Figure 1B:
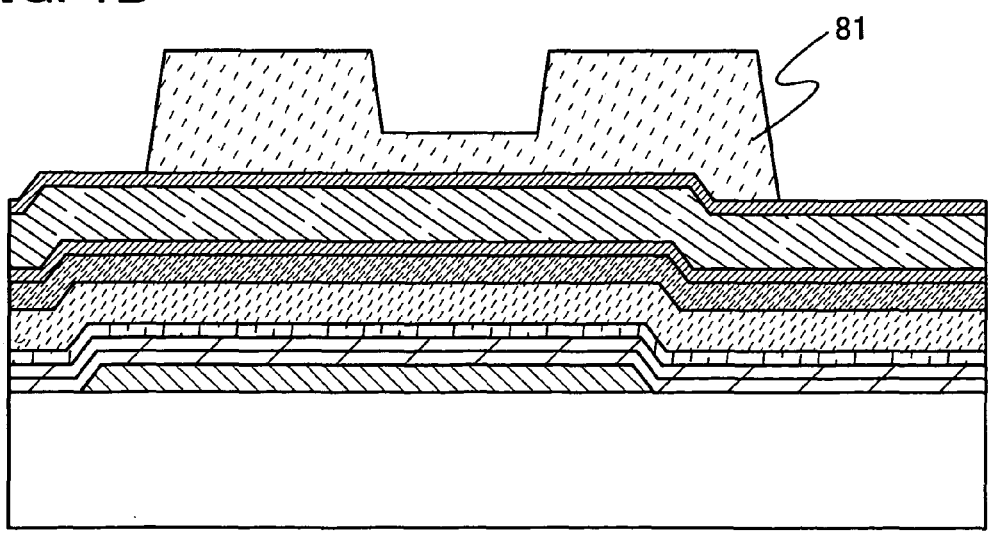

After the light exposure using the multi-tone photomask is done, development is carried out, whereby the resist mask 81 having regions with different thicknesses can be formed, as illustrated in FIG. 1B.

Figure 2A:
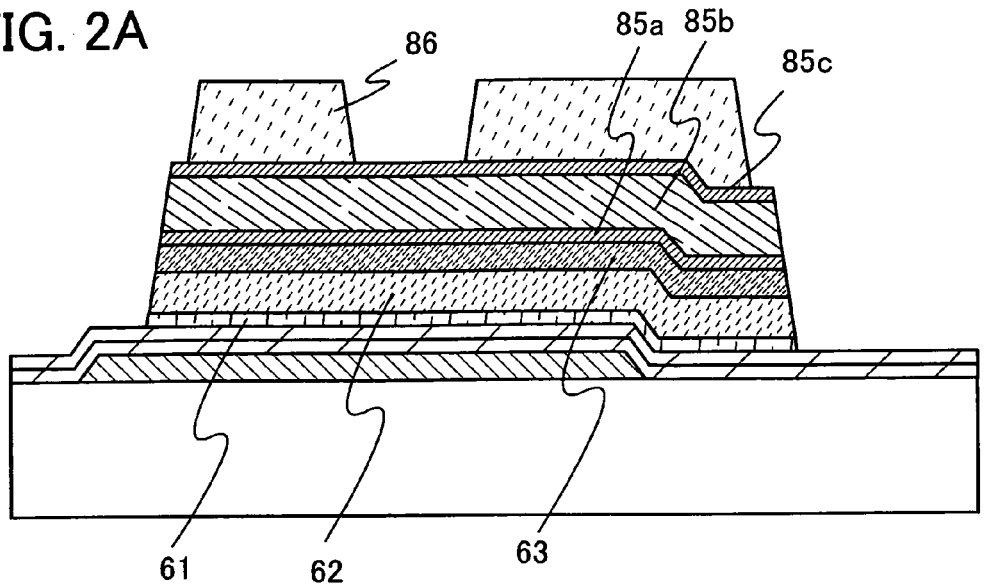
FIGS. 2A to 2C are cross-sectional views showing a method for manufacturing a light-emitting device according to an aspect of the present invention.

Next, with the resist mask 81, the microcrystalline semiconductor film 53, the buffer layer 54, the semiconductor film 55 to which an impurity element imparting one conductivity type is added, and the conductive films 65a to 65c are etched for separation. As a result, a microcrystalline semiconductor film 61, a buffer layer 62, a semiconductor film 63 to which an impurity element imparting one conductivity type is added, and conductive films 85a to 85c can be formed, as illustrated in FIG. 2A. Note that FIG. 2A corresponds to a cross-sectional view taken along the line A-B in FIG. 5A (excluding a resist mask 86).

The side faces in the end portions of the microcrystalline semiconductor film 61 and the buffer layer 62 are inclined, so that leakage current can be prevented from flowing between the source and drain regions formed over the buffer layer 62 and the microcrystalline semiconductor film 61. In addition, leakage current between the source and drain electrodes and the microcrystalline semiconductor film 61 can also be prevented. The inclination angle of the side faces in the end portions of the microcrystalline semiconductor film 61 and the buffer layer 62 is from 30° to 90°, preferably from 45° to 80°. By adopting such an angle, disconnection of the source electrode or the drain electrode due to the step can be prevented.

Next, ashing is conducted on the resist mask 81. As a result, the area and the thickness of the resist are reduced. At this time, the resist in a region with a small thickness (a region overlapping with part of the gate electrode 51) is removed to form separated resist masks 86, as illustrated in FIG. 2A.

Figure 2B:
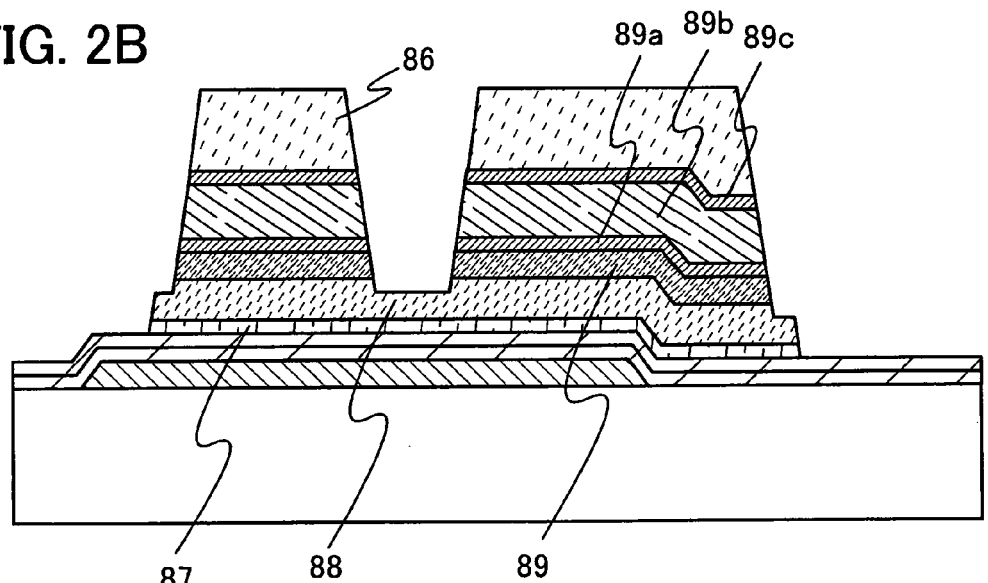

Next, using the resist mask 86, the semiconductor film 63 to which an impurity element imparting one conductivity type is added and the conductive films 85a to 85c are etched for separation. At this time, dry etching is conducted to separate the conductive films 85a to 85c. As a result, a pair of conductive films 89a to 89c and a pair of source and drain regions 89 can be formed, as illustrated in FIG. 2B. In this etching process, a part of the buffer layer 62 is also etched. The buffer layer which is partly etched is referred to as a buffer layer 88. The source and drain regions and the concave portion of the buffer layer can be formed in the same process. The buffer layer 88 has end portions protruding outside conductive films 85a to 85c because the buffer layer 88 is partly etched using the resist mask 86 with a reduced area.

Figure 2C:
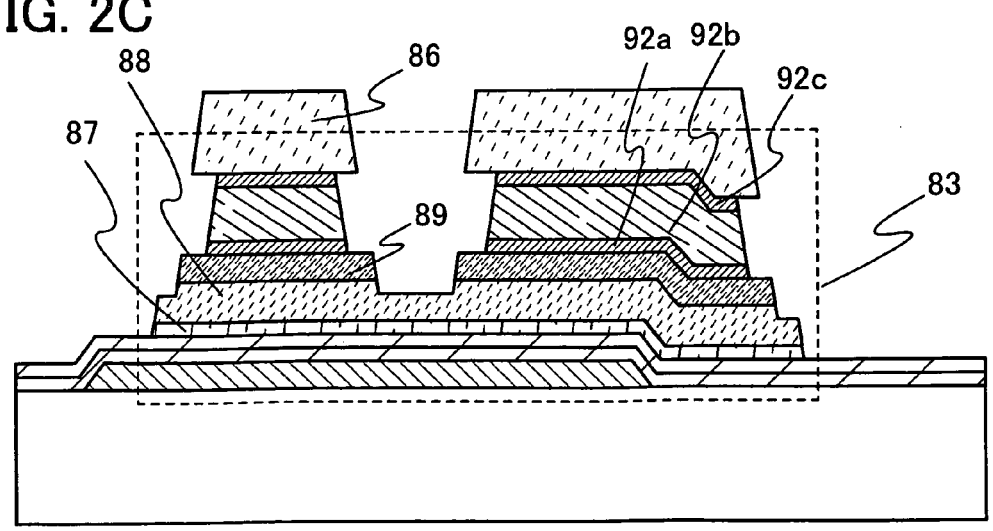

Next, as illustrated in FIG. 2C, the conductive films 89a to 89c are partly etched to form source and drain electrodes 92a to 92c. Here, by wet etching of the conductive films 89a to 89c with use of the resist mask 86, the end portions of the conductive films 89a to 89c are selectively etched. As a result, the source and drain electrodes 92a to 92c having smaller areas than the resist mask 86 and the conductive films 89a to 89c can be formed. The end portions of the source and drain electrodes 92a to 92c are not aligned with the end portions of the source and drain regions 89, and the end portions of the source and drain regions 89 are formed outside the end portions of the source and drain electrodes 92a to 92c. After that, the resist mask 86 is removed.

Figure 5A:
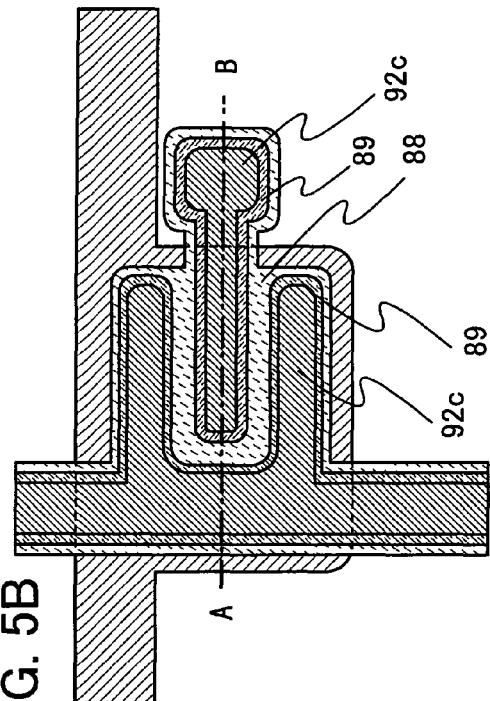
FIGS. 5A to 5C are top views showing a method for manufacturing a light-emitting device according to an aspect of the present invention.
Figure 5B:
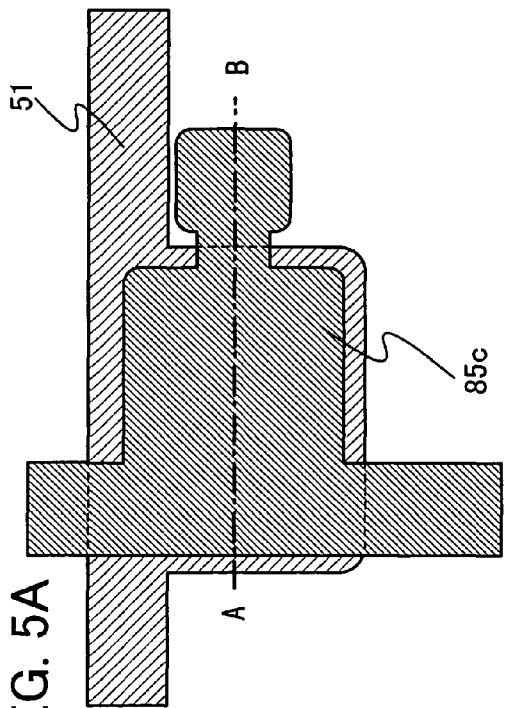
Figure 5C:
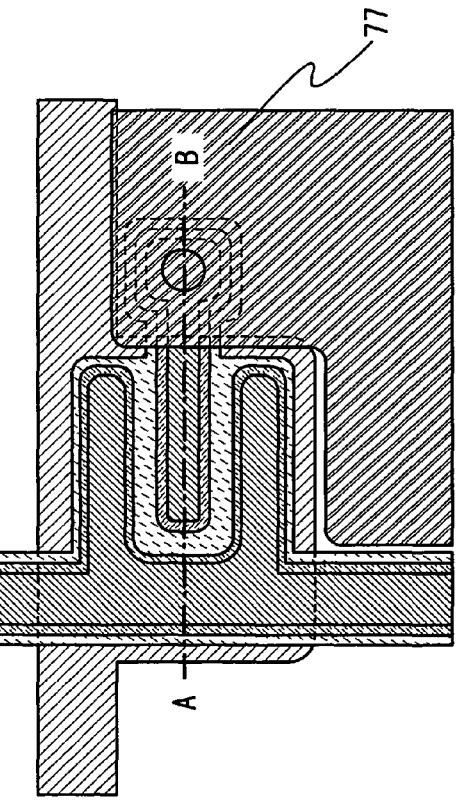

Note that FIG. 2C corresponds to a cross-sectional view taken along the line A-B of FIG. 5B. As illustrated in FIG. 5B, it can be seen that the end portions of the source and drain regions 89 are located outside of the end portions of the source and drain electrodes 92c. In addition, the end portions of the buffer layer 88 are located outside the end portions of the source and drain electrodes 92c and the source and drain regions 89. Further, one of the source and drain electrodes has a shape in which the one electrode partially surrounds the other of the source and drain regions (specifically, a U shape or a C shape). Thus, an area in which carriers can move can be increased, and thus the amount of current can be increased and an area for a thin film transistor can be reduced. In the inner portion of the gate electrode, the microcrystalline semiconductor film 87 and the source and drain electrodes 92c are overlapped, and thus influence by unevenness at the end portions of the gate electrode is small and reduction of coverage and generation of leakage current can be suppressed. Note that one of the source and drain electrodes also functions as a source or drain wiring.

With such a shape as illustrated in FIG. 2C in which the end portions of the source and drain electrodes 92a to 92c are not aligned with the end portions of the source and drain regions 89, the end portions of the source and drain electrodes 92a to 92c are apart from each other; therefore, leakage current and short circuit between the source and drain electrodes can be prevented. Accordingly, a thin film transistor with high reliability and high withstand voltage can be manufactured.

Through the above-described process, a channel-etch thin film transistor 83 can be formed. In addition, the thin film transistor can be formed using two photomasks.

In the thin film transistor described in this embodiment mode, the gate insulating film, the microcrystalline semiconductor film, the buffer layer, the source and drain regions, and the source and drain electrodes are stacked over the gate electrode, and the buffer layer covers the surface of the microcrystalline semiconductor film which functions as a channel formation region. In addition, a concave portion (a groove) is formed in a part of the buffer layer, and regions other than the concave portion are covered with the source and drain regions. That is, due to the concave formed in the buffer layer, the length of a path for carriers the source and drain regions is long; thus, leakage current between the source and drain regions can be reduced. In addition, because the concave is formed by etching of a part of the buffer layer, an etching residue which is generated in the formation step of the source and drain regions can be removed. Accordingly, leakage current (parasitic channel) can be prevented from being generated between the source and drain regions through the residue.

The buffer layer is formed between the microcrystalline semiconductor film which functions as a channel formation region and the source and drain regions. In addition, the buffer layer covers the surface of the microcrystalline semiconductor film. Because the buffer layer, which is formed to have high resistance, is extended to regions between the microcrystalline semiconductor film and the source and drain regions, leakage current generated in the case where the thin film transistor is turned off (i.e., the case where a negative voltage is applied to the gate electrode) can be reduced, and deterioration due to application of high voltage can be suppressed. Moreover, because the amorphous semiconductor film, the surface of which is subjected to termination by hydrogen, is formed as the buffer layer on the surface of the microcrystalline semiconductor film, the microcrystalline semiconductor film can be prevented from being oxidized, and an etching residue which is generated in the formation step of the source and drain regions can be prevented from being mixed into the microcrystalline semiconductor film.

Accordingly, the thin film transistor has high electric characteristics and excellent drain withstand voltage.

Because the end portions of the source and drain electrodes are apart from each other due to the shape where the end portions of the source and drain electrodes are not aligned with the end portions of the source and drain regions, leakage current and short circuit between the source and drain electrodes can be prevented.

Figure 3A:
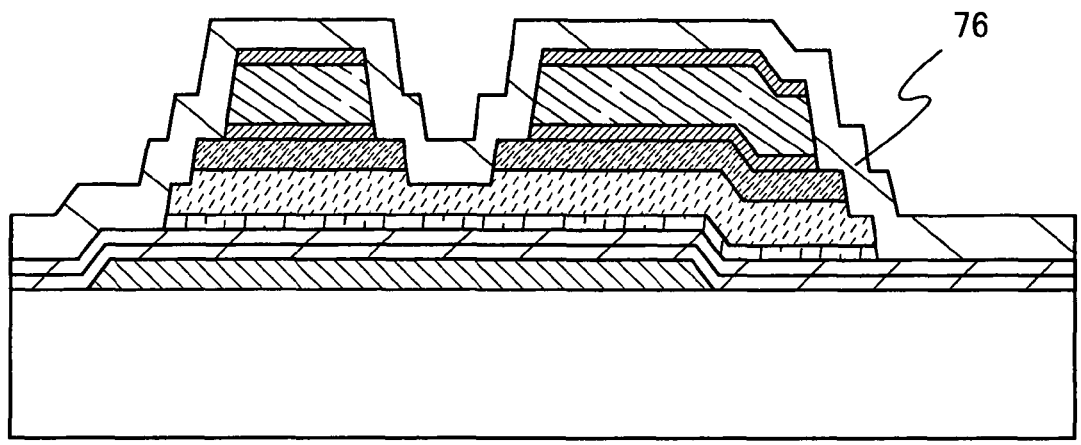
FIGS. 3A and 3B are cross-sectional views showing a method for manufacturing a light-emitting device according to an aspect of the present invention.
Figure 3B:
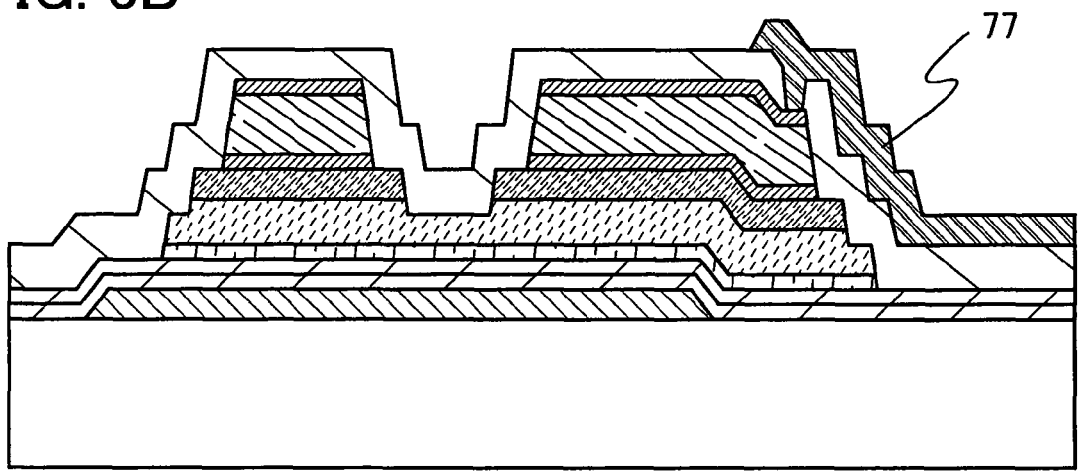

Next, as illustrated in FIG. 3A, an insulating film 76 is formed over the source and drain electrodes 92a to 92c, the source and drain regions 89, the buffer layer 88, the microcrystalline semiconductor film 87, and the gate insulating film 52b. The insulating film 76 can be formed in a similar manner to the gate insulating films 52a and 52b. Note that the insulating film 76 is provided to prevent entry of a contaminant impurity such as an organic substance, a metal substance, or moisture floating in the atmosphere and is preferably a dense film. By use of a silicon nitride film as the insulating film 76, the oxygen concentration in the buffer layer 88 can be made to be $5 \times 10^{19}$ atoms/cm$^3$ or less, preferably, $1 \times 10^{19}$ atoms/cm$^3$ or less.

Next, a contact hole is formed in the insulating film 76, and a pixel electrode 77 is formed in the contact hole to be in contact with the source or drain electrode 92c. Note that FIG. 3B corresponds to a cross-sectional view taken along a line A-B of FIG. 5C.

The pixel electrode 77 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 77 can be formed using a conductive composition containing a conductive high-molecular compound (also referred to as a conductive polymer). It is preferable that the pixel electrode formed using the conductive composition have a sheet resistance of 10000 Ω/square or less and a light transmittance of 70% or more at a wavelength of 550 nm. In addition, it is preferable that the resistivity of the conductive high-molecular compound contained in the conductive composition be 0.1 Ω·cm or less.

As the conductive high-molecular compound, a so-called π electron conjugated conductive high-molecular compound can be used. Examples include polyaniline and its derivatives, polypyrrole and its derivatives, polythiophene and its derivatives, copolymers of two or more kinds of them, and the like.

Through the above process, an element substrate which can be used for a light-emitting device can be formed.

Figure 4A:
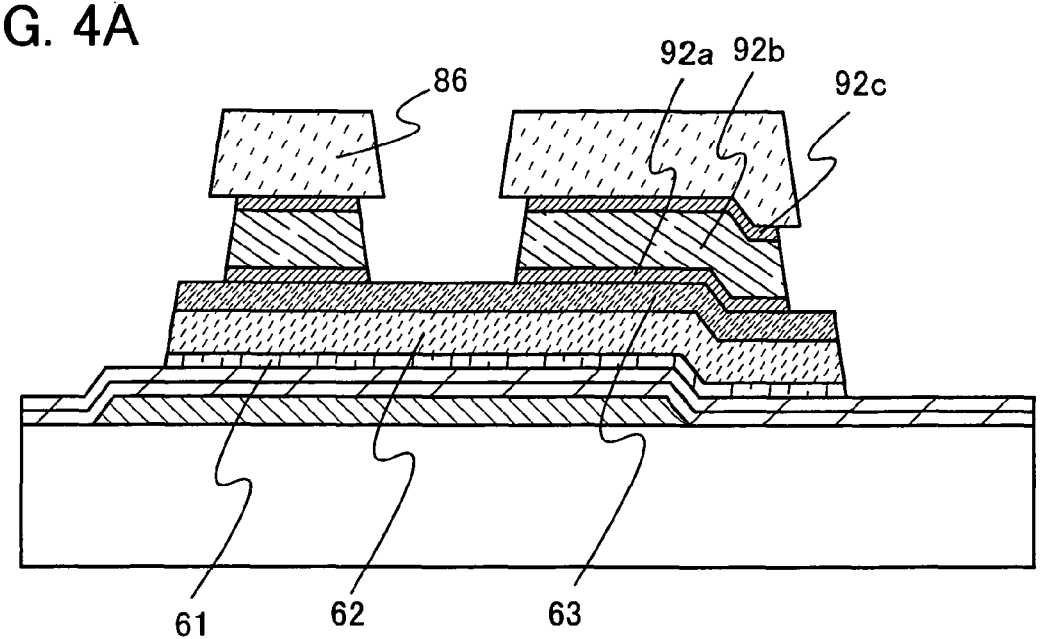
FIGS. 4A and 4B are cross-sectional views showing a method for manufacturing a light-emitting device according to an aspect of the present invention.

As illustrated in FIG. 2A, the microcrystalline semiconductor film 61, the buffer layer 62, the semiconductor film 63 to which an impurity element imparting one conductivity type is added, and the conductive films 85a to 85c are formed, and then as illustrated in FIG. 4A, the conductive films 85a to 85c are etched using the resist mask 86. In this case, the conductive films 85a to 85c are etched isotropically using the resist mask 86, so that the exposed portions and vicinity portions thereof of the conductive film 85a to 85c are selectively etched. As a result, the source and drain electrodes 92a to 92c having smaller regions than the resist mask 86 can be formed.

Figure 4B:
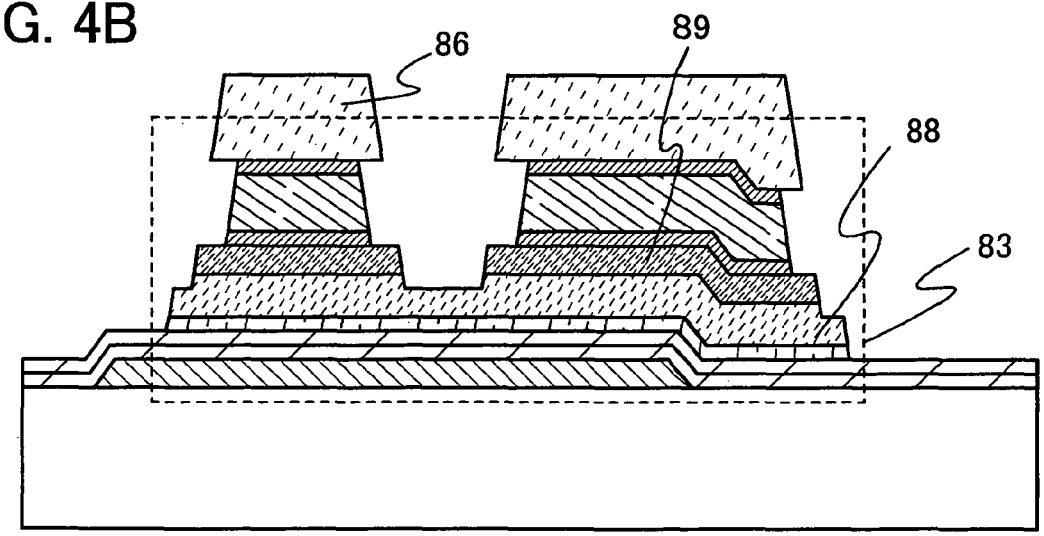

Next, as illustrated in FIG. 4B, the semiconductor film 63 to which an impurity element imparting one conductivity type is added is etched using the resist mask 86. In this case, the semiconductor film 63 to which an impurity element imparting one conductivity type is added is anisotropically etched by dry etching, so that the source and drain regions 89 having almost the same area as the resist mask 86 can be formed.

With such a shape in which the end portions of the source and drain electrodes 92a to 92c and the end portions of the source and drain regions 89 are not aligned, the end portions of the source and drain electrodes 92a to 92c are apart from each other; therefore, leakage current and short circuit between the source and drain electrodes can be prevented. Accordingly, a thin film transistor with high reliability and high withstand voltage can be manufactured.

As illustrated in FIGS. 1A and 1B, FIGS. 2A to 2C, FIGS. 3A and 3B, and FIGS. 4A and 4B, the conductive film is etched by wet etching, and the semiconductor film to which an impurity element imparting one conductivity type is added is etched by dry etching, so that a structure in which the end portions of the source and drain electrodes and the end portions of the source and drain regions are not aligned and are different be obtained with a small number of photomasks.

Next, a method for manufacturing a thin film transistor, which is different from that in the above mode, is described with reference to FIGS. 6A to 6C, FIGS. 7A to 7C, FIGS. 8A and 8B, and FIGS. 9A to 9D. Here, a structure is described, in which a source or drain electrode is separated from a source or drain wiring.

Figure 6A:
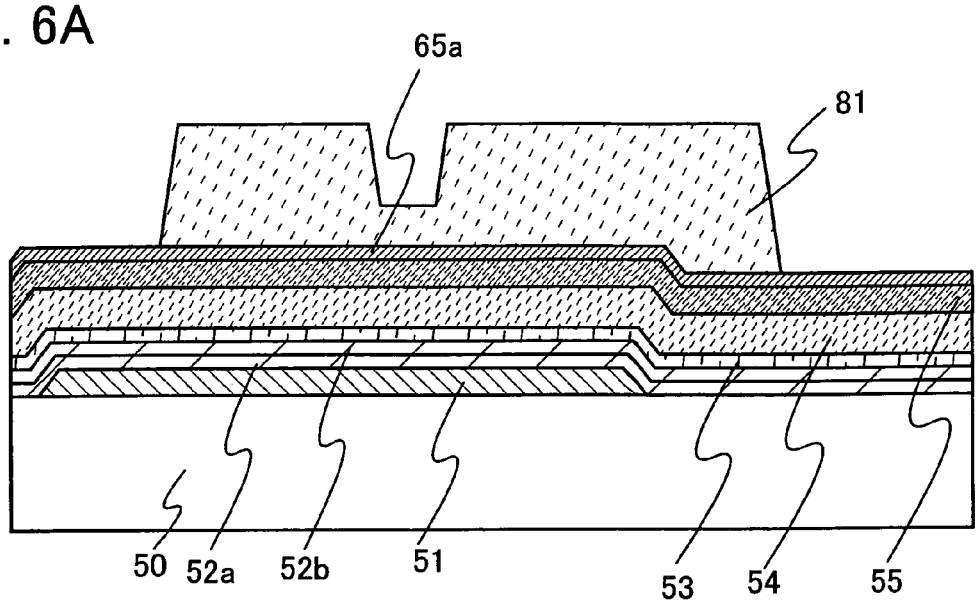
FIGS. 6A to 6C are cross-sectional views showing a method for manufacturing a light-emitting device according to an aspect of the present invention.

As illustrated in FIG. 6A, a gate electrode 51 is formed over a substrate 50. Next, over the gate electrode 51, gate insulating films 52a and 52b, a microcrystalline semiconductor film 53, a buffer layer 54, a semiconductor film 55 to which an impurity element imparting one conductivity type is added, and a conductive film 65a are sequentially formed. Then, over the conductive film 65a, resist is applied, and a resist mask 81 having regions with different thicknesses is formed using a multi-tone mask illustrated in FIG. 1A.

Figure 6B:
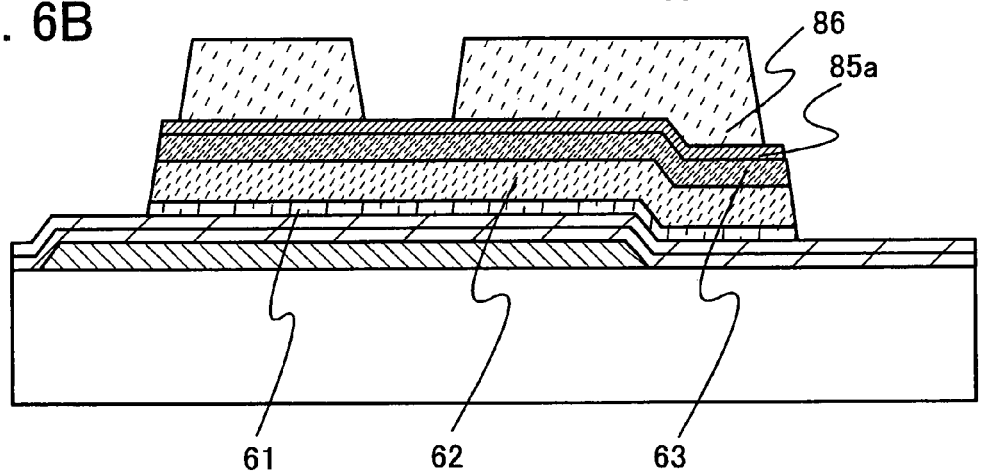

Next, the microcrystalline semiconductor film 53, the buffer layer 54, the semiconductor film 55 to which an impurity element imparting one conductivity type is added, and the conductive film 65a is etched using the resist mask 81 for separation. As a result, as illustrated in FIG. 6B, a microcrystalline semiconductor film 61, a buffer layer 62, a semiconductor film 63 to which an impurity element imparting one conductivity type is added, and a conductive film 85a can be formed. Note that FIG. 6B corresponds to a cross-sectional view taken along the line A-B of FIG. 9A (excluding the resist mask 86).

Figure 6C:
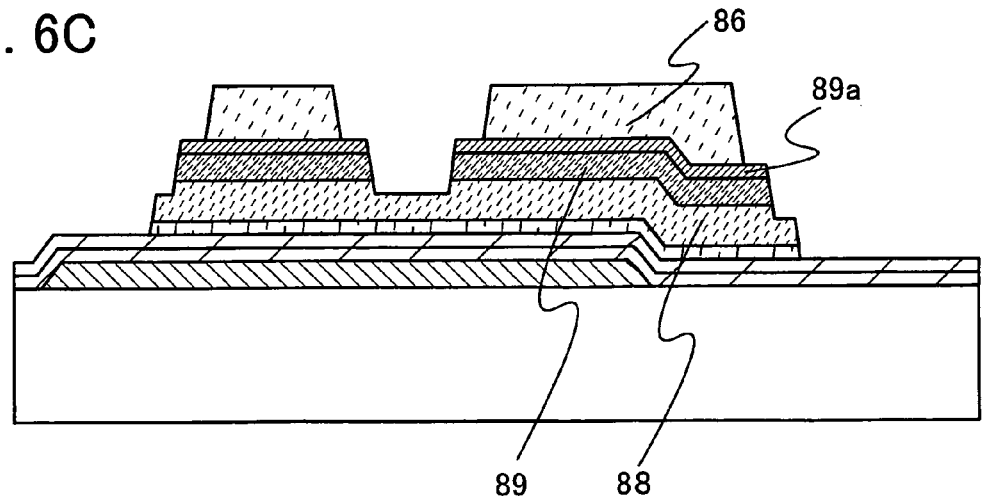

Next, ashing is conducted on the resist mask 81 to form separated resist masks 86. Then, the semiconductor film 63 to which an impurity element imparting one conductivity type is added and the conductive film 85a are etched the resist mask 86 for separation. In this case, dry etching is conducted to separate the semiconductor film to which an impurity element is added and the conductive film 85a from each other. As a result, as illustrated in FIG. 6C, a pair of conductive films 89a and a pair of source and drain regions 89 can be formed. Note that, in this etching step, a part of the buffer layer 62 is also etched. The partly etched buffer layer is referred to as a buffer layer 88. Here, because a part of the buffer layer 88 is etched using the resist mask 86 with a reduced area, the buffer layer 88 has a shape where it extends outside the conductive film 85a. As shown in this embodiment mode, the side face of the buffer layer is stepwise, and thus the coverage with an insulating film to be formed later is increased. Therefore, leakage current between a pixel electrode formed over the insulating film and a thin film transistor can be reduced.

Figure 7A:
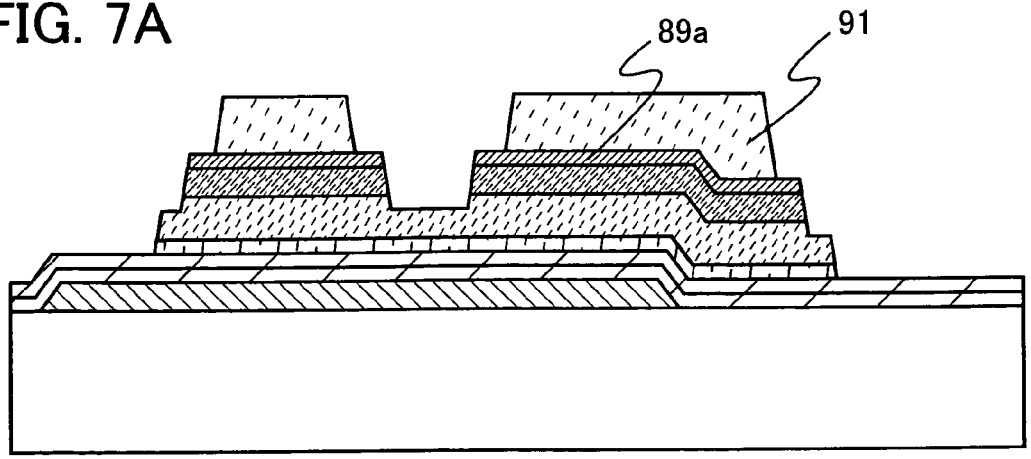
FIGS. 7A to 7C are cross-sectional views showing a method for manufacturing a light-emitting device according to an aspect of the present invention.
Figure 7B:
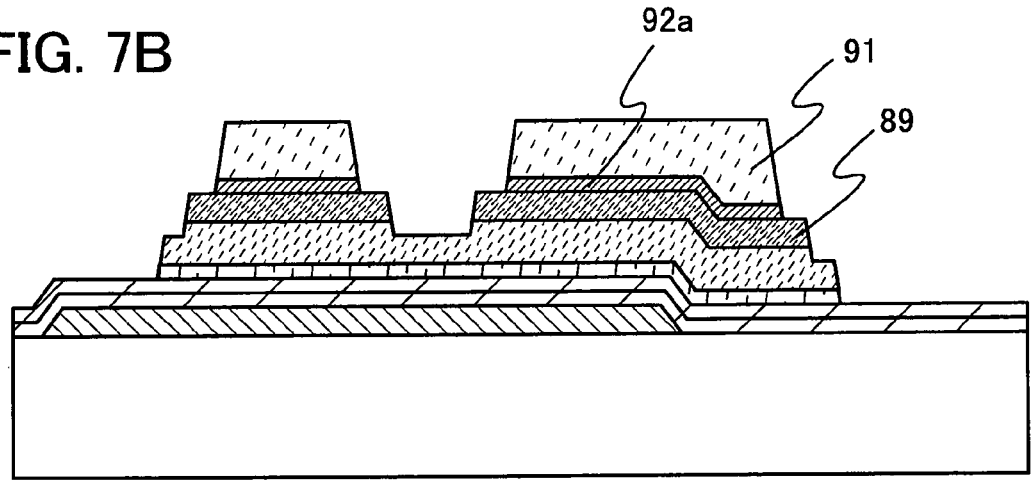

Next, ashing is conducted on the resist mask 86. As a result, as illustrated in FIG. 7A, the area of the resist mask is reduced, and the thickness thereof is reduced. By using the ashed resist mask 91, the conductive film 89a is partly etched, and as illustrated in FIG. 7B, the source and drain electrodes 92a are formed. The end portions of the source and drain electrodes 92a are not aligned with the end portions of the source and drain regions 89. In this case, an exposed portion of the conductive film 89a is anisotropically etched using the resist mask 91. After that, the resist mask 91 is removed.

Figure 9A:
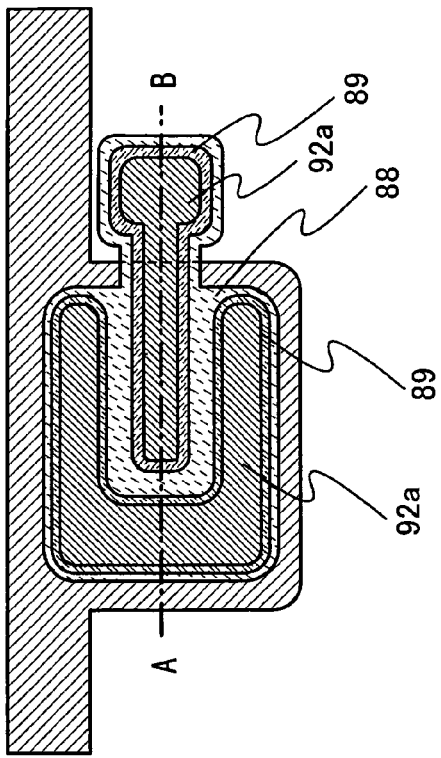
FIGS. 9A to 9D are top views showing a method for manufacturing a light-emitting device according to an aspect of the present invention.
Figure 9B:
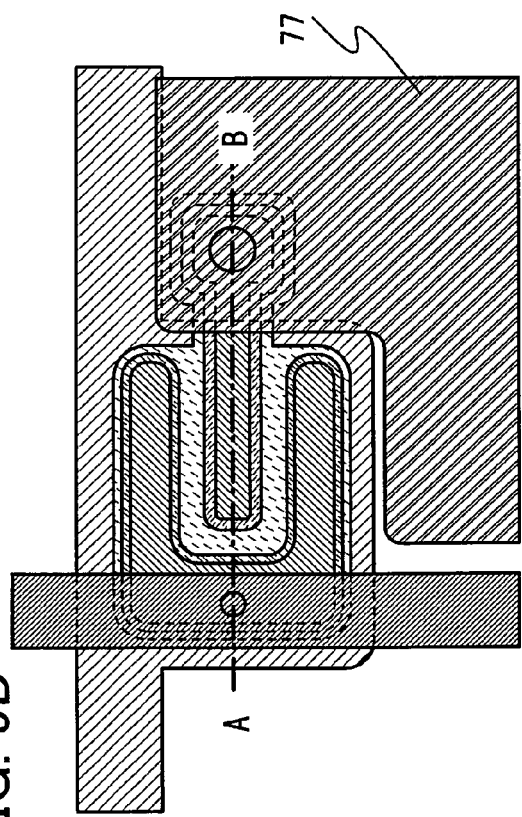
Figure 9C:
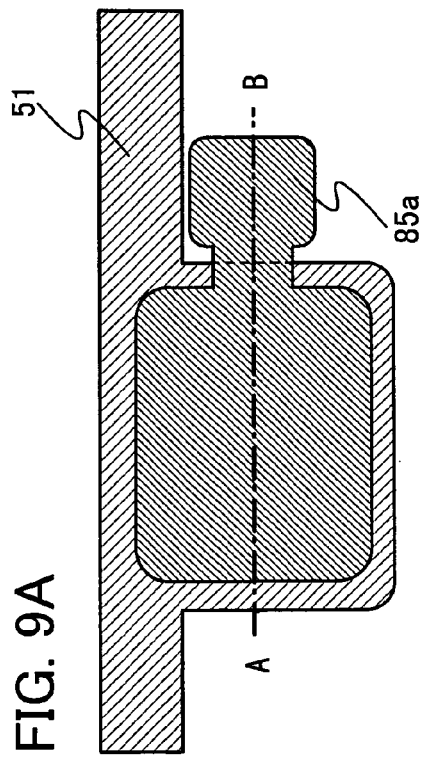
Figure 9D:
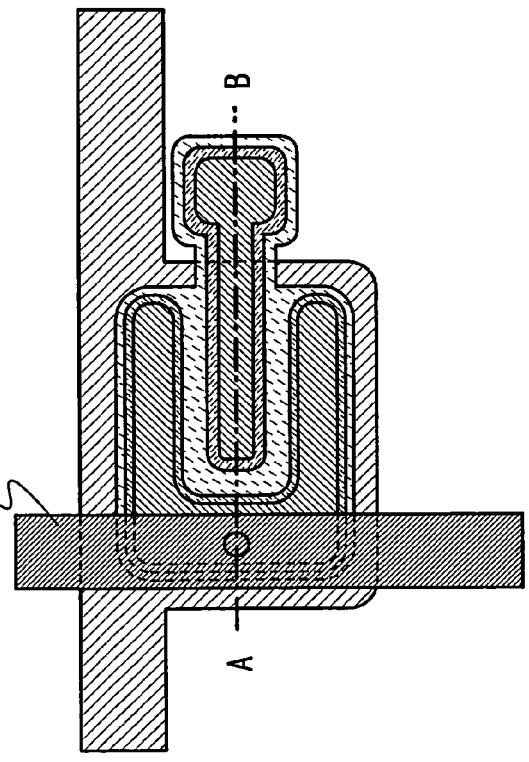

As a result, the source and drain electrodes 92a having a smaller area than the conductive film 89a are formed. Then, the resist mask 91 is removed. FIG. 7B corresponds to a cross-sectional view taken along the line A-B of FIG. 9B. As illustrated in FIG. 9B, it can be seen that the end portions of the source and drain regions 89 are located outside the end portions of the source and drain electrodes 92a. In addition, the end portions of the buffer layer 88 are located outside the source and drain electrodes 92a and the source and drain regions 89. The source and drain electrodes 92a are isolated from each other and not connected to an electrode formed in an adjacent pixel. In this case, by using the resist mask 91 formed by ashing of the resist mask 86, the source and drain electrodes 92a are formed. Alternatively, as illustrated in FIGS. 1A and 1B, FIGS. 2A to 2C, FIGS. 3A and 3B, and FIGS. 4A and 4B, wet etching using the resist mask 86 may be conducted to form the source and drain electrode 92a.

As illustrated in FIG. 7B, with a shape in which the end portions of the source and drain electrode 92a and the end portions of the source and drain region 89 are not aligned, the end portions of the source and drain electrodes 92a are apart from each other; therefore, leakage current and short circuit between the source and drain electrodes can be prevented. Accordingly, a thin film transistor with high reliability and high withstand voltage can be manufactured.

Figure 7C:
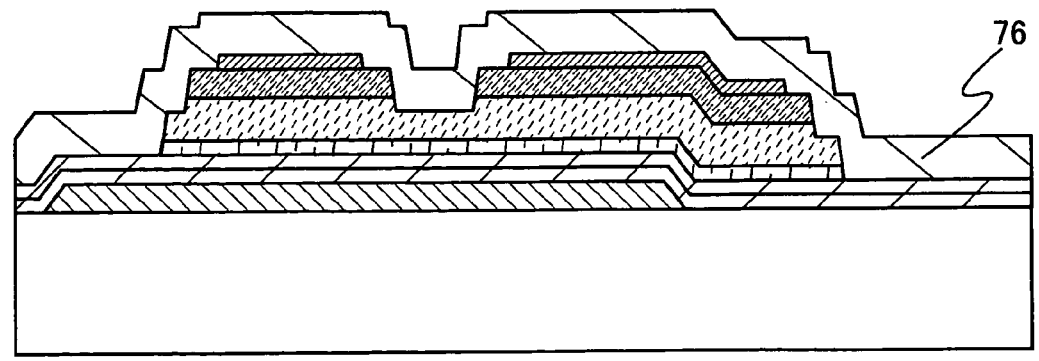

Next, as illustrated in FIG. 7C, an insulating film 76 is formed over the source and drain electrodes 92a, the source and drain regions 89, the buffer layer 88, and the gate insulating film 52b. The insulating film 76 can be formed in a similar manner to the gate insulating films 52a and 52b.

Figure 8A:
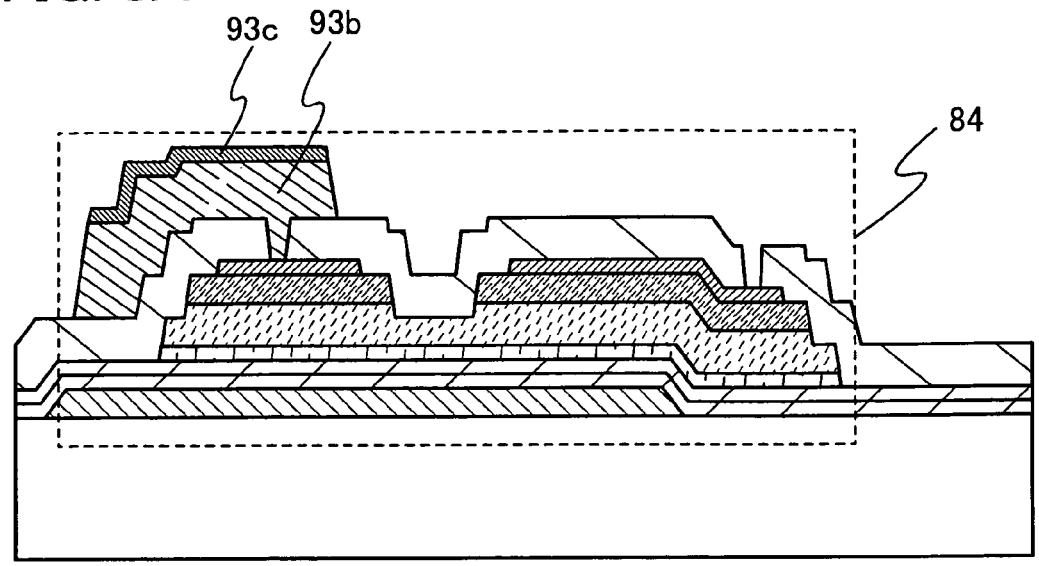
FIGS. 8A and 8B are cross-sectional views showing a method for manufacturing a light-emitting device according to an aspect of the present invention.

Next, as illustrated in FIG. 8A, a contact hole is formed in the insulating film 76; stacked wirings 93b and 93c are formed in the contact hole to be in contact with one of the source and drain electrodes 92a. Note that FIG. 8A corresponds to a cross-sectional view taken along the line A-B of FIG. 9C. The wirings 93b and 93c are wirings to be connected to a source or drain electrode formed in an adjacent pixel.

Figure 8B:
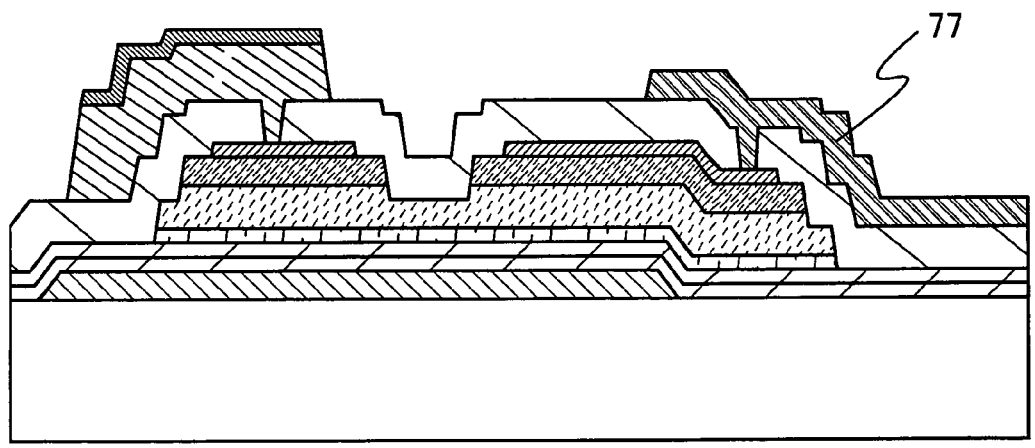

Next, a contact hole is formed in the insulating film 76, and a pixel electrode 77 is formed in the contact hole to be in contact with the other of the source and drain electrodes 92a, as illustrated in FIG. 8B. Note that FIG. 8B corresponds to a cross-sectional view taken along a line A-B of FIG. 9D.

Through the above-described process, a channel-etch thin film transistor 84 can be formed. This channel-etch thin film transistor requires a smaller number of manufacturing steps and can achieve cost reduction. By formation of a channel formation region with a microcrystalline semiconductor film, a field-effect mobility of 1 $cm^2/V \cdot sec$ to 20 $cm^2/V \cdot sec$ can be achieved. Accordingly, this thin film transistor can be used as a switching element of a pixel in a pixel portion and as an element included in a scan line (gate line) side driver circuit.

In accordance with this embodiment mode, a highly reliable thin film transistor with excellent electric characteristics can be manufactured.

Embodiment Mode 2

Next, a manufacturing process of a light-emitting device is described with reference to FIGS. 2A to 2C and FIG. 15. A light-emitting device, in which a light-emitting element utilizing electroluminescence is used, is described here. Light-emitting elements utilizing electroluminescence are classified according to whether a light-emitting material is an organic compound or an inorganic compound. In general, the former is referred to as organic EL elements and the latter as inorganic EL elements. The manufacturing process of a thin film transistor, which is shown in FIGS. 1A and 1B and FIGS. 2A to 2C is used here, but the manufacturing process shown in FIGS. 4A and 4B, FIGS. 6A to 6C, FIGS. 7A to 7C and FIGS. 8A and 8B can also be used as appropriate.

In an organic EL element, by application of a voltage to a light-emitting element, electrons and holes are separately injected from a pair of electrodes into a layer containing a light-emitting organic compound, and a current flows. Then, recombination of these carriers (the electrons and holes) causes the light-emitting organic compound to form an excited state and to emit light when it returns from the excited state to a ground state. Due to such a mechanism, such a light-emitting element is referred to as a current-excitation light-emitting element.

Inorganic EL elements are classified into a dispersion type inorganic EL element and a thin-film type inorganic EL element, depending on their element structures. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element. In addition, description is made using the channel-etch thin film transistor shown in FIG. 2C as a thin film transistor which controls driving of a light-emitting element, but a channel-protective thin film transistor can also be used appropriately.

Through the process of FIGS. 1A and 1B and FIGS. 2A to 2C, as shown in FIG. 15, thin film transistors 83 and 85 are formed over a substrate 50, and an insulating film 76 functioning as a protective film is formed over the thin film transistor 83. Note that the thin film transistor 85 is formed in a driver circuit and the thin film transistor 83 is formed in a pixel portion. Next, a planarization film 111 is formed over the insulating film 76, and a pixel electrode 112 connected to a source or drain electrode of the thin film transistor 83 is formed over the planarization film 111.

It is preferable that the planarizing film 111 be formed using an organic resin such as acrylic, polyimide, or polyamide or using siloxane.

In FIG. 15A, the thin film transistor of a pixel is an n-type transistor; thus, it is desired that the pixel electrode 112 be a cathode. In contrast, when the thin film transistor is a p-type transistor, it is desired that the pixel electrode 112 be an anode. Specifically, as a cathode, a known material with low work function, such as Ca, Al, CaF, MgAg, or AlLi, can be used.

Next, as shown in FIG. 15B, a partition 113 is formed over the planarizing film 111 and an end portion of the pixel electrode 112. The partition 113 has an opening, through which the pixel electrode 112 is exposed. The partition 113 is formed using an organic resin film, an inorganic insulating film, or organic polysiloxane. It is particularly preferable that the partition be formed using a photosensitive material to have an opening over the pixel electrode so that a sidewall of the opening is formed as a tilted surface with continuous curvature.

Next, a light-emitting layer 114 is formed in contact with the pixel electrode 112 in the opening of the partition 113. The light-emitting layer 114 may be formed using either a single layer or a stacked layer of a plurality of layers.

Then, a common electrode 115 formed from an anode material is formed to cover the light-emitting layer 114. The common electrode 115 can be formed of a light-transmitting conductive film using any of the light-transmitting conductive materials listed in Embodiment Mode 1 for the pixel electrode 77. As the common electrode 115, a titanium nitride film or a titanium film may be used in place of the above-mentioned light-transmitting conductive film. In FIG. 15B, ITO is used for the common electrode 115. In the opening of the partition 113, a light-emitting element 117 is formed by overlapping of the pixel electrode 112, the light-emitting layer 114, and the common electrode 115. After this, it is preferable that a protective film 116 be formed over the common electrode 115 and the partition 113 so that oxygen, hydrogen, moisture, carbon dioxide, or the like does not enter the light-emitting element 117. As the protective film 116, a silicon nitride film, a silicon nitride oxide film, a DLC film, or the like can be formed.

Furthermore, practically, after the steps to the step of FIG. 15B are completed, it is preferable that packaging (encapsulation) be performed using a protective film (a laminate film, an ultraviolet curable resin film, or the like), which has high airtightness and causes less degasification, in order to prevent further exposure to external air.

Next, structures of light-emitting elements are described with reference to FIGS. 16A to 16C. Here, the case where a driving TFT is of an n type is given as an example, and cross-sectional structures of pixels are described.

In a light-emitting element, it is acceptable as long as at least one of an anode and a cathode is transparent in order to extract light emission. There are light-emitting elements having the following structures: a top emission structure where a thin film transistor and a light-emitting element is formed over a substrate and light is extracted from a side opposite to the substrate; a bottom emission structure where light is extracted from the substrate side; and a dual emission structure where light is extracted from both the substrate side and the side opposite to the substrate. The pixel structure of the present invention can be applied to a light-emitting element with any of the emission structures.

A light-emitting element having a top emission structure is described with reference to FIG. 16A.

Figure 16A:
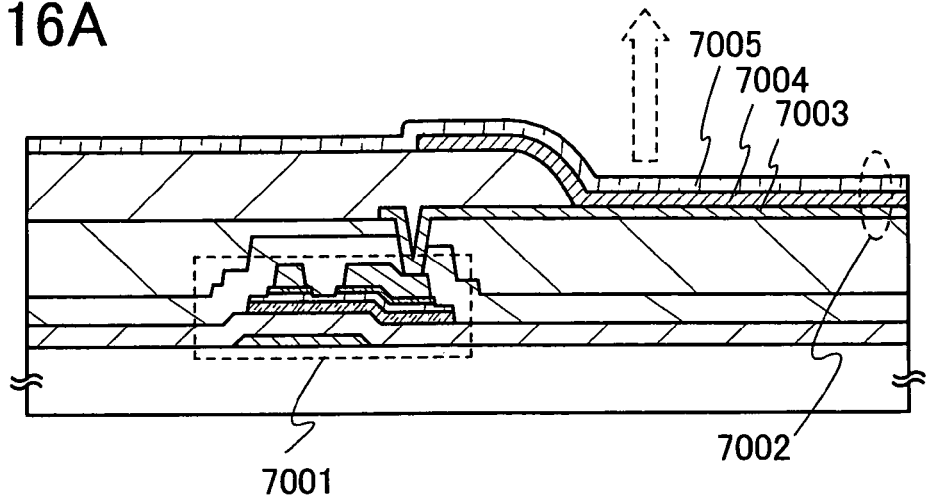
FIGS. 16A to 16C are cross-sectional views showing pixels which can be applied to light-emitting devices according to the present invention.

FIG. 16A is a cross-sectional view of a pixel in the case where a driving TFT 7001 is of an n type and light is emitted from a light-emitting element 7002 to an anode 7005 side. In FIG. 16A, a cathode 7003 of the light-emitting element 7002 is electrically connected to the driving TFT 7001, and a light-emitting layer 7004 and the anode 7005 are sequentially stacked over the cathode 7003. The cathode 7003 can be formed using any known conductive material that has a low work function and reflects light. For example, Ca, Al, Ca, MgAg, AlLi, or the like is preferable. The light-emitting layer 7004 may be formed using either a single layer or a stacked layer of a plurality of layers. In the case of using a plurality of layers, an electron injection layer, an electron transport layer, a light-emitting layer, a hole transport layer, and a hole injection layer are stacked in this order over the cathode 7003. Note that all of these layers do not necessarily need to be provided. The anode 7005 is formed using a light-transmitting conductive material that transmits light, and for example, a light-transmitting conductive film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like may be used.

A region where the light-emitting layer 7004 is sandwiched between the cathode 7003 and the anode 7005 corresponds to the light-emitting element 7002. In the case of the pixel shown in FIG. 16A, light is emitted from the light-emitting element 7002 to the anode 7005 side as indicated by an outlined arrow.

Next, a light-emitting element having a bottom emission structure is described with reference to FIG. 16B. FIG. 16B is a cross-sectional view of a pixel in the case where a driving TFT 7011 is of an n type and light is emitted from a light-emitting element 7012 to a cathode 7013 side. In FIG. 16B, the cathode 7013 of the light-emitting element 7012 is formed over a light-transmitting conductive material 7017 which is electrically connected to the driving TFT 7011, and a light-emitting layer 7014 and an anode 7015 are sequentially stacked over the cathode 7013. Note that, in the case where the anode 7015 has a light-transmitting property, a blocking film 7016 for reflecting or blocking light may be formed to cover the anode. Similar to the case of FIG. 16A, the cathode 7013 can be formed using any known conductive material that has a low work function. Note that the thickness is set so that light is transmitted therethrough (preferably, about 5 nm to 30 nm). For example, an Al film with a thickness of 20 nm can be used as the cathode 7013. Similar to the case of FIG. 16A, the light-emitting layer 7014 may be formed using either a single layer or a stacked layer of a plurality of layers. Although the anode 7015 does not need to be able to transmit light, similar to FIG. 16A, it can be formed using a light-transmitting conductive material. The blocking film 7016 can be formed using, for example, a metal which reflects light, or the like; however, the present invention is not limited to a metal film. For example, a resin to which black colorant is added can also be used.

A region where the light-emitting layer 7014 is sandwiched between the cathode 7013 and the anode 7015 corresponds to the light-emitting element 7012. In the case of the pixel shown in FIG. 16B, light is emitted from the light-emitting element 7012 to the cathode 7013 side as indicated by an outlined arrow.

Next, a light-emitting element having a dual emission structure is described with reference to FIG. 16C. In FIG. 16C, a cathode 7023 of a light-emitting element 7022 is formed over a light-transmitting conductive material 7027 which is electrically connected to a driving TFT 7021, and a light-emitting layer 7024 and an anode 7025 are sequentially stacked over the cathode 7023. Similar to the case of FIG. 16A, the cathode 7023 can be formed using any known conductive material that has a low work function. Note that the thickness is set so that light is transmitted therethrough. For example, an Al film with a thickness of 20 nm can be used as the cathode 7023. Similar to FIG. 16A, the light-emitting layer 7024 may be formed using either a single layer or a stacked layer of a plurality of layers. Similar to FIG. 16A, the anode 7025 can be formed using a light-transmitting conductive material which transmits light.

A region where the cathode 7023, the light-emitting layer 7024, and the anode 7025 overlap with each other corresponds to the light-emitting element 7022. In the case of the pixel shown in FIG. 16C, light is emitted from the light-emitting element 7022 to both the anode 7025 side and the cathode 7023 side as indicated by outlined arrows.

Note that, although an organic EL element is described here as a light-emitting element, an inorganic EL element can also be provided as a light-emitting element.

Note that, in this embodiment mode, the example is described in which a thin film transistor (a driving TFT) which controls the driving of a light-emitting element is electrically connected to the light-emitting element, but a structure may be employed in which a current control TFT is connected between the driving TFT and the light-emitting element.

Figure 16B:
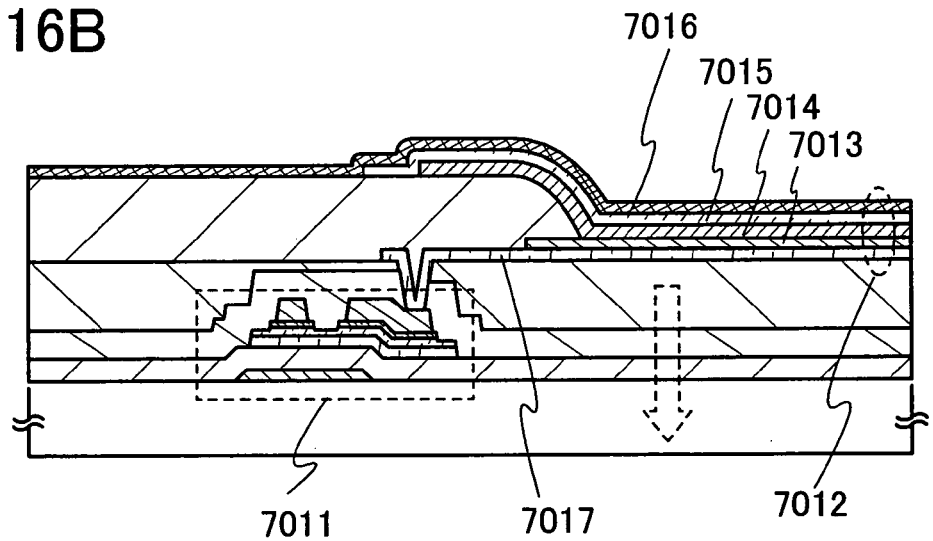
Figure 16C:
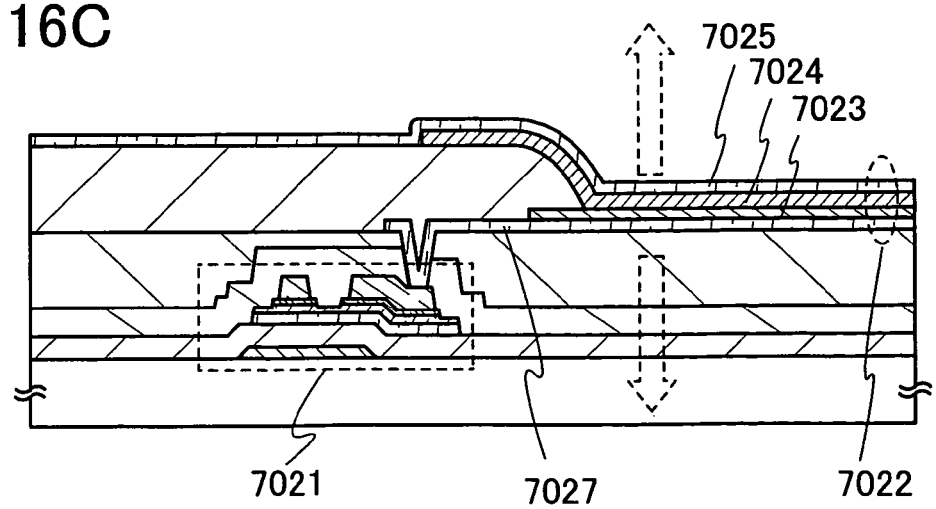

Note that the light-emitting device described in this embodiment mode is not limited to the structures shown in FIGS. 16A to 16C and can be modified in various ways based on the technical idea of the present invention.

Through the above-described process, a light-emitting device can be manufactured. Since a thin film transistor with small off current and highly-reliable electric properties is used in the light-emitting device of this embodiment mode, the light-emitting device has high contrast and high visibility. Further, since a thin film transistor including a microcrystalline silicon film which is formed without any laser crystallization step is used, a light-emitting device with high visibility can be formed with high mass productivity.

Embodiment Mode 3

Next, a structure of a display panel, which is one mode of a light-emitting device of the present invention, is described below.

Figure 12A:
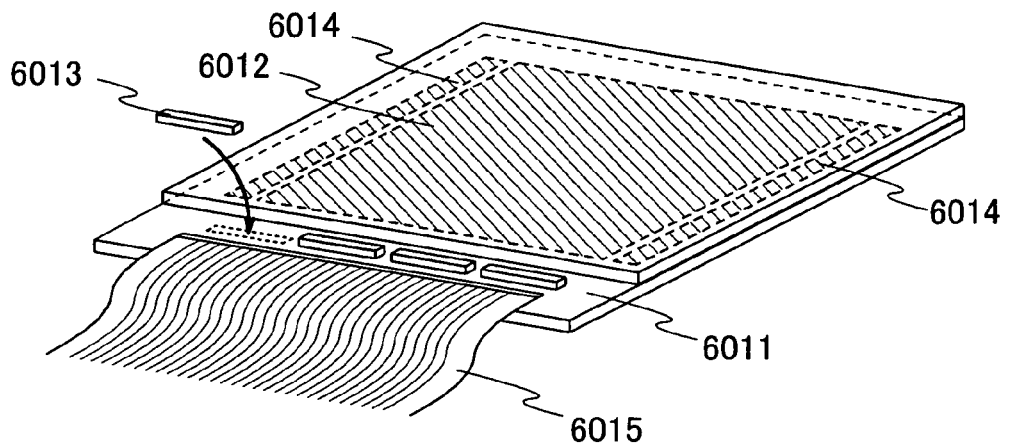
FIGS. 12A to 12C are perspective views showing light-emitting display panels according to an aspect of the present invention.

FIG. 12A shows a mode of a light-emitting panel in which a signal line driver circuit 6013 which is separately formed is connected to a pixel portion 6012 formed over a substrate 6011. The pixel portion 6012 and a scan line driver circuit 6014 are each formed using a thin film transistor in which a microcrystalline semiconductor film is used for a channel formation region. When the signal line driver circuit is formed using a transistor which has higher field-effect mobility compared with the thin film transistor in which the microcrystalline semiconductor film is used for the channel formation region, an operation of the signal line driver circuit which demands higher driving frequency than that of the scan line driver circuit can be stabilized. Note that the signal line driver circuit 6013 may be formed using a transistor in which a single crystalline semiconductor is used for a channel formation region, a thin film transistor in which a polycrystalline semiconductor is used for a channel formation region, or a transistor using SOI. The pixel portion 6012, the signal line driver circuit 6013, and the scan line driver circuit 6014 are each supplied with a potential of a power supply, a variety of signals, and the like via an FPC 6015.

Note that both the signal line driver circuit and the scan line driver circuit may be formed over the same substrate as the pixel portion.

Figure 12B:
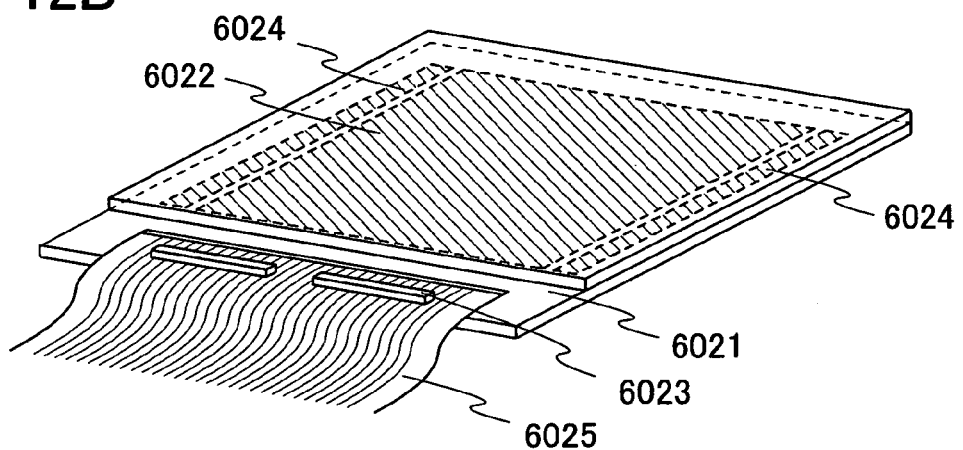

When a driver circuit is separately formed, a substrate over which the driver circuit is formed is not necessarily attached to a substrate over which a pixel portion is formed, and may be attached over an FPC, for example. FIG. 12B shows a mode of a display panel in which a signal line driver circuit 6023 is separately formed and is connected to a pixel portion 6022 formed over a substrate 6021. The pixel portion 6022 and the scan line driver circuit 6024 are each formed using a thin film transistor in which a microcrystalline semiconductor film is used for a channel formation region. The signal line driver circuit 6023 is connected to the pixel portion 6022 via an FPC 6025. The pixel portion 6022, the signal line driver circuit 6023, and the scan line driver circuit 6024 are each supplied with a potential of a power supply, a variety of signals, and the like via the FPC 6025.

Figure 12C:
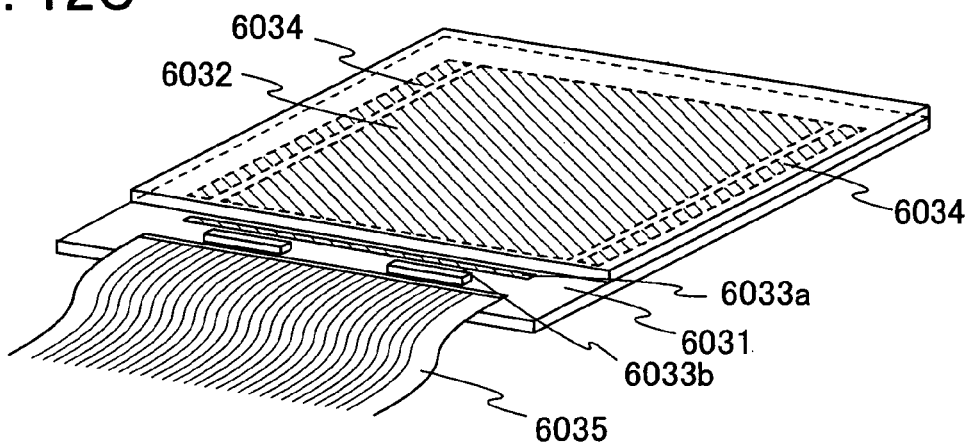

Alternatively, only part of a signal line driver circuit or part of a scan line driver circuit may be formed over the same substrate as a pixel portion by using a thin film transistor in which a microcrystalline semiconductor film is used for a channel formation region, and the other part of the driver circuit may be separately formed and electrically connected to the pixel portion. FIG. 12C shows a mode of a panel of a light-emitting device in which an analog switch 6033a included in a signal line driver circuit is formed over a substrate 6031, which is the same substrate as a pixel portion 6032 and a scan line driver circuit 6034, and a shift register 6033b included in the signal line driver circuit is separately formed over a different substrate and attached to the substrate 6031. The pixel portion 6032 and the scan line driver circuit 6034 are each formed using a thin film transistor in which a microcrystalline semiconductor film is used for a channel formation region. The shift register 6033b included in the signal line driver circuit is connected to the pixel portion 6032 via an FPC 6035. The pixel portion 6032, the signal line driver circuit, and the scan line driver circuit 6034 are each supplied with a potential of a power supply, a variety of signals, and the like via the FPC 6035.

As shown in FIGS. 12A to 12C, in light-emitting devices of the present invention, all or a part of the driver circuit can be formed over the same substrate as the pixel portion, using the thin film transistor in which the microcrystalline semiconductor film is used for the channel formation region.

Note that a connection method of a substrate which is separately formed is not particularly limited, and a known COG method, wire bonding method, TAB method, or the like can be used. Further, a connection position is not limited to the positions shown in FIGS. 12A to 12C as long as electrical connection is possible. Moreover, a controller, a CPU, a memory, or the like may be formed separately and connected.

Note that a signal line driver circuit used in the present invention is not limited to a mode including only a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Figure 18:
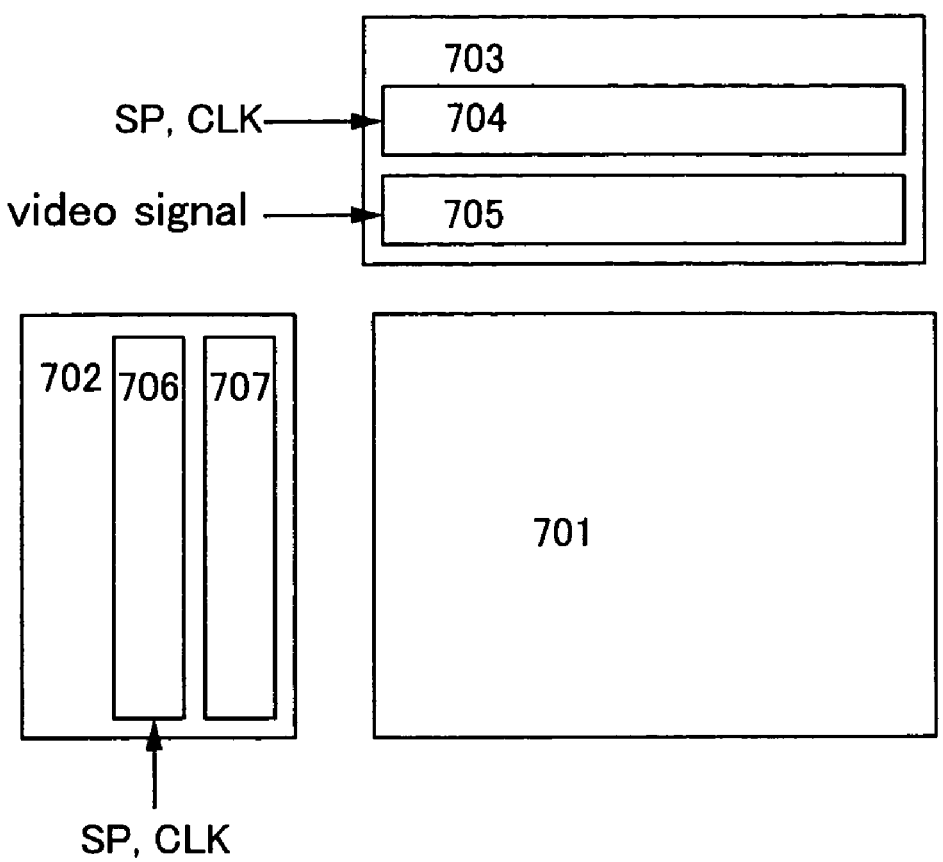
FIG. 18 is a block diagram showing a structure of a light-emitting device according to an aspect of the present invention.

FIG. 18 is a block diagram of a light-emitting device of the present invention. The light-emitting device shown in FIG. 18 includes a pixel portion 700 including a plurality of pixels each provided with a light-emitting element, a scan line driver circuit 702 which selects each pixel, and a signal line driver circuit 703 which controls input of a video signal to a selected pixel.

In FIG. 18, the signal line driver circuit 703 includes a shift register 704 and an analog switch 705. A clock signal (CLK) and a start pulse signal (SP) are input to the shift register 704. When the clock signal (CLK) and the start pulse signal (SP) are input, a timing signal is generated in the shift register 704 and input to the analog switch 705.

A video signal is supplied to the analog switch 705. The analog switch 705 samples the video signal in accordance with the timing signal and supplies the resulting signal to a signal line of the next stage.

Next, a structure of the scan line driver circuit 702 is described. The scan line driver circuit 702 includes a shift register 706 and a buffer 707. The scan line driver circuit 702 may also include a level shifter in some cases. In the scan line driver circuit 702, when the clock signal (CLK) and the start pulse signal (SP) are input to the shift register 706, a selection signal is generated. The generated selection signal is buffered and amplified by the buffer 707, and the resulting signal is supplied to a corresponding scan line. Gates of transistors in pixels of one line are connected to the scan line. Further, since the transistors in the pixels of one line should be turned on at the same time, a buffer through which large current can flow is used as the buffer 707.

In a full color light-emitting device, when video signals corresponding to R (red), G (green), or B (blue) are sequentially sampled and supplied to a corresponding signal line, the number of terminals for connecting the shift register 704 and the analog switch 705 corresponds to approximately ⅓ of the number of terminals for connecting the analog switch 705 and the signal line in the pixel portion 700. Accordingly, when the analog switch 705 and the pixel portion 700 are formed over the same substrate, the number of terminals used for connecting substrates which are separately formed can be suppressed compared with the case where the analog switch 705 and the pixel portion 700 are formed over different substrates; thus, occurrence probability of defective connection can be suppressed, and yield can be increased.

Note that although the scan line driver circuit 702 shown in FIG. 18 includes the shift register 706 and the buffer 707, the scan line driver circuit 702 may include the shift register 706.

Note that structures of the signal line driver circuit and the scan line driver circuit are not limited to the structures shown in FIG. 18, which are merely one mode of the light-emitting device of the present invention.

Figure 19:
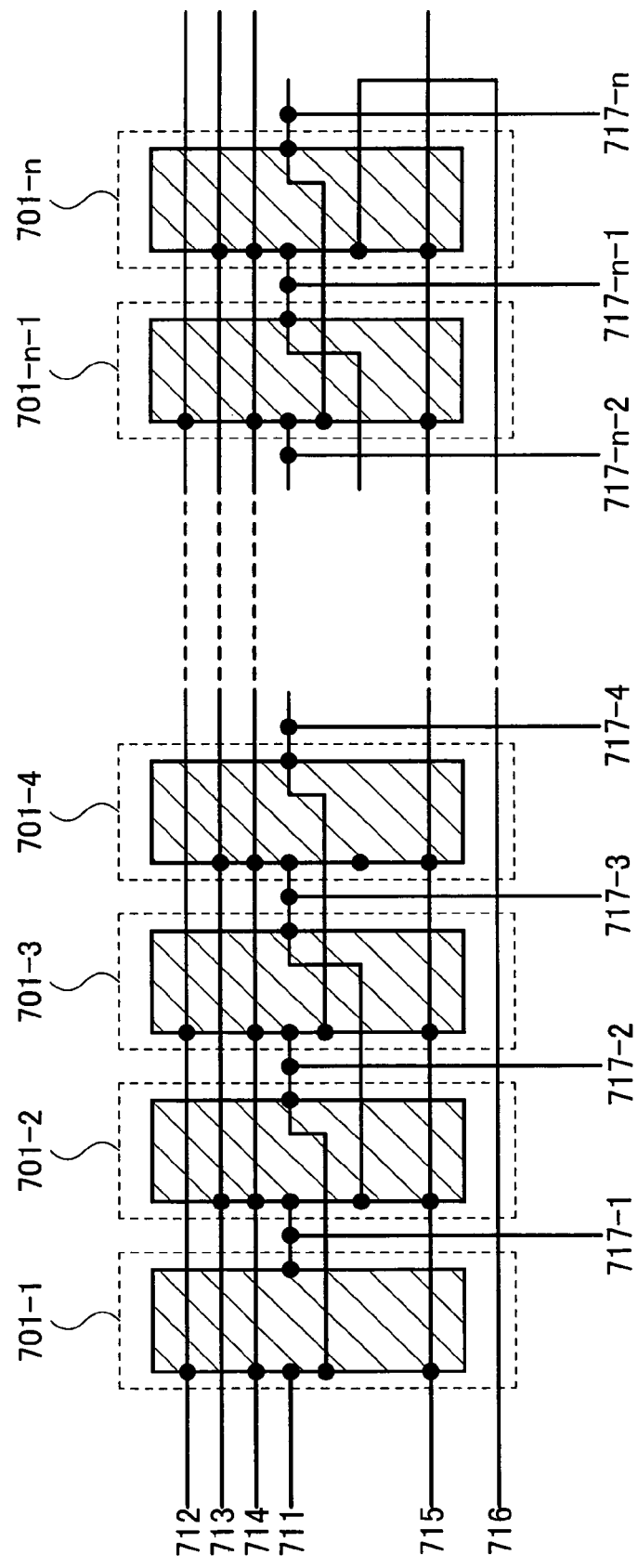
FIG. 19 is an equivalent circuit diagram showing a structure of a driver circuit of a light-emitting device according to an aspect of the present invention.

Next, one mode of a shift register including thin film transistors in which microcrystalline semiconductor films with the same polarity are used for channel formation regions is described with reference to FIGS. 31 and 32. FIG. 19 illustrates a structure of a shift register in this embodiment mode. The shift register shown in FIG. 19 includes a plurality of flip-flops (flip-flops 701-1 to 701-n). The shift register is operated by input of a first clock signal, a second clock signal, a start pulse signal, and a reset signal.

Connection relations of the shift register in FIG. 19 are described. In the i-th stage flip-flop 701-i (one of the flip-flops 701-1 to 701-n) in the shift register of FIG. 19, a first wiring 501 shown in FIG. 20 is connected to a seventh wiring 717-(i−1); a second wiring 502 shown in FIG. 20 is connected to a seventh wiring 717-(i+1); a third wiring 503 shown in FIG. 20 is connected to a seventh wiring 717-i; and a sixth wiring 506 shown in FIG. 20 is connected to a fifth wiring 715.

Figure 20:
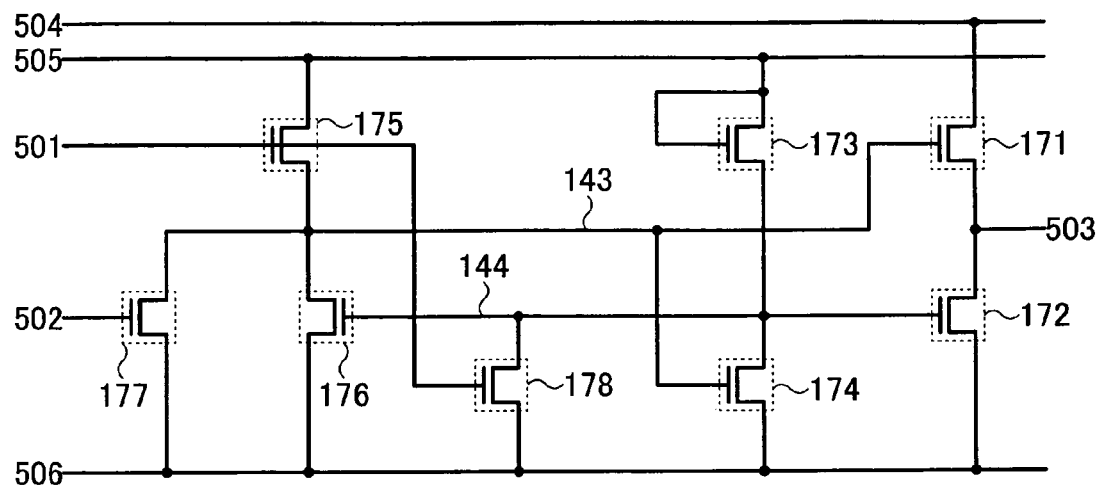
FIG. 20 is an equivalent circuit diagram showing a structure of a driver circuit of a light-emitting device according to an aspect of the present invention.

Further, a fourth wiring 504 shown in FIG. 20 is connected to a second wiring 712 in flip-flops of odd-numbered stages, and is connected to a third wiring 713 in flip-flops of even-numbered stages. A fifth wiring 505 shown in FIG. 20 is connected to a fourth wiring 714.

Note that the first wiring 501 of the first stage flip-flop 701-1 shown in FIG. 20 is connected to a first wiring 711. Moreover, the second wiring 502 of the n-th stage flip-flop 701-n shown in FIG. 20 is connected to a sixth wiring 716.

Note that the first wiring 711, the second wiring 712, the third wiring 713, and the sixth wiring 716 may be referred to as a first signal line, a second signal line, a third signal line, and a fourth signal line, respectively. The fourth wiring 714 and the fifth wiring 715 may be referred to as a first power supply line and a second power supply line, respectively.

Next, FIG. 20 shows details of the flip-flop shown in FIG. 19. A flip-flop shown in FIG. 20 includes a first thin film transistor 171, a second thin film transistor 172, a third thin film transistor 173, a fourth thin film transistor 174, a fifth thin film transistor 175, a sixth thin film transistor 176, a seventh thin film transistor 177, and an eighth thin film transistor 178. In this embodiment mode, each of the first thin film transistor 171, the second thin film transistor 172, the third thin film transistor 173, the fourth thin film transistor 174, the fifth thin film transistor 175, the sixth thin film transistor 176, the seventh thin film transistor 177, and the eighth thin film transistor 178 is an n-channel transistor and is turned on when the gate-source voltage ($V_{gs}$) exceeds the threshold voltage ($V_{th}$).

Next, connection structures of the flip-flop shown in FIG. 20 are described below.

A first electrode (one of a source electrode and a drain electrode) of the first thin film transistor 171 is connected to the fourth wiring 504. A second electrode (the other of the source electrode and the drain electrode) of the first thin film transistor 171 is connected to the third wiring 503.

A first electrode of the second thin film transistor 172 is connected to the sixth wiring 506. A second electrode of the second thin film transistor 172 is connected to the third wiring 503.

A first electrode of the third thin film transistor 173 is connected to the fifth wiring 505. A second electrode of the third thin film transistor 173 is connected to a gate electrode of the second thin film transistor 172. A gate electrode of the third thin film transistor 173 is connected to the fifth wiring 505.

A first electrode of the fourth thin film transistor 174 is connected to the sixth wiring 506. A second electrode of the fourth thin film transistor 174 is connected to the gate electrode of the second thin film transistor 172. A gate electrode of the fourth thin film transistor 174 is connected to a gate electrode of the first thin film transistor 171.

A first electrode of the fifth thin film transistor 175 is connected to the fifth wiring 505. A second electrode of the fifth thin film transistor 175 is connected to the gate electrode of the first thin film transistor 171. A gate electrode of the fifth thin film transistor 175 is connected to the first wiring 501.

A first electrode of the sixth thin film transistor 176 is connected to the sixth wiring 506. A second electrode of the sixth thin film transistor 176 is connected to the gate electrode of the first thin film transistor 171. A gate electrode of the sixth thin film transistor 176 is connected to the gate electrode of the second thin film transistor 172.

A first electrode of the seventh thin film transistor 177 is connected to the sixth wiring 506. A second electrode of the seventh thin film transistor 177 is connected to the gate electrode of the first thin film transistor 171. A gate electrode of the seventh thin film transistor 177 is connected to the second wiring 502. A first electrode of the eighth thin film transistor 178 is connected to the sixth wiring 506. A second electrode of the eighth thin film transistor 178 is connected to the gate electrode of the second thin film transistor 172. A gate electrode of the eighth thin film transistor 178 is connected to the first wiring 501.

Note that the point at which the gate electrode of the first thin film transistor 171, the gate electrode of the fourth thin film transistor 174, the second electrode of the fifth thin film transistor 175, the second electrode of the sixth thin film transistor 176, and the second electrode of the seventh thin film transistor 177 are connected is referred to as a node 143. The point at which the gate electrode of the second thin film transistor 172, the second electrode of the third thin film transistor 173, the second electrode of the fourth thin film transistor 174, the gate electrode of the sixth thin film transistor 176, and the second electrode of the eighth thin film transistor 178 are connected is referred to as a node 144.

Note that the first wiring 501, the second wiring 502, the third wiring 503, and the fourth wiring 504 may be referred to as a first signal line, a second signal line, a third signal line, and a fourth signal line, respectively. The fifth wiring 505 and the sixth wiring 506 may be referred to as a first power supply line and a second power supply line, respectively.

Figure 21:
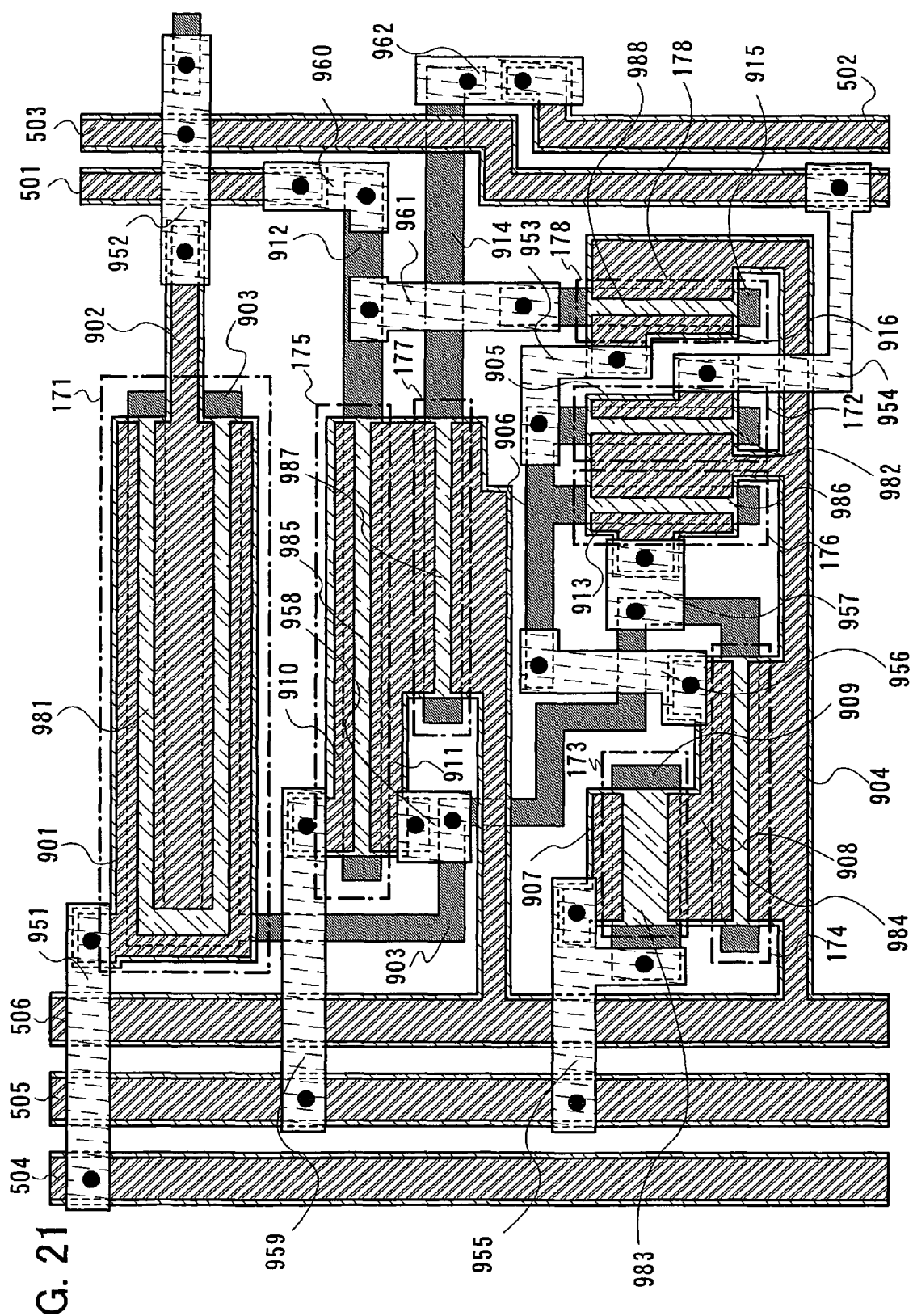
FIG. 21 is a top view showing a layout of a driver circuit of a light-emitting device according to an aspect of the present invention.

FIG. 21 shows an example of a top plan view of the flip-flop shown in FIG. 20.

A conductive film 901 includes a portion functioning as the first electrode of the first thin film transistor 171, and is connected to the fourth wiring 504 through a wiring 951 which is formed at the same time as a pixel electrode.

A conductive film 902 includes a portion functioning as the second electrode of the first thin film transistor 171, and is connected to the third wiring 503 through a wiring 952 which is formed at the same time as the pixel electrode.

A conductive film 903 includes portions functioning as the gate electrode of the first thin film transistor 171 and the gate electrode of the fourth thin film transistor 174.

A conductive film 904 includes portions functioning as the first electrode of the second thin film transistor 172, the first electrode of the sixth thin film transistor 176, the first electrode of the fourth thin film transistor 174, and the first electrode of the eighth thin film transistor 178, and the conductive film 904 is connected to the sixth wiring 506.

A conductive film 905 includes a portion functioning as the second electrode of the second thin film transistor 172, and is connected to the third wiring 503 through a wiring 954 which is formed at the same time as the pixel electrode.

A conductive film 906 includes portions functioning as the gate electrode of the second thin film transistor 172 and the gate electrode of the sixth thin film transistor 176.

A conductive film 907 includes a portion functioning as the first electrode of the third thin film transistor 173, and is connected to the fifth wiring 505 through a wiring 955.

A conductive film 908 includes portions functioning as the second electrode of the third thin film transistor 173 and the second electrode of the fourth thin film transistor 174, and is connected to the conductive film 906 through a wiring 956 which is formed at the same time as the pixel electrode.

A conductive film 909 includes a portion functioning as the gate electrode of the third thin film transistor 173, and is connected to the fifth wiring 505 through the wiring 955.

A conductive film 910 includes a portion functioning as the first electrode of the fifth thin film transistor 175, and is connected to the fifth wiring 505 through a wiring 959 which is formed at the same time as the pixel electrode.

A conductive film 911 includes portions functioning as the second electrode of the fifth thin film transistor 175 and the second electrode of the seventh thin film transistor 177, and is connected to the conductive film 903 through a wiring 958 which is formed at the same time as the pixel electrode.

A conductive film 912 includes a portion functioning as the gate electrode of the fifth thin film transistor 175, and is connected to the first wiring 501 through a wiring 960 which is formed at the same time as the pixel electrode.

A conductive film 913 includes a portion functioning as the second electrode of the sixth thin film transistor 176, and is connected to the conductive film 903 through a wiring 957 which is formed at the same time as the pixel electrode.

A conductive film 914 includes a portion functioning as the gate electrode of the seventh thin film transistor 177, and is connected to the second wiring 502 through a wiring 962 which is formed at the same time as the pixel electrode.

A conductive film 915 includes a portion functioning as the gate electrode of the eighth thin film transistor 178, and is connected to the conductive film 912 through a wiring 961 which is formed at the same time as the pixel electrode.

A conductive film 916 includes a portion functioning as the second electrode of the eighth thin film transistor 178, and is connected to the conductive film 906 through a wiring 953 which is formed at the same time as the pixel electrode.

Note that parts of microcrystalline semiconductor films 981 to 988 function as channel formation regions of the first to eighth thin film transistors, respectively.

When the circuits as shown in FIGS. 19 and 20 include a transistor in which a microcrystalline semiconductor is used for a channel formation region, the layout area can be reduced. Accordingly, a frame of the light-emitting device can be reduced. For example, in comparison of a transistor in which a microcrystalline semiconductor film is used for a channel formation region with a transistor in which an amorphous semiconductor film is used for a channel formation region, the field-effect mobility of the transistor in which a microcrystalline semiconductor film is used for a channel formation region is higher; thus, the channel width of the transistor can be reduced. As a result, a frame of the light-emitting device can be narrowed. As an example, the channel width of the second thin film transistor 172 is preferably 3000 µm or less, and more preferably 2000 µm or less.

Note that in the second thin film transistor 172 of FIG. 20, a period during which a low-level signal is output to the third wiring 503 is long. In this period, the second thin film transistor 172 is kept on. Therefore, extreme stress is applied to the second thin film transistor 172, and characteristics of the transistor are likely to deteriorate. When the characteristics of the transistor deteriorate, the threshold voltage is gradually increased. Thus, a current value is decreased. In order to supply enough current even when the transistor deteriorates, the channel width of the second thin film transistor 172 is preferably large. Alternatively, compensation is preferably done so that a circuit operation is not affected even when the transistor deteriorates. For example, it is preferable that a transistor be provided in parallel with the second thin film transistor 172, and the transistor and the second thin film transistor 172 be made to be alternately turned on, so that influence by deterioration is small.

In comparison of a transistor in which a microcrystalline semiconductor film is used for a channel formation region with a transistor in which an amorphous semiconductor film is used for a channel formation region, the transistor in which a microcrystalline semiconductor film is used for a channel formation region is harder to deteriorate. Accordingly, when the microcrystalline semiconductor film is used for the channel formation region, the channel width of the transistor can be reduced. Alternatively, the transistor can be normally operated without any circuit for compensation for deterioration. Accordingly, the layout area can be reduced.

Figure 17A:
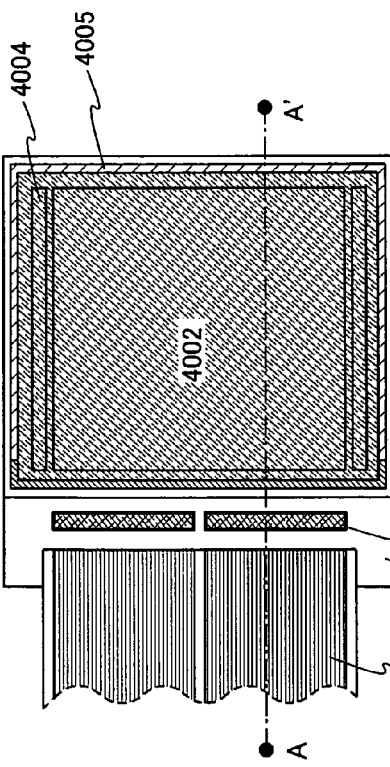
FIGS. 17A and 17B are a top view and a cross-sectional view showing a light-emitting display panel according to an aspect of the present invention, respectively.
Figure 17B:
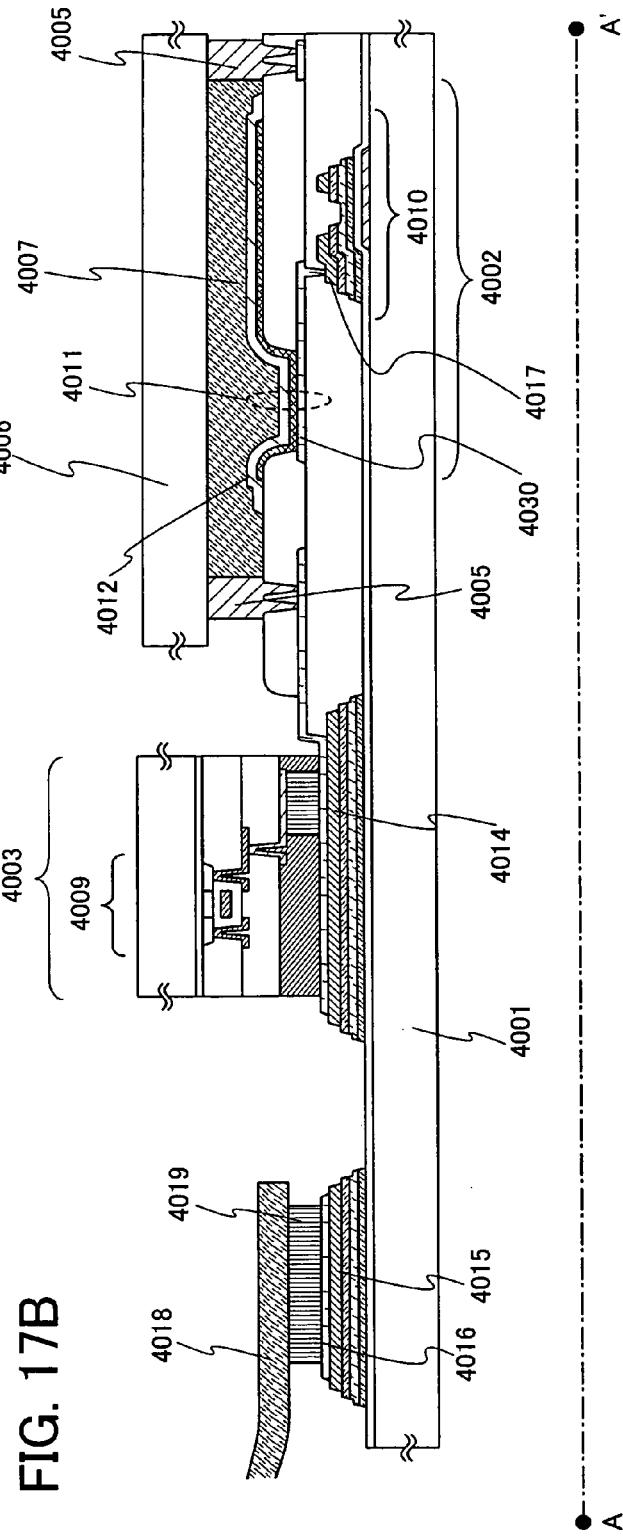

Next, the appearance and a cross section of a light-emitting display panel which is one mode of the light-emitting device of the present invention are described with reference to FIGS. 17A and 17B. FIG. 17A is a top plan view of a panel. In the panel, a thin film transistor using a microcrystalline semiconductor film for its channel formation region and a light-emitting element which are formed over a first substrate 4001 are sealed between the first substrate 4001 and a second substrate 4006 by a sealing material 4005. FIG. 17B is a cross-sectional view along a line A-A' in FIG. 17A.

The sealing material 4005 is provided so as to surround a pixel portion 4002 and a scan line driver circuit 4004 which are provided over the first substrate 4001. The second substrate 4006 is provided over the pixel portion 4002 and the scan line driver circuit 4004. Accordingly, the pixel portion 4002 and the scan line driver circuit 4004 are sealed together with a filler 4007 by the first substrate 4001, the sealing material 4005, and the second substrate 4006. Further, a signal line driver circuit 4003 formed using a polycrystalline semiconductor film over a different substrate is mounted on a region over the first substrate 4001, which is different from the region surrounded by the sealing material 4005. Note that in this embodiment mode, an example is described in which the signal line driver circuit including a thin film transistor in which a polycrystalline semiconductor film is used for a channel formation region is attached to the first substrate 4001; however, a signal line driver circuit may be formed using a transistor in which a single crystalline semiconductor is used for a channel formation region and attached to a substrate. FIGS. 17A and 17B illustrate a thin film transistor 4009 formed using a polycrystalline semiconductor film, which is included in the signal line driver circuit 4003.

Each of the pixel portion 4002 and the scan line driver circuit 4004 which are provided over the first substrate 4001 includes a plurality of thin film transistors. FIG. 17B illustrates the thin film transistor 4010 included in the pixel portion 4002. In this embodiment mode, the thin film transistor 4010 is regarded as a driving TFT, but the thin film transistor 4010 may be a current control TFT or an erase TFT. The thin film transistor 4010 corresponds to a thin film transistor in which a microcrystalline semiconductor film is used for a channel formation region.

Reference numeral 4011 denotes a light-emitting element. A pixel electrode 4030 included in the light-emitting element 4011 is electrically connected to a source or drain electrode 4017 of the thin film transistor 4010. Moreover, in this embodiment mode, a light-transmitting conductive material 4012 of the light-emitting element 4011 is electrically connected. Note that a structure of the light-emitting element 4011 is not limited to that described in this embodiment mode. The structure of the light-emitting element 4011 can be changed depending on an extraction direction of light from the light-emitting element 4011 or a polarity of the thin film transistor 4010 as appropriate.

A variety of signals and a potential supplied to the separately formed signal line driver circuit 4003, and the pixel portion 4002 or the scan line driver circuit 4004 are supplied from an FPC 4018 through lead wirings 4014 and 4015, not shown in the cross-sectional view of FIG. 17B.

In this embodiment mode, a connection terminal 4016 is formed using the same conductive film as the pixel electrode 4030 included in the light-emitting element 4011. Further, the lead wirings 4014 and 4015 are formed using the same conductive film as the wiring 4017.

The connection terminal 4016 is electrically connected to a terminal included in the FPC 4018 through an anisotropic conductive film 4019.

The substrate located in the direction in which light is extracted from the light-emitting element 4011 should be transparent. In this case, a light-transmitting material such as a glass plate, a plastic plate, a polyester film, or an acrylic film is used.

As the filler 4007, an ultraviolet curable resin or a thermosetting resin as well as inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. In this embodiment mode, nitrogen is used for the filler.

If needed, an optical film such as a polarizing plate, a circular polarizing plate (including an elliptical polarizing plate), a retardation plate (a quarter-wave plate or a half-wave plate), or a color filter may be provided on an emission surface of the light-emitting element as appropriate. Further, the polarizing plate or the circular polarizing plate may be provided with an antireflection film. For example, anti-glare treatment for diffusing reflected light by unevenness of the surface and reducing reflection can be performed.

FIGS. 17A and 17B illustrate an example in which the signal line driver circuit 4003 is separately formed and attached to the first substrate 4001; however, this embodiment mode is not limited to this structure. A scan line driver circuit may be separately formed and attached to a substrate, or only part of a signal line driver circuit or part of a scan line driver circuit may be separately formed and attached to a substrate.

This embodiment mode can be implemented in combination with any of the structures described in the other embodiment modes.

Embodiment Mode 4

The light-emitting device obtained according to the present invention can be used for an active matrix EL module. That is, the present invention can be implemented in any of electronic devices having a display portion in which such an active matrix EL module is incorporated.

Figure 13A:
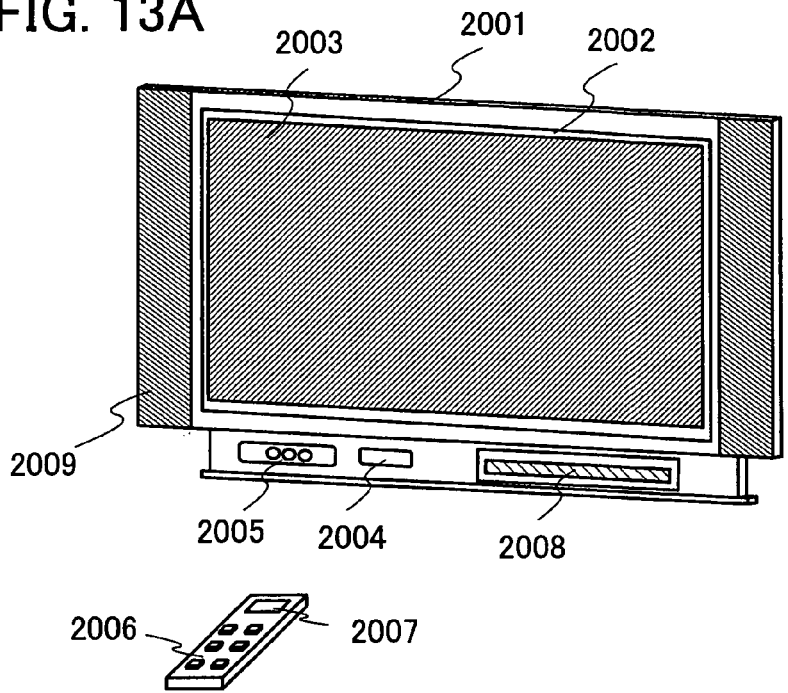
FIGS. 13A to 13D are perspective views showing electronic devices each using a light-emitting device according to an aspect of the present invention.
Figure 13B:
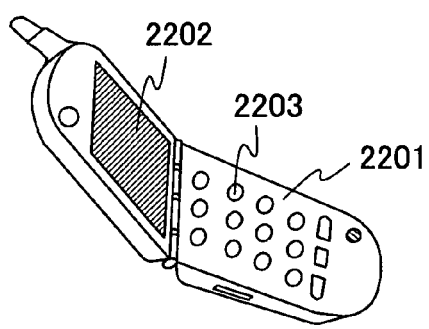
Figure 13C:
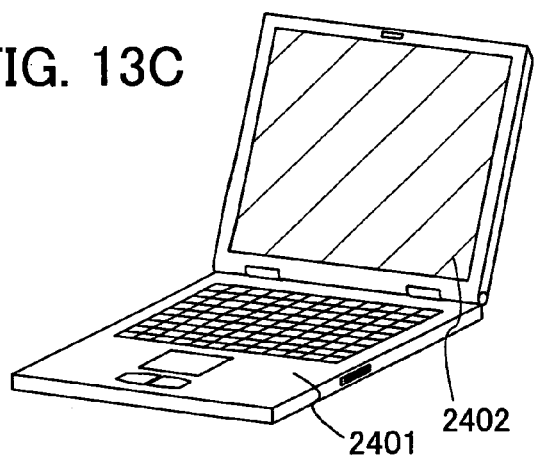

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). FIGS. 13A to 13C show examples of such electronic devices.

FIG. 13A shows a television device. The television device can be completed by incorporating a display module into a housing as shown in FIG. 13A. A display panel with an FPC attached is also referred to as a display module. A main screen 2003 is formed using the display module, and other accessories such as a speaker portion 2009 and an operation switch are provided. Thus, the television device can be completed.

As shown in FIG. 13A, a display panel 2002 using a light-emitting element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by a switch incorporated into the housing or a separate remote control unit 2006. The remote control unit may include a display portion 2007 for displaying information to be output.

Further, the television device may include a sub screen 2008 formed using a second display panel for displaying channels, sound volume, and the like, in addition to the main screen 2003. In this structure, the main screen 2003 may be formed using a light-emitting display panel with an excellent viewing angle, and the sub screen may be formed using a light-emitting display panel in which display is performed with low power consumption. Alternatively, when reduction in power consumption is prioritized, a structure may be employed in which the main screen 2003 is formed using a light-emitting display panel, the sub screen is formed using a light-emitting display panel, and the sub screen can be turned on and off.

Figure 14:
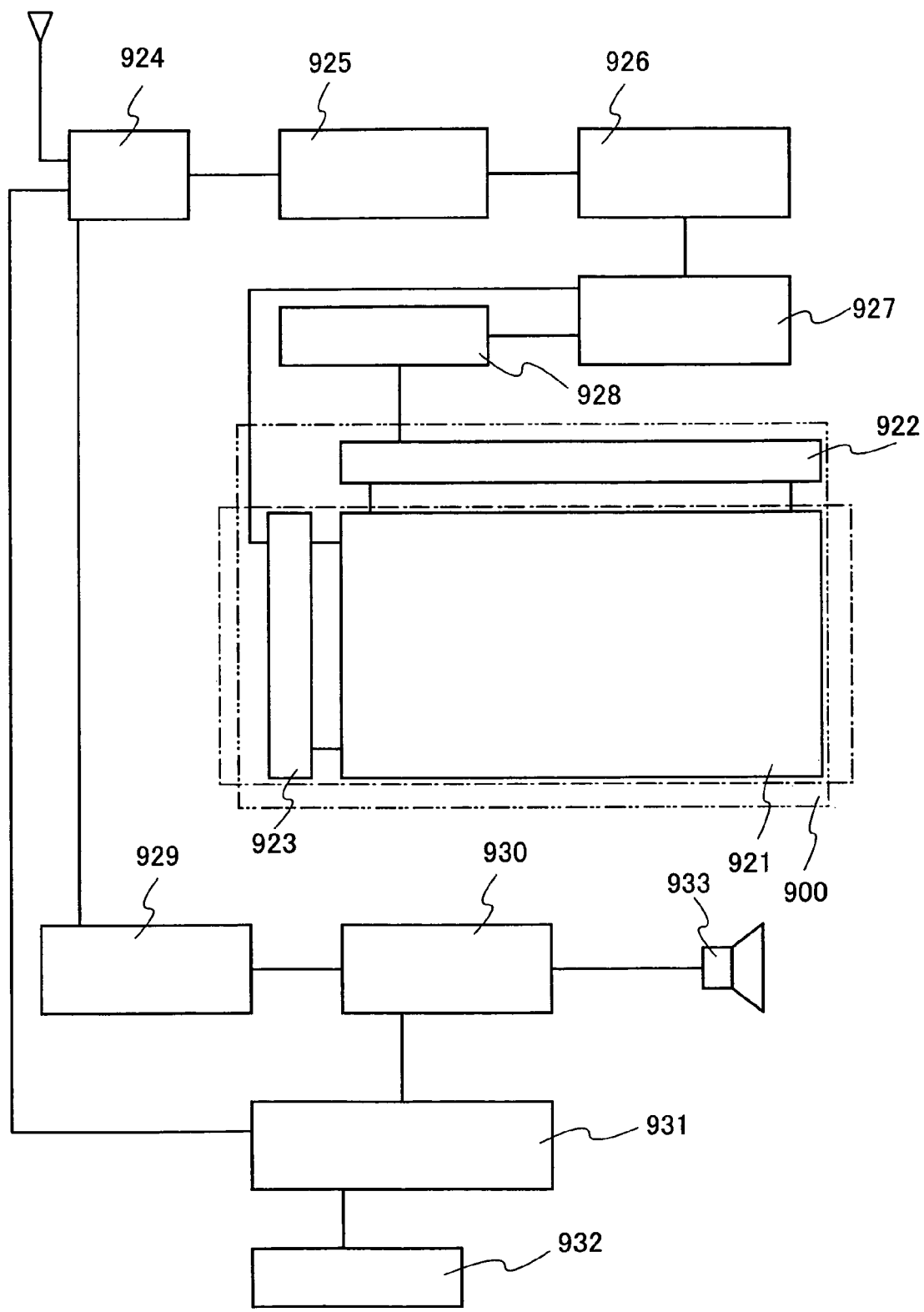
FIG. 14 is a diagram showing an electronic device using a light-emitting device according to an aspect of the present invention.

FIG. 14 is a block diagram of a main structure of a television device. A display panel 900 is provided with a pixel portion 921. A signal line driver circuit 922 and a scan line driver circuit 923 may be mounted on the display panel 900 by a COG method.

As for other external circuits, the television device includes a video signal amplifier circuit 925 which amplifies a video signal among signals received by a tuner 924; a video signal processing circuit 926 which converts a signal output from the video signal amplifier circuit 925 into a color signal corresponding to each color of red, green, and blue; a control circuit 927 which converts the video signal into an input specification of a driver IC; and the like. The control circuit 927 outputs signals to each of the scan line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

It is needless to say that the present invention is not limited to a television device and can be applied to a variety of uses, such as a monitor of a personal computer, a large display medium such as an information display board at the train station, the airport, or the like, or an advertisement display board on the street.

FIG. 13B shows an example of a cellular phone 2201. The cellular phone 2201 includes a display portion 2202, an operation portion 2203, and the like. When the light-emitting device described in the above-described embodiment mode is used for the display portion 2202, mass productivity can be increased.

A portable computer shown in FIG. 13C includes a main body 2401, a display portion 2402, and the like. When the light-emitting device described in the above-described embodiment mode is used for the display portion 2402, mass productivity can be increased.

Figure 13D:
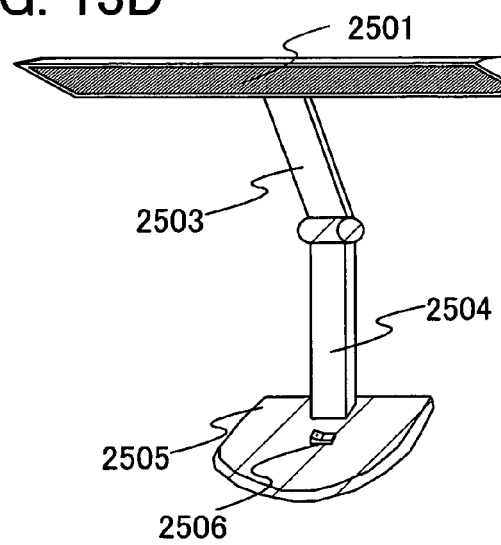

FIG. 13D shows a desk lamp including a lighting portion 2501, a shade 2502, an adjustable arm 2503, a support 2504, a base 2505, and a power supply switch 2506. The desk lamp is formed using the light-emitting device, which is formed according to the present invention, for the lighting portion 2501. Note that a lamp includes a ceiling light, a wall light, and the like in its category. According to the present invention, manufacturing cost can be significantly reduced, and an inexpensive desk lamp can be provided.

Embodiment 1

Figure 22A:
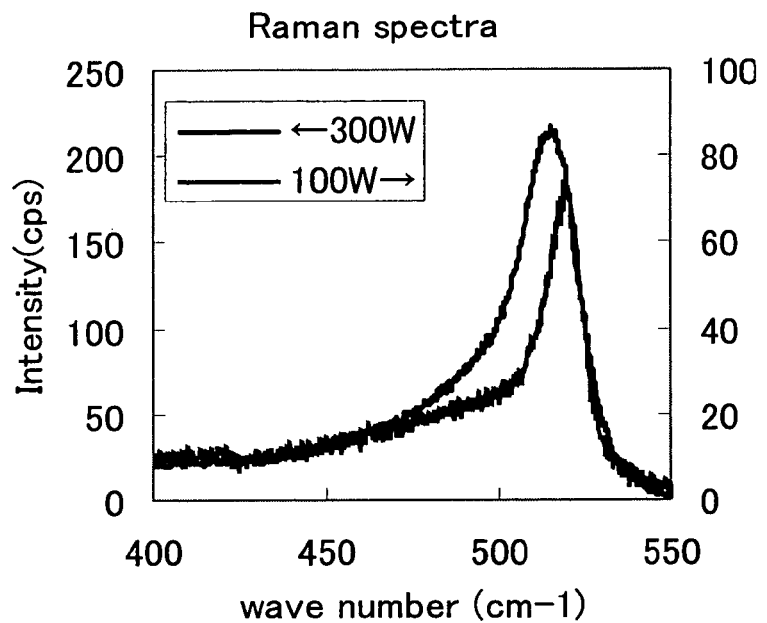
FIGS. 22A and 22B are diagrams showing results of measurement of a microcrystalline semiconductor film by Raman spectroscopy.
Figure 22B:
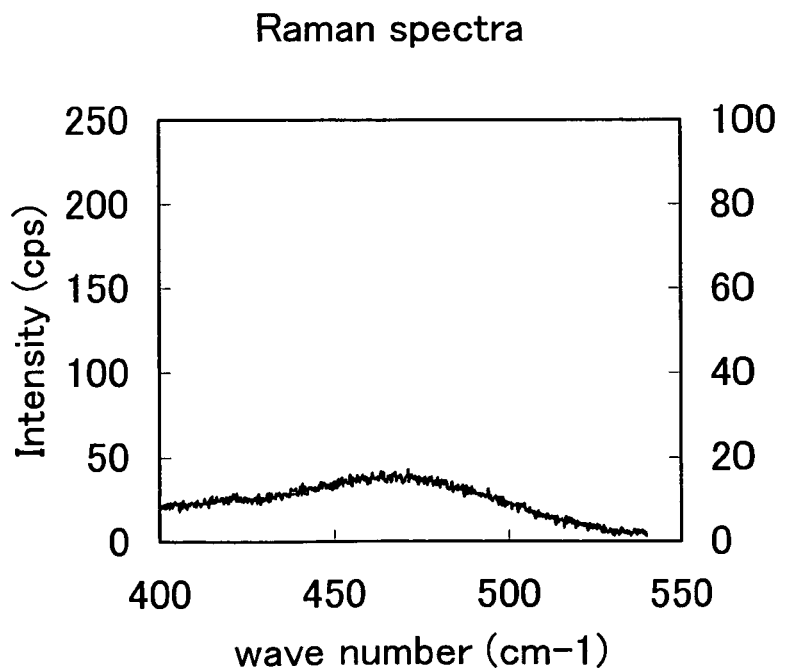

A microcrystalline silicon film was formed, and results of measuring the crystallinity of the film by Raman spectroscopy are shown in FIGS. 22A and 22B.

The microcrystalline silicon film was formed under conditions where the RF power frequency was 13.56 MHz, the film formation temperature was 280° C., the flow rate ratio of hydrogen to a silane gas was 100:1, and the pressure was 280 Pa. FIG. 22A shows Raman scattering spectra and shows a comparison of measurement results of a microcrystalline silicon film that was formed with the amount of power of an RF power source being 100 W and a microcrystalline silicon film with 300 W.

Note that the crystalline peak position of single crystalline silicon is at 521 cm$^{-1}$. Note that, needless to say, the crystalline peak of amorphous silicon cannot be observed, and only a broad peak is measured at 480 cm$^{-1}$ as illustrated in FIG. 22B. The microcrystalline silicon film of this specification refers to one whose crystalline peak position can be observed at greater than or equal to 481 cm$^{-1}$ and less than 520 cm$^{-1}$ when measured with a Raman spectrometer.

The crystalline peak position of the microcrystalline silicon film which was formed with the amount of power of an RF power source being 100 W is at 518.6 cm$^{-1}$; the full width at half maximum (FWHM) is 11.9 cm$^{-1}$; and the crystalline/amorphous peak intensity ratio ($I_c/I_a$) is 4.1.

The crystalline peak position of the microcrystalline silicon film that was formed with the amount of power of an RF power source being 300 W is at 514.8 cm$^{-1}$; the full width at half maximum (FWHM) is 18.7 cm$^{-1}$; and the crystalline/amorphous peak intensity ratio ($I_c/I_a$) is 4.4.

As illustrated in FIG. 22A, there is a crystal peak shift and a large difference in full width at half maximum depending on RF power. It can be considered that this is because the grain size is likely to be small, because ion bombardment becomes significant at high power and the growth of grains is inhibited. In addition, because the power frequency of a CVD apparatus, with which the microcrystalline silicon film used for measurement of FIG. 22A was formed, is 13.56 MHz, the crystalline/amorphous peak intensity ratio ($I_c/I_a$) is 4.1 or 4.4. However, it is also confirmed that the crystalline/amorphous peak intensity ratio ($I_c/I_a$) can be 6 if the RF power frequency is 27 MHz. Accordingly, the crystalline/amorphous peak intensity ratio ($I_c/I_a$) can be further increased when the RF power frequency is higher than 27 MHz, for example, when the RF power frequency is 2.45 GHz.

Embodiment 2

In this embodiment, results of device simulation of transistor characteristics and electron density distribution of the thin film transistor of the present invention are described. For device simulation, the device simulator "ATLAS" made by Silvaco is used.

Figure 23:
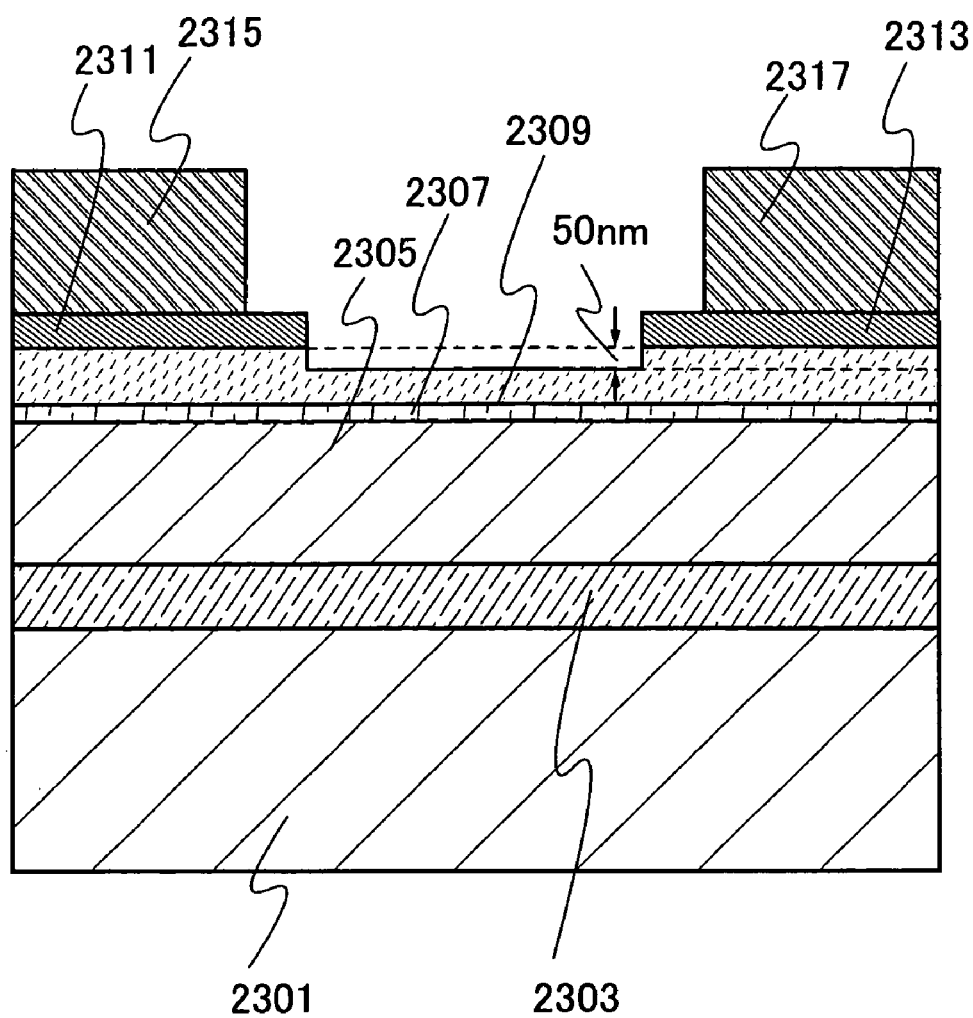
FIG. 23 is a model diagram showing a device structure used for device simulation.

FIG. 23 shows a device structure. An insulating substrate 2301 is assumed to be a glass substrate (with a thickness of 0.5 μm) which contains silicon oxide (with a dielectric constant of 4.1) as its main component. Note that, although the thickness of the insulating substrate 2301 is often 0.5 mm, 0.7 mm, or the like in a practical manufacturing process, the thickness is defined to such a sufficient thickness that an electric field at the lower surface of the insulating substrate 2301 does not affect thin film transistor characteristics.

Over the insulating substrate 2301, a gate electrode 2303 formed of molybdenum (with a thickness of 150 nm) is stacked. The work function of molybdenum is 4.6 eV.

Over the gate electrode 2303, a gate insulating film 2305 having a stacked structure of a silicon nitride film (with a dielectric constant of 7.0 and a thickness of 110 nm) and a silicon oxynitride film (with a dielectric constant of 4.1 and a thickness of 110 nm) is stacked.

Over the gate insulating film 2305, a μc-Si film 2307 and an a-Si film 2309 are stacked. Here, conditions are separately set for a stacked layer of the μc-Si film 2307 with a thickness of 0 nm and the a-Si film 2309 with a thickness of 100 nm, a stacked layer of the μc-Si film 2307 with a thickness of 10 nm and the a-Si film 2309 with a thickness of 90 nm, a stacked layer of the μc-Si film 2307 with a thickness of 50 nm and the a-Si film 2309 with a thickness of 50 nm, a stacked layer of the μc-Si film 2307 with a thickness of 90 nm and the a-Si film 2309 with a thickness of 10 nm, and a stacked layer of the μc-Si film 2307 with a thickness of 100 nm and the a-Si film 2309 with a thickness of 0 nm.

In addition, each of regions of the a-Si film 2309 overlapping with a first a-Si(n+) film 2311 and a second a-Si(n+) film 2313 has another thickness of 50 nm in addition to the above-described thickness. That is, a part of the a-Si film 2309 in a region where the first a-Si(n+) film 2311 and the second a-Si(n+) film 2313 are not formed is etched by 50 nm and has a concave portion.

Over the a-Si film 2309, the first a-Si(n+) film 2311 (with a thickness of 50 nm) and the second a-Si(n+) film 2313 (with a thickness of 50 nm) are stacked. In the thin film transistor shown in FIG. 23, the distance between the first a-Si(n+) film 2311 and the second a-Si(n+) film 2313 corresponds to a channel length L. Here, the channel length L is 6 μm. The channel width W is 15 μm.

Over the first a-Si(n+) film 2311 and the second a-Si(n+) film 2313, a source electrode 2315 and a drain electrode 2317, each of which is formed of molybdenum (Mo) (with a thickness of 300 nm), are formed, respectively. A contact between the source electrode 2315 and the first a-Si(n+) film 2311 and that between the drain electrode 2317 and the second a-Si(n+) film 2313 are defined as ohmic contacts.

Figure 24:
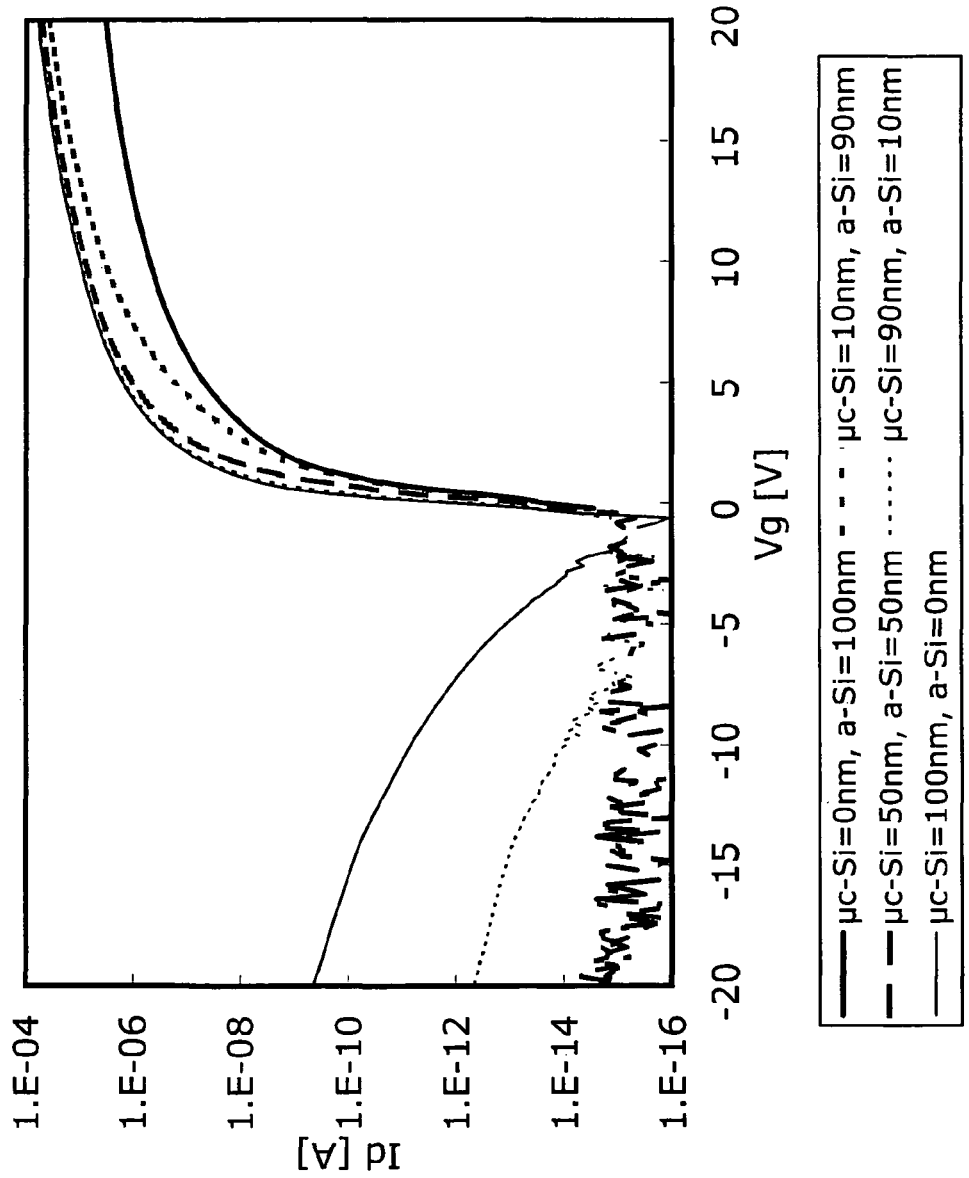
FIG. 24 is a graph showing current-voltage characteristics by device simulation.
Figure 25A:
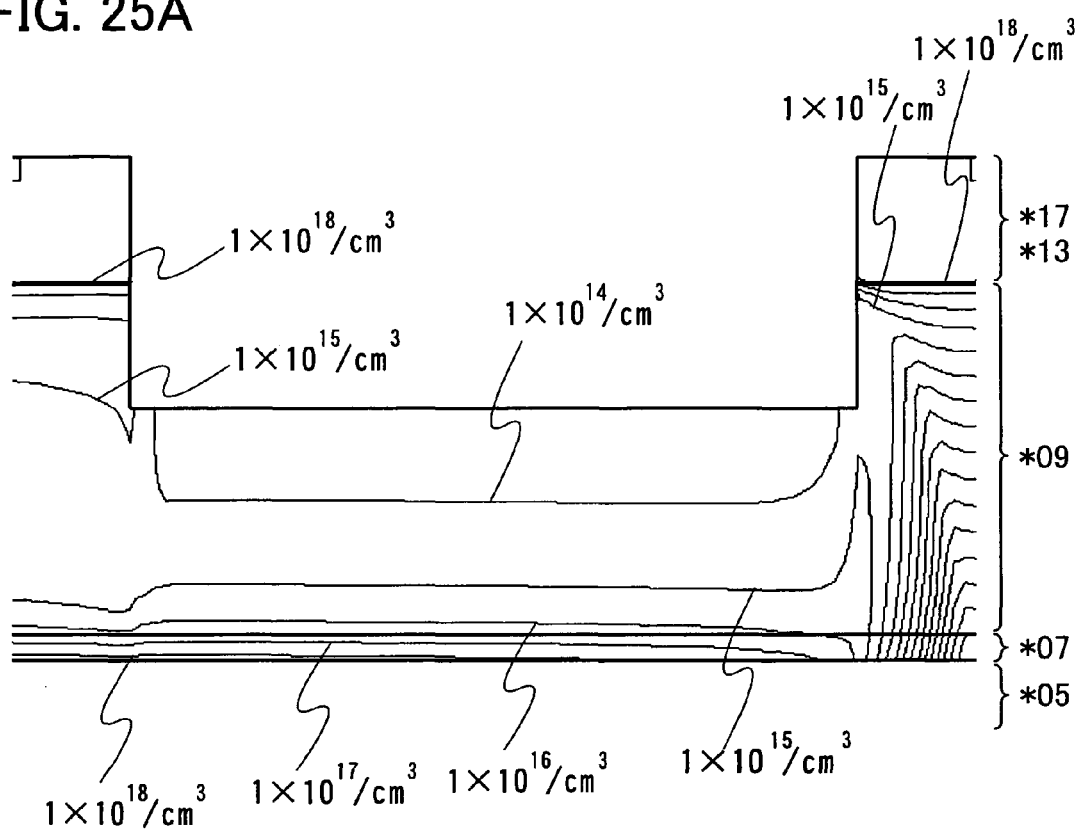
FIGS. 25A and 25B are diagrams each showing an electron concentration distribution of a thin film transistor obtained by device simulation.
Figure 25B:
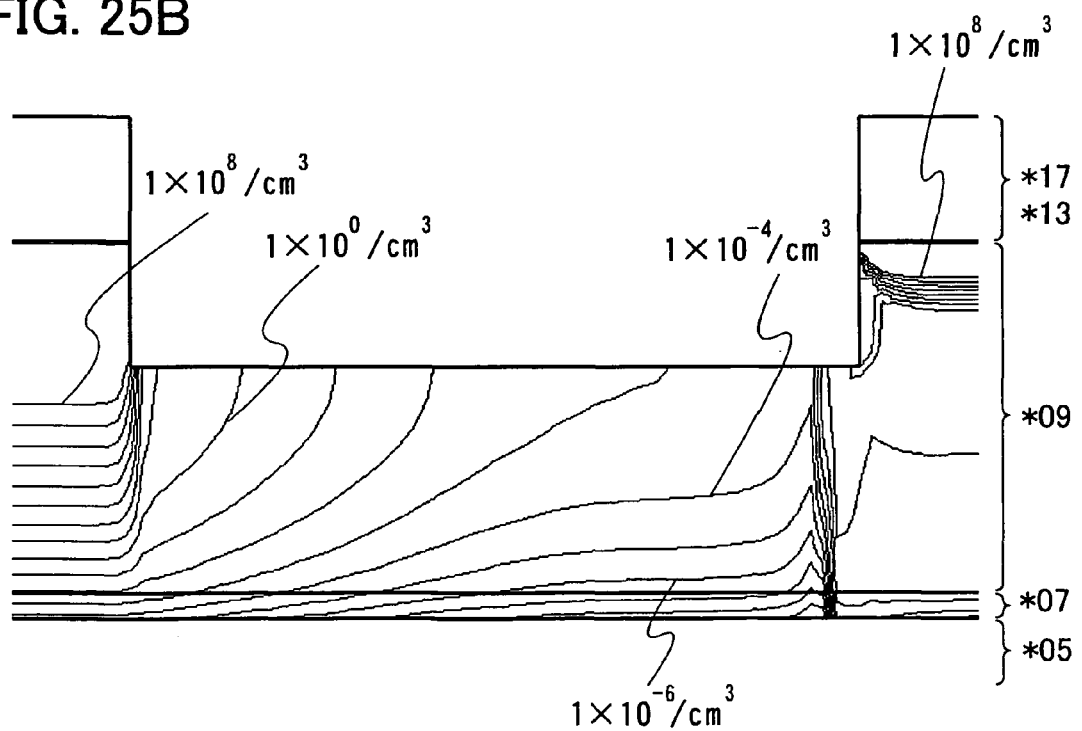

FIG. 24 shows results of DC characteristics ($V_g$-$I_d$ characteristics, $V_d=14$ V) when device simulation of the thin film transistor shown in FIG. 23 is performed with the thicknesses of the μc-Si film and the a-Si film being changed variously. FIGS. 25A and 25B each show electron concentration distribution in the thin film transistor when the μc-Si film 2307 has a thickness of 10 nm and the a-Si film has a thickness of 90 nm. FIG. 25A shows results of electron concentration distribution when the thin film transistor is in an on state ($V_g=+10$ V, $V_d=14$ V), and FIG. 25B shows results of electron concentration distribution when the thin film transistor is in an off state ($V_g=-10$ V, $V_d=14$ V).

It can be seen from FIG. 24 that, as the thickness of the a-Si film is increased, the off current is decreased. In addition, when the thickness of the a-Si film is 50 nm or more, the drain current when $V_g$ is $-20$ V can be made to be lower than $1 \times 10^{13}$ A.

It can also be seen that, as the thickness of the μc-Si film is increased, the on current is increased. In addition, when the thickness of the μc-Si film is set to be 10 nm or more, the drain current when $V_g$ is 20 V can be made to be $1 \times 10^{-5}$ A or more.

It can be seen from FIG. 25A that, in the on state, the μc-Si film has a higher electron density than the a-Si film. That is, the μc-Si film with high electric conductivity has a high electron density; thus, it can be seen that, in the on state, electrons are easy to flow and the drain current is increased.

It can be seen from FIG. 25B that, in the off state, the a-Si film has a higher electron density than the μc-Si film. That is, the a-Si film with low electric conductivity has a high electron density; thus, it can be seen that, in the off state, electrons are difficult to flow and the drain current is equivalent to that of a thin film transistor in which an a-Si film is used as a channel formation region.

It can be seen from the above description that a thin film transistor as illustrated in FIG. 23, in which a μc-Si film is formed over a gate insulating film, an a-Si film is formed over the μc-Si film, and source and drain regions are formed over the a-Si film, can be made to have a lower off current and a higher on current.

This application is based on Japanese Patent Applications serial nos. 2007-179091 filed with Japan Patent Office on Jul. 6, 2007, the entire contents of which are hereby incorporated by reference.

What is claimed is:

1. A display device comprising:
   a gate electrode;
   a gate insulating film formed over the gate electrode;
   a microcrystalline semiconductor film formed over the gate insulating film;
   a buffer layer which is formed over the microcrystalline semiconductor film and has a concave portion;
   source and drain regions formed over the buffer layer;
   a source, electrode over the source region; and
   a drain electrode over the drain region,
   wherein:
   the buffer layer is formed of an amorphous semiconductor film;
   a part of the source region is in contact with the source electrode and the other part of the source region is not in contact with the source electrode;
   a part of the drain region is in contact with the drain electrode and the other part of the drain region is not in contact with the drain electrode;
   the buffer layer extends beyond an outer side edge of the source region and an outer side edge of the drain region; and
   an end portion of the source region and an end portion of the drain region which are overlapped with the gate electrode are aligned with side faces of the concave portion of the buffer layer.

2. The display device according to claim 1, wherein the buffer layer is formed of an amorphous semiconductor film containing nitrogen.

3. The display device according to claim 1, wherein the buffer layer is formed of an amorphous semiconductor film containing hydrogen.

4. The display device according to claim 1, wherein the buffer layer is formed of an amorphous semiconductor film containing fluorine, chlorine, bromine, or iodine.

5. The display device according to claim 1, wherein the display device is a light emitting device.

6. A display device comprising:
   a gate electrode;
   a gate insulating film formed over the gate electrode;
   a microcrystalline semiconductor film formed over the gate insulating film;
   a buffer layer which is formed over the microcrystalline semiconductor film and has a concave portion;
   source and drain regions formed over the buffer layer;
   a source, electrode over the source region; and
   a drain electrode over the drain region,
   wherein:
   the buffer layer is formed of an amorphous semiconductor film;
   a part of the source region is exposed outside the source electrode;
   a part of the drain region is exposed outside the drain electrode;
   the buffer layer extends beyond an outer side edge of the source region and an outer side edge of the drain region; and
   an end portion of the source region and an end portion of the drain region which are overlapped with the gate electrode are aligned with side faces of the concave portion of the buffer layer.

7. The display device according to claim 6, wherein the buffer layer is formed of an amorphous semiconductor film containing nitrogen.

8. The display device according to claim 6, wherein the buffer layer is formed of an amorphous semiconductor film containing hydrogen.

9. The display device according to claim 6, wherein the buffer layer is formed of an amorphous semiconductor film containing fluorine, chlorine, bromine, or iodine.

10. The display device according to claim 6, wherein the display device is a light emitting device.

11. A display device comprising:
a gate electrode;
a gate insulating film formed over the gate electrode;
a microcrystalline semiconductor film formed over the gate insulating film;
a buffer layer which is formed over the microcrystalline semiconductor film and has a concave portion;
source and drain regions formed over the buffer layer;
a source, electrode over the source region;
a drain electrode over the drain region,
an insulating film in contact with the source and drain electrodes, a part of the source and drain regions, and a part of the buffer layer; and
a pixel electrode formed over the insulating film and connected to one of the source and drain electrodes through a contact hole formed in the insulating film,
wherein:
the buffer layer is formed of an amorphous semiconductor film;
a part of the source region is in contact with the source electrode and the other part of the source region is not in contact with the source electrode;
a part of the drain region is in contact with the drain electrode and the other part of the drain region is not in contact with the drain electrode;
the buffer layer extends beyond an outer side edge of the source region and an outer side edge of the drain region; and
an end portion of the source region and an end portion of the drain region which are overlapped with the gate electrode are aligned with side faces of the concave portion of the buffer layer.

12. The display device according to claim 11, wherein the buffer layer is formed of an amorphous semiconductor film containing nitrogen.

13. The display device according to claim 11, wherein the buffer layer is formed of an amorphous semiconductor film containing hydrogen.

14. The display device according to claim 11, wherein the buffer layer is formed of an amorphous semiconductor film containing fluorine, chlorine, bromine, or iodine.

15. The display device according to claim 11, wherein the display device is a light emitting device.

16. A display device comprising:
a gate electrode;
a gate insulating film formed over the gate electrode;
a microcrystalline semiconductor film formed over the gate insulating film;
a buffer layer which is formed over the microcrystalline semiconductor film and has a concave portion;
source and drain regions formed over the buffer layer;
a source, electrode over the source region;
a drain electrode over the drain region;
an insulating film in contact with the source and drain electrodes, a part of the source and drain regions, and a part of the buffer layer; and
a pixel electrode formed over the insulating film and connected to one of the source and drain electrodes through a contact hole formed in the insulating film,
wherein:
the buffer layer is formed of an amorphous semiconductor film;
a part of the source region is exposed outside the source electrode;
a part of the drain region is exposed outside the drain electrode;
the buffer layer extends beyond an outer side edge of the source region and an outer side edge of the drain region; and
an end portion of the source region and an end portion of the drain region which are overlapped with the gate electrode are aligned with side faces of the concave portion of the buffer layer.

17. The display device according to claim 16, wherein the buffer layer is formed of an amorphous semiconductor film containing nitrogen.

18. The display device according to claim 16, wherein the buffer layer is formed of an amorphous semiconductor film containing hydrogen.

19. The display device according to claim 16, wherein the buffer layer is formed of an amorphous semiconductor film containing fluorine, chlorine, bromine, or iodine.

20. The display device according to claim 16, wherein the display device is a light emitting device.

21. A display device comprising:
a gate electrode;
a gate insulating film formed over the gate electrode;
a microcrystalline semiconductor film formed over the gate insulating film;
a buffer layer formed over the microcrystalline semiconductor film;
source and drain regions formed over the buffer layer; and
a source electrode formed on the source region; and
a drain electrode formed on the drain region;
wherein:
the buffer layer is formed of an amorphous semiconductor film;
the source region extends beyond an outer side edge of the source electrode;
the drain region extends beyond an outer side edge of the drain electrode;
a portion of the buffer layer between the source and drain regions is thinned; and
the buffer layer extends beyond an outer side edge of the source region and an outer side edge of the drain region.

22. The display device according to claim 21, wherein the portion of the buffer layer has side edges aligned with inner side edges of the source and drain regions.

23. The display device according to claim 21, wherein the buffer layer is formed of an amorphous semiconductor film containing nitrogen.

24. The display device according to claim 21, wherein the buffer layer is formed of an amorphous semiconductor film containing hydrogen.

25. The display device according to claim 21, wherein the buffer layer is formed of an amorphous semiconductor film containing fluorine, chlorine, bromine, or iodine.

26. The display device according to claim 21, wherein the display device is a light emitting device.

27. The display device according to claim 1, wherein a side surface of the buffer layer is stepwise.

28. The display device according to claim 6, wherein a side surface of the buffer layer is stepwise.

29. The display device according to claim 11, wherein a side surface of the buffer layer is stepwise.

30. The display device according to claim 16, wherein a side surface of the buffer layer is stepwise.

31. The display device according to claim 21, wherein a side surface of the buffer layer is stepwise.

* * * * *